United States Patent
Ogata et al.

(10) Patent No.: US 9,412,878 B2
(45) Date of Patent: Aug. 9, 2016

(54) SEMICONDUCTOR DEVICE AND MANUFACTURING METHOD THEREOF

(71) Applicant: Renesas Electronics Corporation, Kawasaki-shi, Kanagawa (JP)

(72) Inventors: Koji Ogata, Kanagawa (JP); Yoshiyuki Kawashima, Kanagawa (JP); Hiraku Chakihara, Kanagawa (JP); Tomohiro Hayashi, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/738,850

(22) Filed: Jun. 13, 2015

(65) Prior Publication Data

US 2015/0380425 A1    Dec. 31, 2015

(30) Foreign Application Priority Data

Jun. 30, 2014   (JP) ................. 2014-133852

(51) Int. Cl.
| | |
|---|---|
| *H01L 29/788* | (2006.01) |
| *H01L 27/115* | (2006.01) |
| *H01L 29/792* | (2006.01) |
| *H01L 29/66* | (2006.01) |
| *H01L 29/51* | (2006.01) |
| *H01L 21/28* | (2006.01) |
| *H01L 21/02* | (2006.01) |
| *H01L 21/265* | (2006.01) |
| *H01L 29/06* | (2006.01) |
| *H01L 29/08* | (2006.01) |
| *H01L 29/423* | (2006.01) |

(52) U.S. Cl.
CPC .......... *H01L 29/788* (2013.01); *H01L 21/0217* (2013.01); *H01L 21/02164* (2013.01); *H01L 21/26513* (2013.01); *H01L 21/28282* (2013.01); *H01L 27/11517* (2013.01); *H01L 27/11519* (2013.01); *H01L 27/11573* (2013.01); *H01L 29/0607* (2013.01); *H01L 29/0642* (2013.01); *H01L 29/0847* (2013.01); *H01L 29/42324* (2013.01); *H01L 29/42344* (2013.01); *H01L 29/511* (2013.01); *H01L 29/518* (2013.01); *H01L 29/66825* (2013.01); *H01L 29/66833* (2013.01); *H01L 29/792* (2013.01)

(58) Field of Classification Search
CPC ................... H01L 27/11517; H01L 27/11519; H01L 29/42324; H01L 29/66825; H01L 29/788
See application file for complete search history.

(56) References Cited

U.S. PATENT DOCUMENTS

| | | | |
|---|---|---|---|
| 7,245,531 B2 | 7/2007 | Okazaki et al. | |
| 2004/0061167 A1* | 4/2004 | Mantha ................. | H01L 27/115 257/315 |
| 2005/0101102 A1* | 5/2005 | Chan ................. | H01L 21/76237 438/451 |

(Continued)

FOREIGN PATENT DOCUMENTS

JP    2006-049737 A    2/2006

*Primary Examiner* — Eduardo A Rodela
(74) *Attorney, Agent, or Firm* — Shapiro, Gabor and Rosenberger, PLLC

(57) ABSTRACT

A semiconductor device having improved reliability is disclosed. In a semiconductor device according to one embodiment, an element isolation region extending in an X direction has a crossing region that crosses, in plan view, a memory gate electrode extending in a Y direction that intersects with the X direction at right angles. In this case, in the crossing region, a width in the Y direction of one edge side, the one edge side being near to a source region, is larger than a width in the Y direction of the other edge side, the other edge side being near to a control gate electrode.

11 Claims, 34 Drawing Sheets

(56) References Cited

U.S. PATENT DOCUMENTS

2005/0199956 A1* 9/2005 Ding .................... H01L 27/115
 257/365
2007/0252190 A1* 11/2007 Park ..................... H01L 27/115
 257/315
2009/0200595 A1* 8/2009 Nagai ............... H01L 21/28273
 257/316

* cited by examiner

SEMICONDUCTOR DEVICE AND MANUFACTURING METHOD THEREOF

CROSS-REFERENCE TO RELATED APPLICATIONS

The disclosure of Japanese Patent Application No. 2014-133852 filed on Jun. 30, 2014 including the specification, drawings and abstract is incorporated herein by reference in its entirety.

BACKGROUND

The present invention relates to a semiconductor device and a manufacturing method thereof, and for example, to an effective technique that can be applied to a semiconductor device having an electrically rewritable non-volatile memory and a manufacturing technique thereof.

Japanese Unexamined Patent Publication No. 2006-49737 (Patent Document 1) describes a technique for removing an exposed portion of a laminated insulating film (ONO film) including: a silicon oxide film in an upper layer; a silicon nitride film in the layer below the silicon oxide film; and a silicon oxide film in the layer below the silicon nitride film.

Patent Document 1 also describes the layout of an element isolation region arranged in a memory cell portion. Herein, Patent Document 1 describes the layout in which, in a crossing region where a memory gate electrode and the element isolation region cross each other, the width of an edge side near to a source region is the same as that of an edge side near to a control gate electrode.

SUMMARY

EEPROMs (Electrically Erasable and Programmable Read Only Memories) and flash memories are widely used as non-volatile semiconductor memories in which information can be electrically written or erased. Each of these non-volatile semiconductor memories (non-volatile memories), which are represented by the EEPROMs and the flash memories that are widely being used, has, below the gate electrode of a MOS (Metal Oxide Semiconductor) transistor, a charge storage film such as a conductive floating gate electrode, a trap insulating film, or the like, which is surrounded by a silicon oxide film in order to store information by using the fact that the threshold value of a transistor is changed depending on a charge storage state in the floating gate electrode or the trap insulating film.

The trap insulating film refers to an insulating film having trap levels in which charges can be stored, and a silicon nitride film, or the like, can be cited as one example of the trap insulating film. A non-volatile semiconductor memory having a trap insulating film is operated as a storage element in which the threshold value of a MOS transistor is shifted by implanting and discharging charges into/from the trap insulating film. A non-volatile semiconductor memory, using such a trap insulating film as a charge storage film, is referred to as a MONOS (Metal Oxide Nitride Oxide Semiconductor) type transistor, and is more excellent in data holding reliability because charges are stored in discrete trap levels, in comparison with the case where a conductive floating gate electrode is used as the charge storage film.

A split gate type non-volatile memory can be cited as one example of such a MONOS type transistor. In the split gate type non-volatile memory, a memory transistor for storing information is formed in a sidewall of a selection transistor for selecting a memory cell. Specifically, a control gate electrode is formed in a semiconductor substrate via a gate insulating film, and a memory gate electrode is formed in a sidewall of the control gate electrode via a laminated insulating film including a charge storage film.

In the split gate type non-volatile memory, a voltage having a relatively large absolute value is applied to the memory gate electrode when an operation for writing information or for erasing information is performed. Accordingly, it is important to secure a sufficient withstand voltage, for example, between the memory gate electrode and a source region (diffusion layer) from the viewpoint that the reliability of the split gate type non-volatile memory is improved.

Other problems and new characteristics will become clear from the description and accompanying drawings of the present specification.

In a semiconductor device according to one embodiment, an element isolation region extending in a first direction has a crossing region that crosses, in plan view, a memory gate electrode extending in a second direction that intersects with the first direction at right angles. In this case, in the crossing region, the width of one edge side that is near to a source region and oriented in the second direction is larger than that of the other edge side that is near to a control gate electrode and oriented in the second direction.

In a manufacturing method of a semiconductor device according to one embodiment, an element isolation region is formed by using a mask employing light proximity effect correction, and hence in a crossing region where the element isolation region and a memory gate electrode cross each other, the width of one edge side that is near to a source region is larger than that of the other edge side that is near to a control gate electrode.

Further, in a manufacturing method of a semiconductor device according to one embodiment, when a laminated insulating film, which includes a first insulating film, a charge storage film, and a second insulating film and is exposed from a memory gate electrode, is removed, the first insulating film arranged in the lowermost layer of the laminated insulating film is not removed.

According to one embodiment, the reliability of a semiconductor device can be improved.

DETAILED DESCRIPTION

Figure 1:
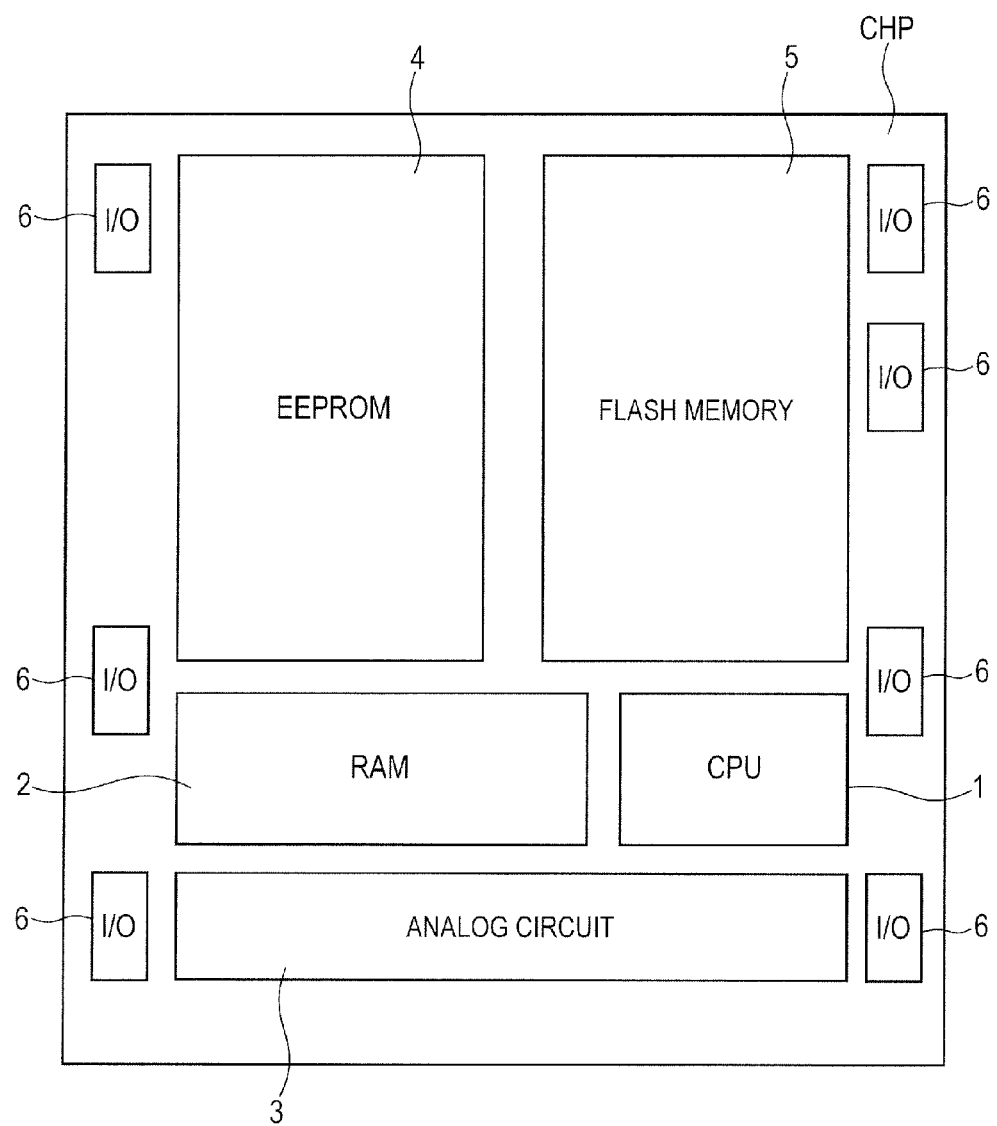
FIG. 1 is a view illustrating an example of a layout configuration of a semiconductor chip in First Embodiment.

When necessary for convenience in the following embodiment, description is given by dividing the embodiment into a plurality of sections or embodiments; however, unless otherwise indicated, they are not independent of one another, but one is related with the other part or the whole as a modification example, a detail, supplementary description, etc.

When referring to the number of elements, etc. (including number of pieces, numerical value, quantity, range, etc.) in the following embodiment, unless otherwise indicated or except when the number is obviously limited to specific numbers in principle, the number is not limited to the specific ones but may be more or less than the specific numbers.

Further, in the following embodiment, it is needless to say that components (also including constituent steps, etc.) are not necessarily requisite unless stated explicitly or except when they are obviously requisite in principle.

Similarly, when referring to the shapes and positional relations, etc., of components, etc., in the following embodiment, unless stated explicitly or except when they can be thought otherwise in principle, those substantially the same or similar to the shapes, etc., are to be included. This also applies to the aforementioned numerical values and ranges.

In addition, like components are denoted with like reference numerals in principle in each of the views for explaining embodiments, and duplicated descriptions are omitted. For easy understanding of drawings, hatching lines may be drawn even in a plan view.

First Embodiment

<Example of Layout Configuration of Semiconductor Chip>

A semiconductor device having a non-volatile memory in First Embodiment will be described with reference to the accompanying drawings. The layout configuration of a semiconductor device (semiconductor chip), in which a system including a non-volatile memory is formed, will be first described. FIG. 1 is a view illustrating an example of a layout configuration of a semiconductor chip CHP in First Embodiment. In FIG. 1, the semiconductor chip CHP has a CPU (Central Processing Unit) 1, a RAM (Random Access Memory) 2, an analog circuit 3, an EEPROM (Electrically Erasable Programmable Read Only Memory) 4, a flash memory 5, and I/O (Input/Output) circuits 6, and forms a semiconductor integrated circuit device.

The CPU (circuit) 1 is also referred to as a central processing unit, and corresponds to the heart of a computer, or the like. This CPU1 reads out commands from a storage device to decode them, and performs various operations and controls based on the commands.

The RAM (circuit) 2 is a memory from which storage information can be read out at random, i.e., storage information that are stored can be read out if necessary, or into which information to be stored can be written, and is also referred to as a random access memory. The Ram as an IC memory includes a DRAM (Dynamic RAM) using a dynamic circuit and an SRAM (Static RAM) using a static circuit. The DRAM is a random access memory that requires memory holding operations, while the SRAM is a random access memory that does not require such operations.

The analog circuit 3 is a circuit that deals with a voltage signal or a current signal continuously changing in time, i.e., an analog signal, and is formed, for example, by an amplifying circuit, a conversion circuit, a modulation circuit, an oscillating circuit, a power supply circuit, etc.

Each of the EEPROM 4 and the flash memory 5 is one type of non-volatile memories in which storage information is electrically rewritable by a writing operation or an erasing operation, which is also referred to as an electrically erasable programmable read only memory. A memory cell of each of the EEPROM 4 and the flash memory 5 is formed, for example, by a MONOS (Metal Oxide Nitride Oxide Semiconductor) type transistor or an MNOS (Metal Nitride Oxide Semiconductor) type transistor that is used for memory. A writing operation or an erasing operation for each of the EEPROM 4 and the flash memory 5 is performed by using, for example, Fowler-Nordheim Tunnel phenomenon. A writing operation or an erasing operation can also be performed by using a hot electron or a hot hole. The difference between the EEPROM 4 and the flash memory 5 is that the former is a non-volatile memory in which information can be erased, for example, in byte units, while the latter is one in which information can be erased, for example, in word line units. The flash memory 5 generally stores programs for performing various processing in the CPU 1. On the other hand, the EEPROM 4 stores various data that are frequently rewritten.

The I/O circuit 6 is an input/output circuit, i.e., a circuit for outputting data from the semiconductor chip CHP to a device coupled to the outside of the semiconductor chip CHP and for vice versa.

<Example of Planar Layout Configuration of Non-Volatile Memory>

Subsequently, an example of the configuration of a non-volatile memory in First Embodiment will be described. The non-volatile memory in First Embodiment is a memory that forms the EEPROM 4 or the flash memory 5 illustrated in FIG. 1. That is, the non-volatile memory in First Embodiment is formed over a semiconductor substrate that forms the semiconductor chip CHP illustrated, for example, in FIG. 1.

Figure 2:
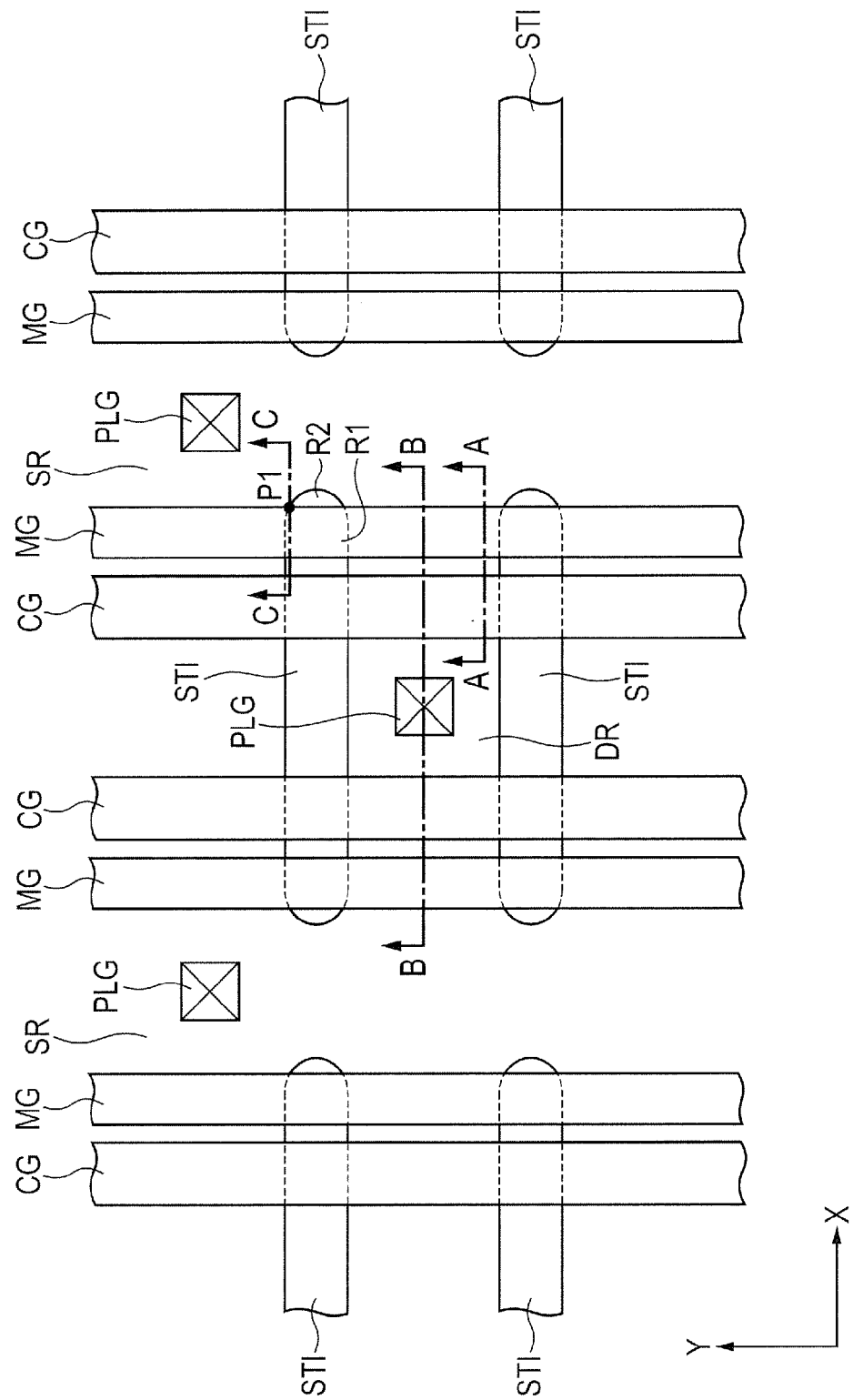
FIG. 2 is a plan view schematically illustrating an example of a planar layout configuration of a non-volatile memory in First Embodiment.

FIG. 2 is a plan view schematically illustrating an example of the planar layout configuration of the non-volatile memory in First Embodiment. In FIG. 2, a plurality of element isolation regions STI, each extending in the X direction, are formed in the semiconductor substrate. The element isolation regions STI, each extending in the X direction, are arranged in an island pattern, as illustrated, for example, in FIG. 2. Specifically in FIG. 2, three element isolation regions STI, adjacent two of them being spaced apart from the other by a first space in the X direction, are arranged to be aligned with each other in the X direction, and further other three element isolation regions STI, which are respectively spaced apart from the aforementioned three element isolation regions by a second space in the Y direction, are arranged to be aligned with each other in the X direction. Accordingly, six element isolation regions STI are illustrated in FIG. 2.

On the other hand, a plurality of control gate electrodes CG, each extending in the Y direction that intersects with the X direction at right angles, and a plurality of memory gate electrodes MG, each extending in the Y direction so as to be parallel to each of the control gate electrodes CG, are formed over the semiconductor substrate in FIG. 2.

In this case, each of the memory gate electrodes MG is arranged to correspond to each of the control gate electrodes CG, as illustrated in FIG. 2. That is, one memory gate electrode MG is arranged to correspond to one control gate electrode CG. For example, four control gate electrodes CG, each extending in the Y direction, are illustrated in FIG. 2, and one memory gate electrode MG is arranged on the left side of the rightmost control gate electrode CG. On the other hand, one memory gate electrode MG is arranged on the left side of the leftmost control gate electrode CG, and two memory gate electrodes MG are arranged to sandwich, from the outside, the two control gate electrodes CG that are arranged in the center so as to face each other. Accordingly, four memory gate electrodes MG are formed to correspond to four control gate electrodes CG in FIG. 2.

As illustrated in FIG. 2, a source region SR is formed in the semiconductor substrate between two memory gate electrodes MG that face each other, the source region SR extending in the Y direction so as to be parallel to the memory gate electrode MG. In FIG. 2, one source region SR is formed to be sandwiched by, of the four memory gate electrodes MG, two memory gate electrodes MG that face each other, and the other source region SR is formed to be sandwiched by the other two memory gate electrodes MG that face each other. Accordingly, two source region, each formed in the semiconductor substrate, are formed in FIG. 2.

A plug PLG is formed in each of the two source regions so as to be included in the source region SR, and the source region SR and the plug PLG are electrically coupled together. On the other hand, a drain region DR is formed to be sandwiched by the two control gate electrodes CG that are arranged in the center so as to face each other. A plug PLG is formed to be included in the drain region DR, and the drain region DR and the plug PLG are electrically coupled together.

Herein, when attention is focused on the arrangement relationship between the element isolation region STI and the memory gate electrode MG, the element isolation region STI is arranged in the semiconductor substrate so as to extend in the X direction, while the memory gate electrode MG is formed over the semiconductor substrate so as to extend in the Y direction, as illustrated in FIG. 2. From this, the element isolation region STI has a crossing region R1 that crosses the memory gate electrode MG in plan view, as illustrated in FIG. 2. Further, the element isolation region STI has a termination region R2 that is in contact with the contact region R1 and the source region SR in plan view.

FIG. 2 is a view illustrating the planar layout configuration of the non-volatile memory in a simplified and schematic way, and in an actual non-volatile memory, a laminated insulating film, including a first portion sandwiched between the control gate electrode CG and the memory gate electrode MG and a second portion sandwiched between the memory gate electrode MG and the semiconductor substrate, is formed, the laminated insulating film extending in the Y direction similarly to the control gate electrode CG and the memory gate electrode MG.

In more detail, the first portion of the laminated insulating film is comprised of: a first insulating film (insulating film IF1 described with reference to FIG. 4) that is in contact with the control gate electrode CG; a second insulating film (insulating film IF2 described with reference to FIG. 4) that is in contact with the memory gate electrode MG; and a charge storage film (charge storage film ECF described with reference to FIG. 4) sandwiched between the first insulating film and the second insulating film.

On the other hand, the second portion of the laminated insulating film is comprised of: the first insulating film (insulating film IF1 described with reference to FIG. 4) formed over the semiconductor substrate; the second insulating film (insulating film IF2 described with reference to FIG. 4) formed in the layer below the memory gate electrode MG; and the charge storage film (charge storage film ECF described with reference to FIG. 4) sandwiched between the first insulating film and the second insulating film.

That is, the first insulating film, the second insulating film, and the charge storage film are formed to range from the first portion to the second portion of the laminated insulating film. In this case, each of the first insulating film and the second insulating film is formed, for example, by a silicon oxide film, while the charge storage film is formed, for example, by a silicon nitride film.

The non-volatile memory in First Embodiment is formed to have such a planar layout configuration, and hereinafter the room for improvement discovered by the present inventors will be first described.

<Room for Improvement>

Because the room for improvement discovered by the present inventors results from the manufacturing steps of the non-volatile memory, and hereinafter the manufacturing steps of the non-volatile memory will be described with reference to sectional views taken, for example, along A-A Line in FIG. 2, thereby allowing the room for improvement discovered by the inventors to be referred to.

FIGS. 3A to 3D are sectional views illustrating, in a simplified way, the manufacturing steps of the non-volatile memory in the section taken along A-A Line in FIG. 2.

Figure 3A:
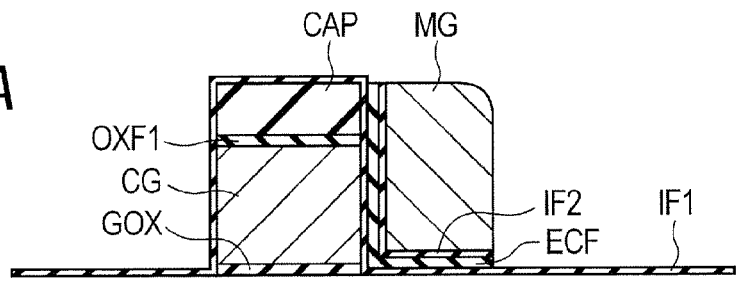
FIGS. 3A to 3D are sectional views illustrating, in a simplified way, manufacturing steps of a non-volatile memory according to a related art, in the section taken along A-A Line in FIG. 2.

As illustrated in FIG. 3A, the control gate electrode CG including a polysilicon film is first formed over the semiconductor substrate via a gate insulating film GOX including, for example, a silicon oxide film. A cap insulating film CAP including, for example, a silicon nitride film is formed over the control gate electrode CG via a silicon oxide film OXF1. The insulating film IF1 is formed over the semiconductor substrate so as to cover a laminated structure body including the gate insulating film GOX, the control gate electrode CG, the silicon oxide film OXF1, and the cap insulating film CAP, and the memory gate electrode MG having a sidewall shape is formed over either sidewall of the laminated structure body via the insulating film IF1, the charge storage film ECF, and the insulating film IF2. FIG. 3A illustrates a state obtained after the insulating film IF2 and the charge storage film ECF, which are exposed from the memory gate electrode MG, are removed. That is, FIG. 3A illustrates a state where the insulating film IF1 is exposed from the memory gate electrode MG.

Figure 3B:
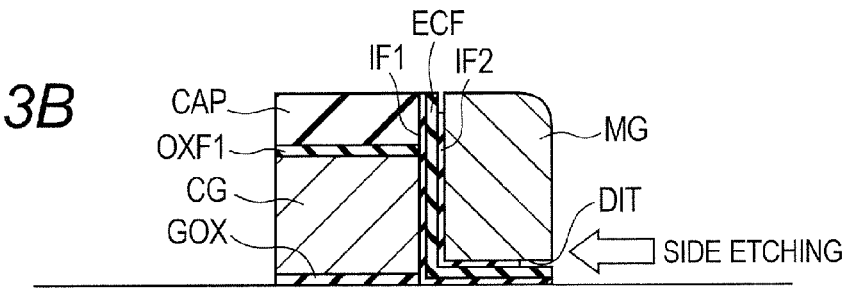

Subsequently, the insulating film IF1 exposed from the memory gate electrode MG is removed by etching, as illustrated in FIG. 3B. In this case, each of the insulating film IF1 and the insulating film IF2 is comprised of the same film represented, for example, by a silicon oxide film, and hence when the insulating film IF1 exposed from the memory gate electrode MG is etched, the insulating film IF2 is side-etched from the side surface from which the film IF2 is exposed, as illustrated in FIG. 3B. As a result, a trench portion DIT is formed in the side surface of the insulating film IF2, as illustrated in FIG. 3B.

Figure 3C:
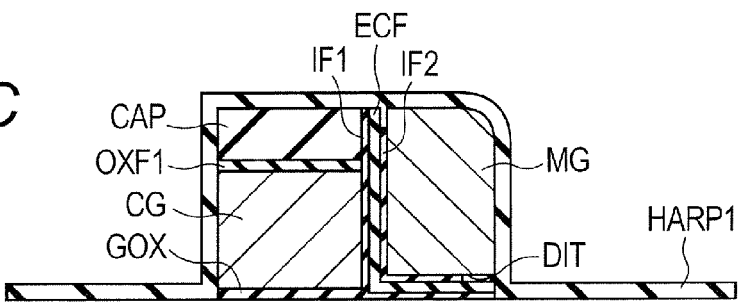

Thereafter, a silicon oxide film HARP1 is formed so as to cover the semiconductor substrate, as illustrated in FIG. 3C. In this step, the silicon oxide film HARP1 is embedded in the trench portion DIT formed by the side etching of the insulating film IF2, the side etching being created when the insulating film IF1 exposed from the memory gate electrode MG is etched.

Figure 3D:
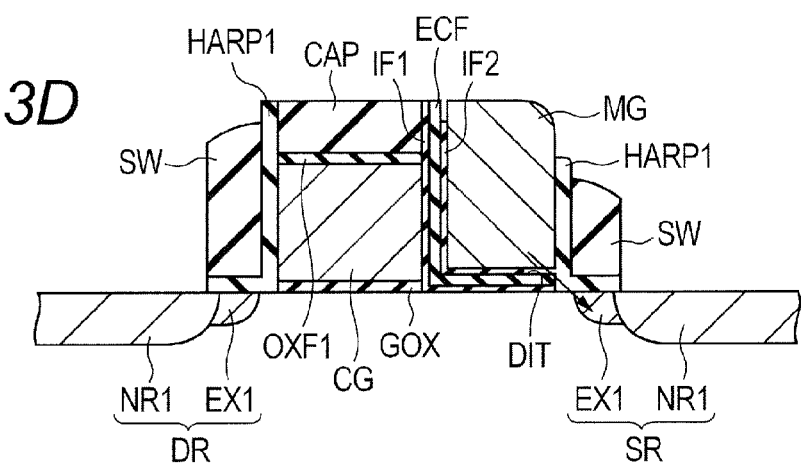

Although the subsequent manufacturing steps will be omitted, the source region SR, including a low-concentration impurity diffusion region (extension region) EX1 and a high-concentration impurity diffusion region NR1, and the drain region DR, including the low-concentration impurity diffusion region EX1 and the high-concentration impurity diffusion region NR1, are formed by forming the low-concentration impurity diffusion region EX1 and the high-concentration impurity diffusion region NR1 in the semiconductor substrate, as illustrated in FIG. 3D. Further, a sidewall spacer SW is formed over each of either sidewall of the memory gate electrode MG and that of the control gate electrode CG.

Herein, a voltage having a relatively large absolute value is applied to the memory gate electrode MG in the non-volatile memory, when a writing operation for writing information or an erasing operation for erasing information is performed. Accordingly, in order to improve the reliability of the non-volatile memory, it is important to secure a sufficient withstand voltage, for example, between the memory gate electrode MG and the source region (diffusion layer) SR.

However, in a related art in which the manufacturing steps illustrated in FIGS. 3A to 3D are performed, the trench portion DIT is formed in the side surface of the insulating film IF2 by side etching, and the silicon oxide film HARP1 is embedded in the trench portion DIT. In this case, the film quality of the silicon oxide film HARP1 is inferior to that of the insulating film IF2, and hence when a voltage having a relatively large absolute value is applied between the memory gate electrode MG and the source region SR, a leakage current is generated, as indicated by the arrow in FIG. 3D. The present inventors have discovered that, as a result of this, the probability at which short-circuit may be generated is increased in the non-volatile memory according to the related art, and hence there is room for improvement from the viewpoint of improving the reliability of the non-volatile memory.

That is, the present inventors have discovered that: in a device structure in which the trench portion DIT is formed in the side surface of the insulating film IF2 by side etching and the silicon oxide film HARP1 is embedded in the trench portion DIT, the withstand voltage between the memory gate electrode MG and the source region SR is decreased, and hence there is room for improvement.

The details of the room for improvement will be further described. First, the insulating film IF2 is also comprised of a silicon oxide film of the same type as the silicon oxide film HARP1. Accordingly, there is a question that in a device structure in which the trench portion DIT is formed in the side surface of the insulating film IF2 by side etching and the silicon oxide film HARP1 is embedded in the trench portion DIT, the withstand voltage between the memory gate electrode MG and the source region SR is further decreased in comparison with that in a device structure formed without side etching created in the side surface of the insulating film IF2.

Hereinafter, the reason will be described. The silicon oxide film that forms the insulating film IF2 is a silicon oxide film formed, for example, by an HTO (High Temperature Oxide) method. The HTO method is one type of high-temperature CVD methods performed at a temperature of 700° C. or higher. A silicon oxide film formed by the high-temperature CVD method has a film quality that is minute and good. The silicon oxide film formed by the HTO method particularly has a film quality that is minute and good, because the HTO method is a high-temperature CVD method itself and high-temperature annealing is performed at approximately 1000° C. after a silicon oxide film is formed. This means that the silicon oxide film formed by the HTO method is a film excellent in withstand voltage. Accordingly, in a device structure formed without side etching created in the side surface of the insulating film IF2, a non-volatile memory excellent in the withstand voltage between the memory gate electrode MG and the source region SR can be achieved.

On the other hand, the silicon oxide film HARP1, embedded in the trench portion DIT formed by side etching, is one type of ozone TEOS films that are referred to as HARP (High Aspect Ratio Process) films formed by a low-temperature CVD method performed at a temperature of 600° C. or lower, and is inferior to the silicon oxide film formed by a high-temperature CVD method in terms of minuteness. This means that the film quality of the silicon oxide film HARP1 embedded in the trench portion DIT formed by side etching is inferior to that of the insulating film IF2, which means that the withstand voltage of the silicon oxide film HARP1 is lower than that of the insulating film IF2 (first factor). As a result, in a device structure in which the trench portion DIT is formed in the side surface of the insulating film IF2 by side etching and the silicon oxide film HARP1 is embedded in the trench portion DIT, the withstand voltage between the memory gate electrode MG and the source region SR is further decreased in comparison with that in a device structure formed without side etching created in the side surface of the insulating film IF2.

As used herein, the "high-temperature CVD method" is defined as a CVD method performed at a temperature of 700° C. or higher. On the other hand, the "low-temperature CVD method" is defined as a CVD method performed at a temperature of 600° C. or lower. The reason why a "high-temperature CVD method" and a "low-temperature CVD method" are thus distinguished from each other in the present specification is to clearly indicate the difference between the film quality of a silicon oxide film formed by the "high-temperature CVD method" and that of a silicon oxide film formed by the "low-temperature CVD method". That is, the film quality of a silicon oxide film formed by the "high-temperature CVD method" is better than that of a silicon oxide film formed by the "low-temperature CVD method". In other words, this means that the withstand voltage of a silicon oxide film formed by the "high-temperature CVD method" is superior to that of a silicon oxide film formed by the "low-temperature CVD method".

Furthermore, if side etching is created in the side surface of the insulating film IF2, the side surface may be damaged by the side etching. Due to this, even if the trench portion DIT is formed in the side surface of the insulating film IF2 by side etching and the silicon oxide film HARP1 is embedded in the trench portion DIT, a damaged side surface is inherently present in the trench portion DIT, and hence a leakage current resulting from the damaged side surface is increased (second factor).

Accordingly, it can be considered that: in a device structure in which the trench portion DIT is formed in the side surface of the insulating film IF2 by side etching and the silicon oxide film HARP1 is embedded in the trench portion DIT, the withstand voltage between the memory gate electrode MG and the source region SR may be further decreased by a synergetic effect of the aforementioned first factor and second factor, in comparison with that in a device structure in which side etching is not created in the side surface of the insulating film IF2.

Herein, as a method of avoiding the aforementioned first factor, it can be considered that the silicon oxide film to be embedded in the trench portion DIT formed by side etching is not a silicon oxide film formed by the "low-temperature CVD method", but a silicon oxide film formed by the "high-temperature CVD method" represented, for example, by an HTO method. It is because, in this case, the film quality of the silicon oxide film to be embedded in the trench portion DIT becomes better. Namely, it can be considered that: in a device structure in which the trench portion DIT is formed in the side surface of the insulating film IF2 by side etching and a silicon oxide film is embedded in the trench portion DIT, when a silicon oxide film having a good film quality is embedded in the trench portion DIT, a withstand voltage, equivalent to that in a device structure formed without side etching created in the side surface of the insulating film IF2, can be secured.

However, in the step of forming a silicon oxide film to be embedded in the trench portion DIT formed by side etching, the memory gate electrode MG is already formed, as illustrated, for example, in FIG. 3C. When a silicon oxide film to be embedded in the trench portion DIT is formed by the "high-temperature CVD method" represented by an HTO method, the memory gate electrode MG may be damaged, and hence it is difficult to form a silicon oxide film to be embedded in the trench portion DIT by the "high-temperature CVD method" represented by an HTO method. Because the HTO method is the high-temperature CVD method itself and high-temperature annealing is performed at approximately 1000° C. after the silicon oxide film is formed, as described above, it is particularly difficult to form the silicon oxide film by the "high-temperature CVD method" represented by the HTO method after the memory gate electrode MG is formed.

Figure 8:
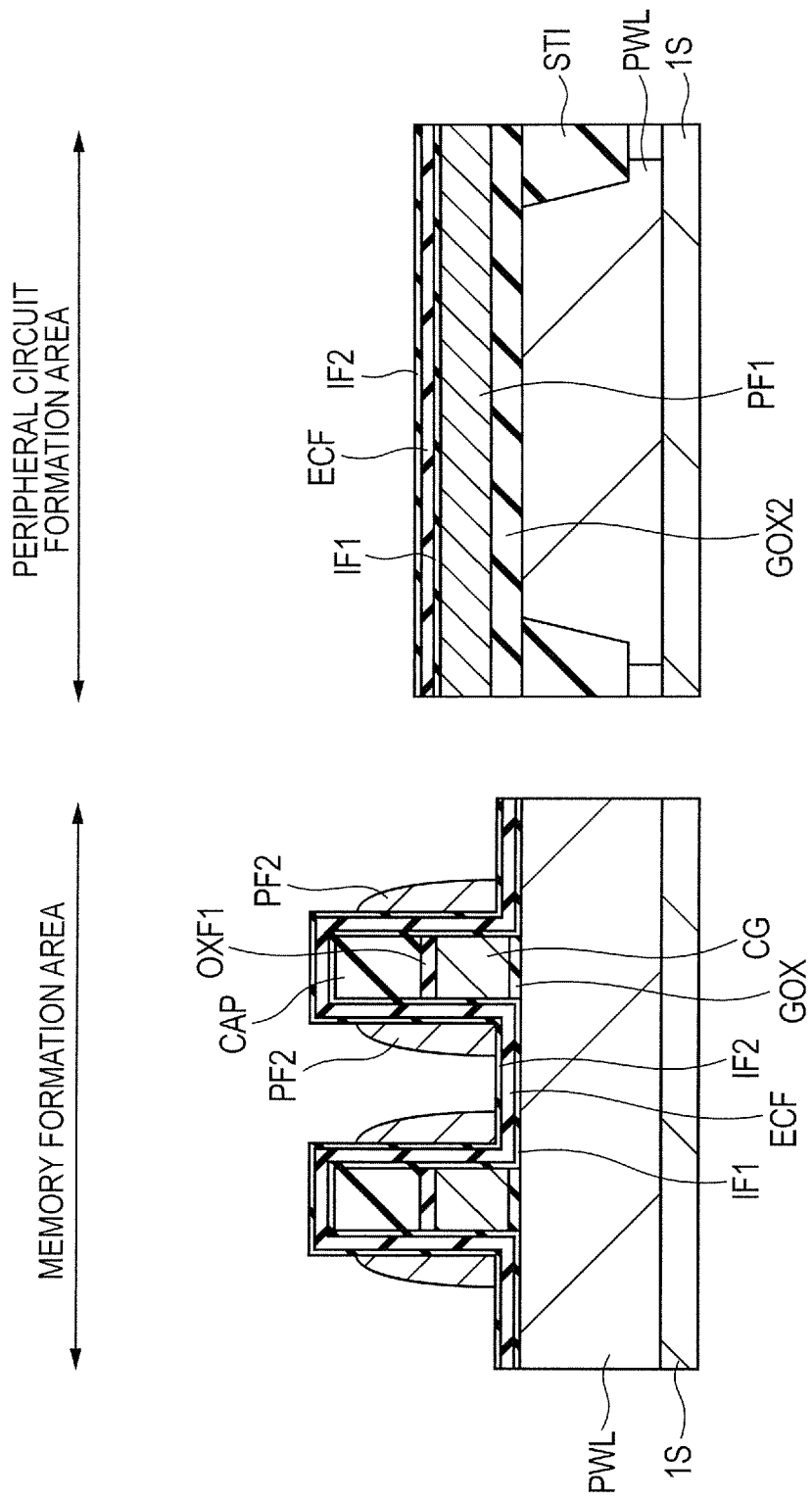
FIG. 8 is a sectional view illustrating a manufacturing step of a semiconductor device following FIG. 7.
Figure 9:
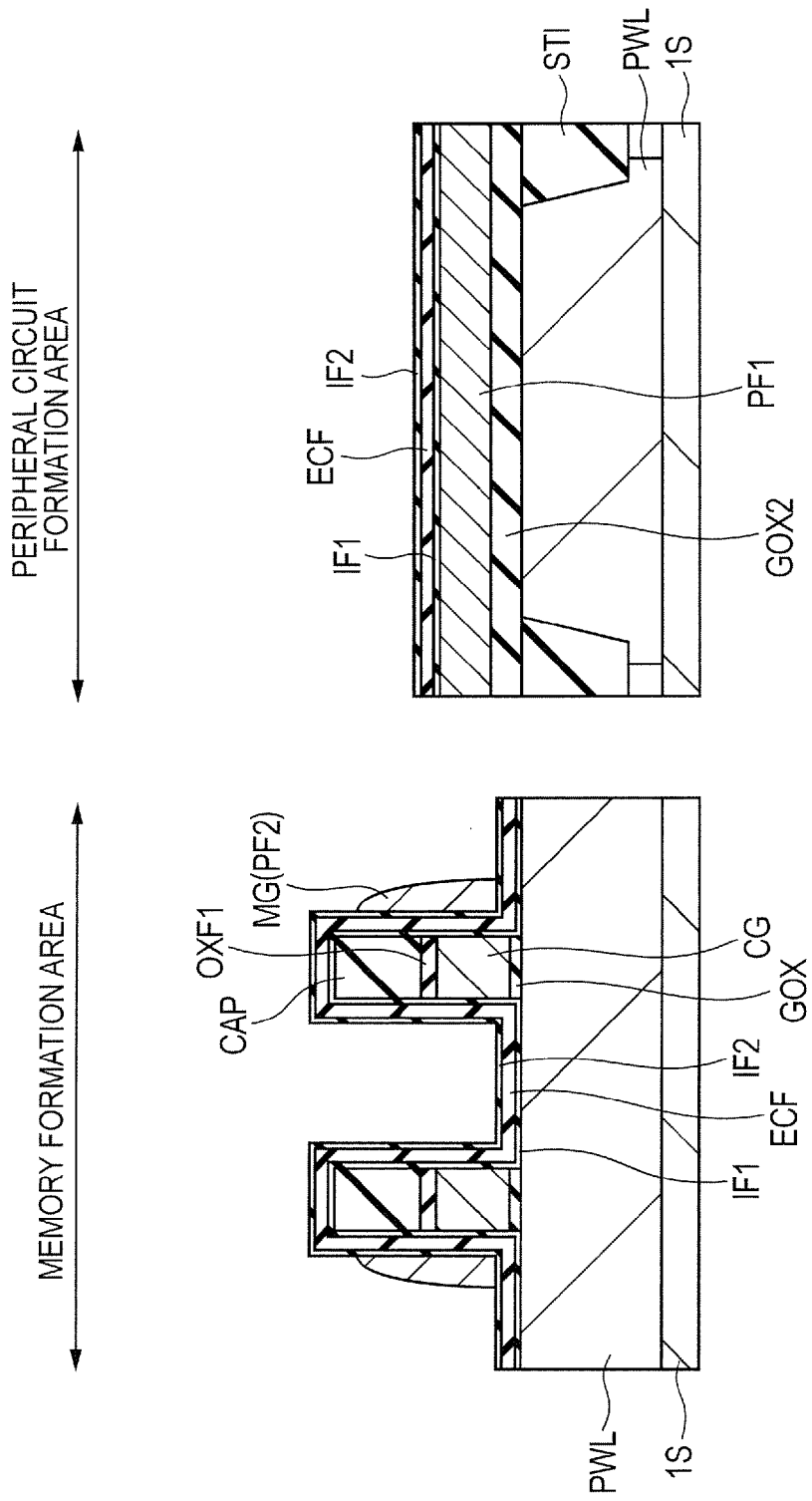
FIG. 9 is a sectional view illustrating a manufacturing step of a semiconductor device following FIG. 8.
Figure 10:
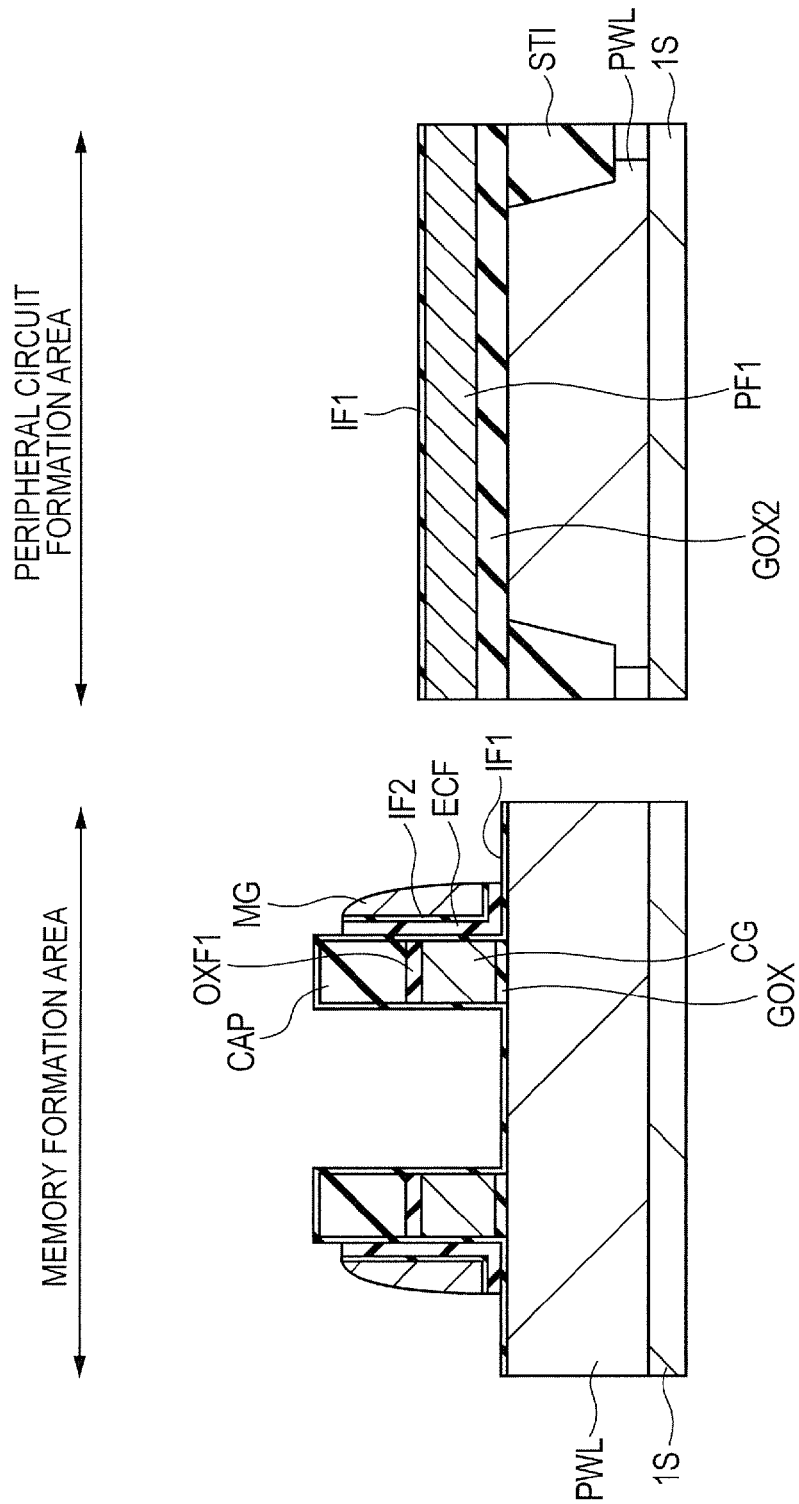
FIG. 10 is a sectional view illustrating a manufacturing step of a semiconductor device following FIG. 9.

Furthermore, after a polysilicon film PF2 formed over either sidewall of the laminated structure body (polysilicon film PF2 formed on the drain region side) is removed as illustrated in FIGS. 8 and 9, the step of introducing n-type impurities or p-type impurities into a polysilicon film PF1 in a peripheral circuit formation region is performed as illustrated in FIG. 10. That is, n-type impurities (phosphorus, etc.) are introduced into the polysilicon film PF1 in an n-channel type MISFET formation region in the peripheral circuit formation region, while p-type impurities (boron, etc.) are introduced into the polysilicon film PF1 in a p-channel type MISFET formation region in the peripheral circuit formation region. Accordingly, when high-temperature annealing is performed at approximately 1000° C. after the silicon oxide film HARP1 is formed, penetration of boron, etc., may be created, and hence it is difficult to form a minute silicon oxide film by the "high-temperature CVD method" represented by the HTO method, instead of the silicon oxide film HARP1 formed by the "low-temperature CVD method".

Accordingly, it is necessary that a silicon oxide film, which is to be embedded in the trench portion DIT formed by side etching, is caused to be the silicon oxide film HARP1 formed by the "low-temperature CVD method". As a result, the film quality of the silicon oxide film embedded in the trench portion DIT formed by side etching is inferior to that of the insulating film IF2. Due to this, the withstand voltage of the silicon oxide film HARP1 becomes lower than that of the insulating film IF2. Thereby, in a device structure in which the trench portion DIT is formed in the side surface of the insulating film IF2 by side etching and the silicon oxide film HARP1 is embedded in the trench portion DIT, the withstand voltage between the memory gate electrode MG and the source region SR is further decreased in comparison with that in a device structure formed without side etching created in the side surface of the insulating film IF2. Furthermore, even if the silicon oxide film to be embedded in the trench portion DIT can be formed by the "high-temperature CVD method", the side surface of the insulating film IF2 may be damaged by side etching possibly created in the side surface thereof, and hence the second factor that the damaged side surface is inherently present in the trench portion DIT cannot be avoided. Due to this, the room for improvement becomes obvious, in which the withstand voltage between the memory gate electrode MG and the source region SR is decreased due to the aforementioned first factor and second factor in a current related art.

Accordingly, a device is made for the aforementioned room for improvement in First Embodiment. Hereinafter, technical ideas in First Embodiment in which the device has been made will be described.

<Device Structure of Semiconductor Device>

Figure 4:
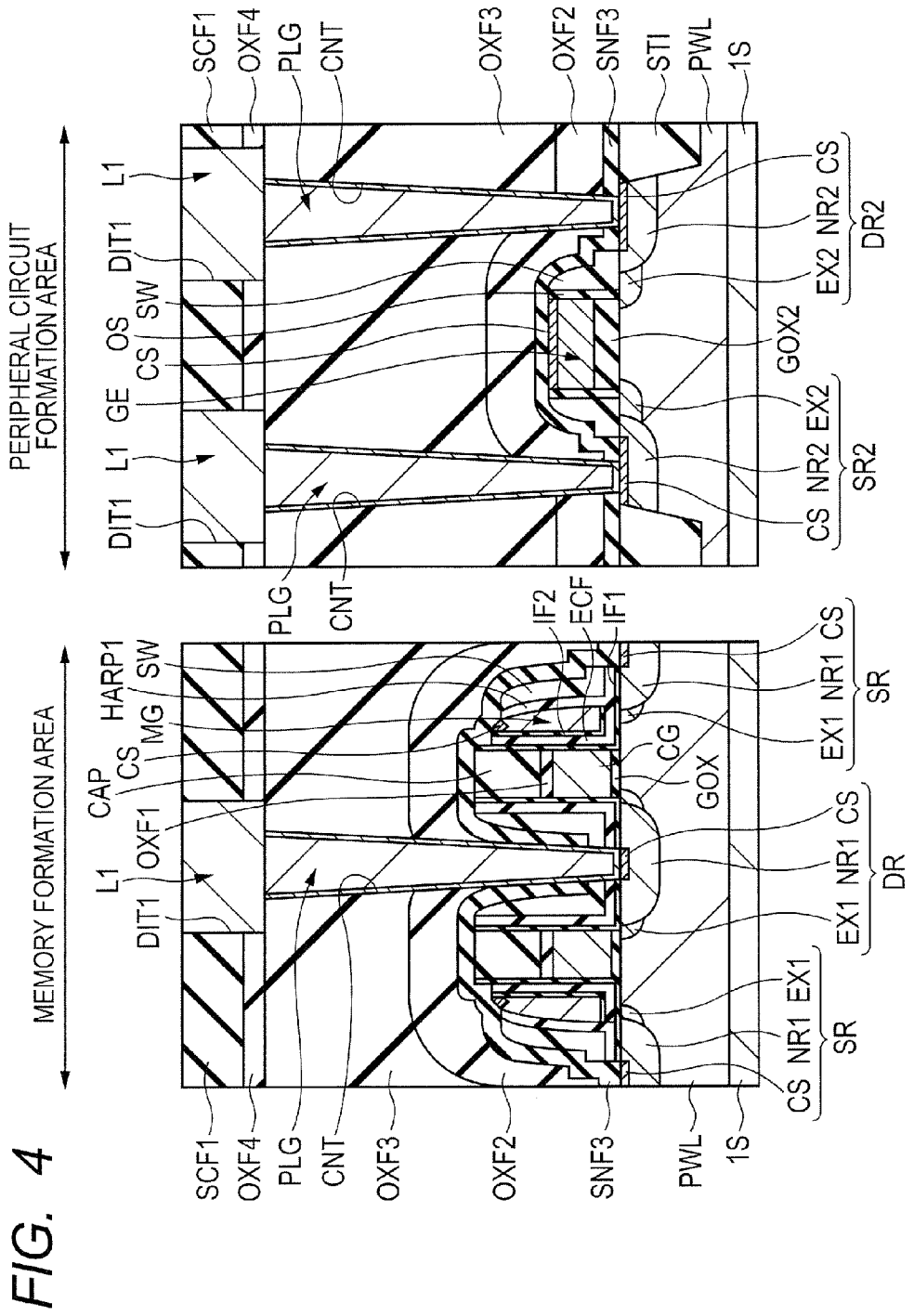
FIG. 4 is a view explaining an example of a device structure of a semiconductor device in First Embodiment.

FIG. 4 is a view explaining an example of the device structure of the semiconductor device in First Embodiment. FIG. 4 illustrates both the device structure of the non-volatile memory formed in a memory formation region and that of a high-withstand voltage MISFET (Metal Insulator Semiconductor Field Effect Transistor) formed in a peripheral circuit formation region.

The semiconductor device in First Embodiment is formed as the semiconductor chip CHP illustrated in FIG. 1, and the non-volatile memory formed in the memory formation region in FIG. 4 is a memory that forms the EEPROM 4 and the flash memory 5 illustrated, for example, in FIG. 1. On the other hand, the high-withstand voltage MISFET formed in the peripheral circuit formation region in FIG. 4 is a MISFET that forms the analog circuit 3 or the I/O circuit 6, etc., illustrated, for example, in FIG. 1 or that is included in a peripheral circuit for controlling the drive of the non-volatile memory.

In the semiconductor device in First Embodiment, a low-withstand voltage MISFET, having a withstand voltage lower than that of the high-withstand voltage MISFET, is also formed in addition to the non-volatile memory and the high-withstand voltage MISFET, but the description of the low-withstand voltage MISFET is omitted, taking into consideration that: the basic structure thereof is similar to that of the high-withstand voltage MNISFET; the low-withstand voltage MISFET is not a characteristic part in First Embodiment; and the like. The low-withstand voltage MISFET is a MISFET that forms the CPU 1 or the RAM 2, etc., illustrated, for example, in FIG. 1 or that is included in the peripheral circuit for controlling the drive of the non-volatile memory.

Further, an n-channel type MISFET will be described as an example in First Embodiment, but a p-channel type MISFET may also be formed. The description of the p-channel type MISFET is omitted, taking into consideration that: the device structure thereof is basically a device structure in which the conductivity type of the components (semiconductor region, etc.) in the n-channel type MISFET are made reversed; the p-channel type MISFET is not a characteristic part in First Embodiment; and the like.

The configuration of the non-volatile memory formed in the memory formation region will be first described with reference to FIG. 4. The device structure of the non-volatile memory illustrated in FIG. 4 corresponds to a sectional view taken along B-B Line in FIG. 2, and two memory cells, which are arranged symmetrically with respect to the drain region DR, are illustrated. Herein, the device structures of the two memory cells are similar to each other, and hence the device structure of the non-volatile memory arranged on the right side will be described with attention focusing thereon.

As illustrated in FIG. 4, a p-type well PWL is formed over a semiconductor substrate 1S. The memory cell is formed over the p-type well PWL. The memory cell is formed by a selection unit for selecting a memory cell and a storage unit for storing information.

The configuration of the selection unit for selecting a memory cell will be first described. The memory cell has the gate insulating film GOX formed over the semiconductor substrate 1S (p-type well PWL), and the control gate electrode (control electrode) CG is formed over the gate insulating film GOX. In the memory cell in First Embodiment, the cap insulating film CAP is formed over the control gate electrode CG via the silicon oxide film OXF1.

The gate insulating film GOX is formed, for example, by a silicon oxide film, and the control gate electrode CG is formed, for example, by a polysilicon film that is a conducting film. The cap insulating film CAP is formed, for example, by a silicon nitride film.

The aforementioned control gate electrode CG has a function of selecting a memory cell. That is, the control gate electrode CG selects a specific memory cell for which a writing operation, an erasing operation, or a read operation is performed.

Subsequently, the configuration of the storage unit in the memory cell will be described. The memory gate electrode MG is formed, via the laminated insulating film, over either sidewall (sidewall on the right side) of the laminated structure body including the gate insulating film GOX, the control gate electrode CG, the silicon oxide film OXF1, and the cap insulating film CAP. The memory gate electrode MG has a sidewall shape formed over either sidewall of the laminated structure body, and is comprised of a polysilicon film and a silicide film CS formed over the polysilicon film. The silicide film CS is formed to lower the resistance of the memory gate electrode MG, and is formed, for example, by a nickel-platinum silicide film (NiPtSi film), but without being limited thereto, it may also be comprised of a cobalt silicide film or a nickel silicide film.

A laminated insulating film, having both a first portion formed between the either sidewall of the laminated structure body and the memory gate electrode MG and a second portion formed between the memory gate electrode MG and the semiconductor substrate 1S, is formed. The first portion of the laminated insulating film is comprised of: the insulating film IF1 that is in contact with the control gate electrode CG; the insulating film IF2 that is in contact with the memory gate electrode MG; and the charge storage film ECF sandwiched between the insulating film IF1 and the insulating film IF2. The second portion of the laminated insulating film is comprised of: the insulating film IF1 formed over the semiconductor substrate 1S; the insulating film IF2 formed in the layer below the memory gate electrode MG; and the charge storage film ECF sandwiched between the insulating film IF1 and the insulating film IF2. That is, the first portion and the second portion of the laminated insulating film are both comprised of the insulating film IF1, the insulating film IF2, and the charge storage film ECF.

The insulating film IF1 is comprised of an insulating film such as, for example, a silicon oxide film, a silicon oxynitride film, or the like, and functions as a gate insulating film formed between the memory gate electrode MG and the semiconductor substrate 1S. The insulating film IF1 including a silicon oxide film also has a function as a tunnel insulating film. The storage unit in the memory cell stores or erases information, for example, by implanting electrons or holes from the semiconductor substrate 1S into the charge storage film ECF via the insulating film IF1, and hence the insulating film IF1 also functions as a tunnel insulating film.

The charge storage film ECF formed over the insulating film IF1 has a function of storing a charge. Specifically, the charge storage film ECF is comprised of a silicon nitride film in First Embodiment. The storage unit in the memory cell in First Embodiment stores information by controlling a current flowing through the semiconductor substrate 1S below the memory gate electrode MG, depending on the presence/absence of a charge stored in the charge storage film ECF. That is, the storage unit stores information by using the fact that the threshold voltage of a current flowing through the semiconductor substrate 1S below the memory gate electrode MG is changed depending on the presence/absence of a charge stored in the charge storage film ECF.

An insulating film having a trap level is used as the charge storage film ECF in First Embodiment. A silicon nitride film can be cited as one example of the insulating film having a trap level, but without being limited thereto, a high dielectric constant film having a dielectric constant higher than that of a silicon nitride film, such as, for example, an aluminum oxide (alumina) film, a hafnium oxide film, a tantalum oxide film, or the like, may be used. Alternatively, the charge storage film ECF may be comprised of silicon nano-dot. When an insulating film having a trap level is used as the charge storage film ECF, a charge is trapped by the trap level formed in the insulating film. Charges are stored in the insulating film by thus trapping a charge in the trap level.

Polysilicon films have been traditionally used as the charge storage film. ECF, but when a polysilicon film is used as the charge storage film ECF, there is the possibility that: if a defect is present in any portion of the insulating film IF1 or the insulating film IF2 each surrounding the charge storage film ECF, all of the charges stored in the charge storage film ECF may be leaked out by abnormal leakage, because the charge storage film ECF is a conductor film.

Accordingly, a silicon nitride film that is an insulator has been used as the charge storage film ECF. In this case, the charges that contribute to data storage are stored in discrete trap levels present in the silicon nitride film. Accordingly, if a defect is caused in any portion of the insulating film IF1 or the insulating film IF2 each surrounding the charge storage film ECF, all of the charges are never leaked out, because the charges are stored in the discrete trap levels of the charge storage film ECF. Accordingly, the reliability in holding data can be improved.

From such a reason, the reliability in holding data can be improved by using, as the charge storage film ECF, a film including discrete trap levels, not limited to a silicon nitride film. Further, a silicon nitride film excellent in a data holding property is used as the charge storage film ECF in First Embodiment. Accordingly, the thickness of each of the insulating film IF1 and the insulating film IF2, which are provided to prevent the leakage of charges from the charge storage film ECF, can be reduced. Thereby, First Embodiment also has the advantage that the voltage for driving the memory cell can be reduced.

The insulating film IF2 is an insulating film for securing the insulation between the charge storage film. ECF and the memory gate electrode MG. The insulating film IF2 is comprised of an insulating film such as, for example, a silicon oxide film or a silicon oxynitride film. Accordingly, the insulating film IF1 and the insulating film IF2 are comprised of films of the same type. The insulating film IF1 and the insulating film IF2 can both be formed, for example, by a silicon oxide film.

Subsequently, over either sidewall (sidewall on the right side), of the sidewalls of the laminated structure body, the memory gate electrode MG is formed, and over the other sidewall (sidewall on the left side), a sidewall SW is formed via the insulating film IF1 and the silicon oxide film HARP1. Similarly, over either sidewall (sidewall on the left side), of the sidewalls of the memory gate electrode MG, the laminated structure body is formed, and over the other sidewall (sidewall on the right side), the sidewall SW is formed via the silicon oxide film HARP1.

A pair of shallow low-concentration impurity diffusion regions EX1, which are n-type semiconductor regions, are formed in the semiconductor substrate 1S immediately below the sidewall SW, and a pair of deep high-concentration impurity diffusion regions NR1 are formed in outside regions that respectively contact the shallow low-concentration impurity diffusion regions EX1. The deep high-concentration impurity diffusion region NR1 is also an n-type semiconductor region, and the silicide film CS is formed in the top surface of the deep high-concentration impurity diffusion region NR1. The source region SR or the drain region DR of the memory cell is formed by the shallow low-concentration impurity diffusion regions EX1 and the deep high-concentration impurity diffusion regions NR1.

Each of the source region SR and the drain region DR can be caused to have an LDD (Lightly Doped Drain) structure by forming the regions SR and DR with the shallow low-concentration impurity diffusion region EX1 and the deep high-concentration impurity diffusion region NR1.

Herein, a transistor comprised of: the gate insulating film GOX; the control gate electrode CG formed over the gate insulating film GOX; and the aforementioned source region SR and drain region DR, will be referred to as a selection transistor. On the other hand, a transistor comprised of: the laminated insulating film including the insulating film IF1, the charge storage film ECF, and the insulating film IF2; the memory gate electrode MG formed over the laminated insulating film; and the aforementioned source region SR and drain region DR, will be referred to as a memory transistor. Thereby, it can be said that the selection unit in the memory cell is comprised of the selection transistor and the storage unit in the memory cell is comprised of the memory transistor. Thus, the memory cell is formed.

Subsequently, a wiring structure to be coupled to the memory cell will be described. In FIG. 4, a silicon nitride film SNF3 is formed over the memory cell so as to cover the memory cell; a silicon oxide film (ozone TEOS film) OXF2 is formed over the silicon nitride film SNF3; and a silicon oxide film (TEOS film) OXF3 is formed over the silicon oxide film OXF2.

In the present specification, the silicon nitride film SNF3, the silicon oxide film OXF2, and the silicon oxide film OXF3 will be collectively referred to as a contact interlayer insulating film.

A contact hole CNT, which reaches the silicide film CS forming the drain region DR by penetrating the contact interlayer insulating film, is formed in the contact interlayer insulating film. Although not illustrated in FIG. 4, a contact hole, which reaches the silicide film CS that forms the source region SR, is also formed in the contact interlayer insulating film.

In the contact hole CNT, a titanium/titanium nitride film that is a barrier conductor film is formed and a tungsten film is formed so as to fill the contact hole CNT. The conductive plug PLG is formed by thus embedding the titanium/titanium nitride film and the tungsten film in the contact hole CNT. An interlayer insulating film, including, for example, a silicon oxide film OXF4 and an SiOC film. SCF1, is formed over the contact interlayer insulating film, and a wiring trench DIT1 is formed in the interlayer insulating film. Wiring L1 is formed to fill the wiring trench DIT1. The wiring L1 is comprised of a laminated film including, for example, a tantalum/tantalum nitride film and a copper film, and is configured to be electrically coupled to the plug PLG formed in the contact interlayer insulating film.

Subsequently, the configuration of the MISFET formed in the peripheral circuit formation region will be described with reference to FIG. 4. The peripheral circuit formation region means a region where the peripheral circuit is formed. Specifically, the non-volatile memory (non-volatile semiconductor storage device) is comprised of the memory cell formation region where memory cells are formed in an array pattern (matrix pattern) and the peripheral circuit formation region where a peripheral circuit for controlling the memory cell formed in the memory cell formation region is formed. The peripheral circuit formed in the peripheral circuit formation region is comprised of: a word driver for controlling the voltage to be applied to the control gate electrode CG of the memory cell, etc.; a sense amplifier for amplifying an output from the memory cell; a control circuit (including a booster circuit) for controlling the word driver and the sense amplifier; and the like. Accordingly, the MISFET, which forms, for example, the word driver, the sense amplifier, the control circuit (including a booster circuit), or the like, is illustrated in the peripheral circuit formation region illustrated in FIG. 4. In First Example, the high-withstand voltage MISFET will be particularly described as an example of the MISFETs.

In the peripheral circuit formation region, the p-type well PWL is formed over the semiconductor substrate 1S, as illustrated in FIG. 4. The p-type well PWL is comprised of a p-type semiconductor region where p-type impurities, such as boron (B), have been introduced into the semiconductor substrate 1S.

Subsequently, a gate insulating film GOX2 is formed over the p-type well PWL (semiconductor substrate 1S), and a gate electrode GE is formed over the gate insulating film GOX2. The gate insulating film GOX2 is formed, for example, by a silicon oxide film, while the gate electrode GE is formed, for example, by a polysilicon film and a silicide film CS formed over the top surface of the polysilicon film. In order to suppress the depletion of the gate electrode GE, n-type impurities, such as phosphorus, are introduced into the polysilicon film that forms the gate electrode GE. The silicide film CS that forms part of the gate electrodes GE is formed to lower the resistance of the gate electrode GE.

For example, the sidewall SW is formed over the sidewalls on both sides of the gate electrode GE, and a shallow low-concentration impurity diffusion region EX2 is formed in the semiconductor substrate 1S (p-type well PWL) immediately below the sidewall SW. The shallow low-concentration impurity diffusion region EX2 is an n-type semiconductor region formed to be aligned with the gate electrode GE. A deep high-concentration impurity diffusion region NR2 is formed outside the shallow low-concentration impurity diffusion region EX2. The deep high-concentration impurity diffusion region NR2 is also an n-type semiconductor region formed to be aligned with the sidewall SW. The silicide film CS, for lowering the resistance of the gate electrode, is formed over the top surface of the deep high-concentration impurity diffusion region NR2. A source region SR2 is comprised of the shallow low-concentration impurity diffusion region EX2 and the deep high-concentration impurity diffusion region NR2, and a drain region DR2 is comprised of both the impurity diffusion regions EX2 and NR2. The high-withstand voltage MISFET is thus formed in the peripheral circuit formation region.

The p-channel type MISFET is also formed in the peripheral circuit formation region, and the configuration of the p-channel type MISFET is obtained by reversing the conductivity type of the semiconductor region that forms the n-channel type MISFET.

Subsequently, a wiring structure to be coupled to the high-withstand voltage MISFET formed in the peripheral circuit formation region will be described. A contact interlayer insulating film, including a silicon nitride film SNF3, a silicon oxide film (ozone TEOS film) OXF2, and a silicon oxide film (TEOS film) OXF3, is formed over the high-withstand voltage MISFET so as to cover the high-withstand MISFET.

The contact hole CNT, which reaches the silicide film CS forming the source region SR2 and the drain region DR2 by penetrating the contact interlayer insulating film, is formed in the contact interlayer insulating film. In the contact hole CNT, a titanium/titanium nitride film that is a barrier conductor film is formed and a tungsten film is formed so as to fill the contact hole CNT. The conductive plug PLG is formed by thus embedding the titanium/titanium nitride film and the tungsten film in the contact hole CNT. An interlayer insulating film, including, for example, a silicon oxide film OXF4 and an SiOC film SCF1, is formed over the contact interlayer insulating film, and the wiring trench DIT1 is formed in the interlayer insulating film. The wiring L1 is formed to fill the wiring trench DIT1. The wiring L1 is comprised of a laminated film including, for example, a tantalum/tantalum nitride film and a copper film, and is configured to be electrically coupled to a plug PLG5 formed in the contact interlayer insulating film.

<Manufacturing Method of Semiconductor Device>

The semiconductor device in First Embodiment is thus configured, and subsequently a manufacturing method of the semiconductor device in First Embodiment will be described with reference to the drawings. FIGS. 5 to 22 are sectional views each illustrating a manufacturing step of a semiconductor device in First Embodiment, and correspond to manufacturing steps of the semiconductor device illustrated in FIG. 4.

Figure 5:
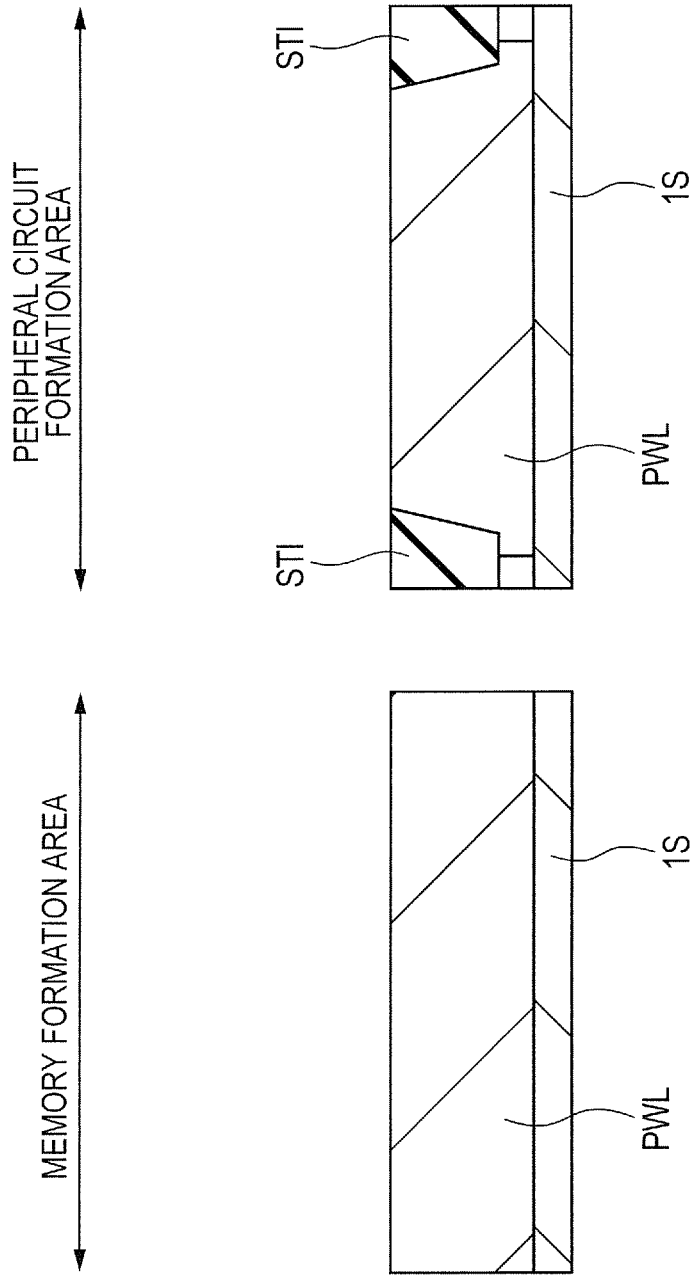
FIG. 5 is a sectional view illustrating a manufacturing step of a semiconductor device in First Embodiment.

As illustrated in FIG. 5, the semiconductor substrate 1S, including silicon single crystals into which p-type impurities, such as boron, have been introduced, is first provided. In this case, the semiconductor substrate 1S is in a state of a semiconductor wafer having an approximate disk shape. The element isolation region STI is then formed in the semiconductor substrate 1S. The element isolation region STI is provided in order to avoid the mutual interference of elements. The element isolation region STI can be formed by using, for example, an STI (shallow trench isolation) method. In the STI method, the element isolation region STI is formed as follows. That is, an element isolation trench is formed in the semiconductor substrate 1S by using a photolithography technique and an etching technique. An insulating film (silicon oxide film, etc.) is then formed over the semiconductor substrate 1S so as to fill the element isolation trench, and thereafter an unnecessary silicon oxide film formed over the semiconductor substrate 1S is removed by a CMP (Chemical Mechanical Polishing) method. Thereby, the element isolation region STI, in which an insulating film (silicon oxide film, etc.) is embedded only in the element isolation trench, can be formed. In FIG. 5, the element isolation region STI is formed in the peripheral circuit formation region. On the other hand, it does not seem that the element isolation region STI is formed in the memory formation region illustrated in FIG. 5 because FIG. 5 is a sectional view, taken along B-B Line in FIG. 2; however, the element isolation region STI is actually formed also in the memory formation region, as illustrated in FIG. 2.

Thereafter, the p-type well PWL is formed in the memory formation region by introducing impurities into the semiconductor substrate 1S, and then the p-type well PWL is formed in the peripheral circuit formation region. The p-type well PWL is comprised of introducing p-type impurities, such as, for example, boron, into the semiconductor substrate 1S with the use of an ion implantation method. In fact, the p-type well PWL formed in the memory formation region and that formed in the peripheral circuit formation region are usually different from each other in impurity concentration, etc., but in the present specification they are indicated by the same p-type well PWL for simplicity.

If necessary in order to adjust the threshold voltage of each of the selection transistor of the memory cell and the high-withstand voltage MISFET, conductive impurities are introduced into a channel region in the semiconductor substrate 1S by using, for example, an ion implantation method.

Figure 6:
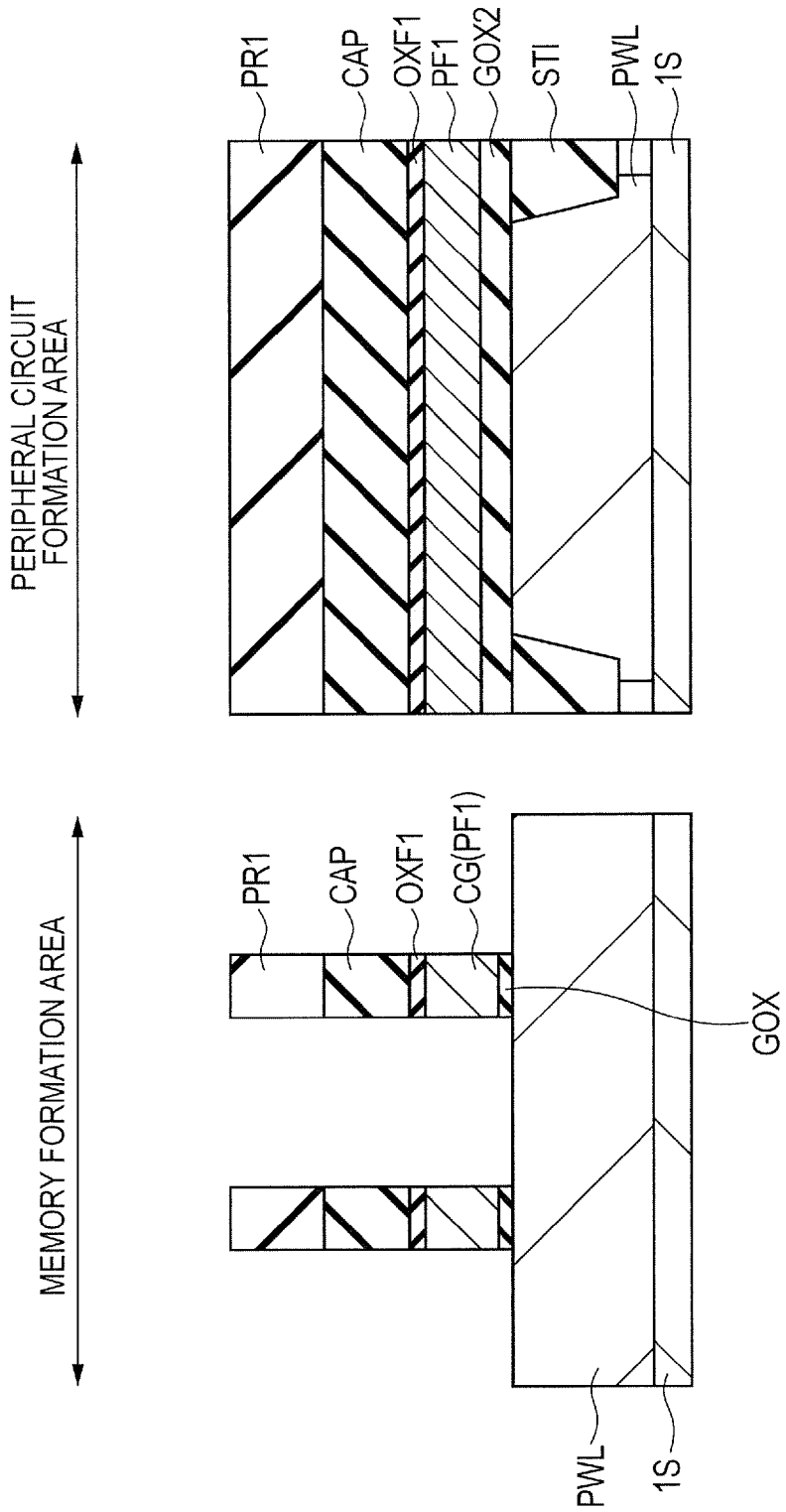
FIG. 6 is a sectional view illustrating a manufacturing step of a semiconductor device following FIG. 5.

Subsequently, after the top surface of the semiconductor substrate 1S is cleaned with dilute hydrofluoric acid, or the like, the gate insulating film GOX2 of the high-withstand voltage MISFET to be formed in the peripheral circuit formation region is formed over the semiconductor substrate 1S, as illustrated in FIG. 6. The gate insulating film GOX2 is comprised of a silicon oxide film, and the thickness of the film GOX2 is, for example, approximately 15 nm. The gate insulating film GOX2 formed in the memory formation region is then removed by using a photolithography technique and an etching technique. Thereafter, the gate insulating film GOX is formed in the memory formation region of the semiconductor substrate 1S.

The gate insulating film GOX is comprised of an insulating film such as, for example, a silicon oxide film, and can be comprised of using, for example, a thermal oxidation method. However, the gate insulating film GOX can be comprised of various films without being limited to a silicon oxide film, and may be comprised, for example, of a silicon oxynitride (SiON) film. That is, a structure may be adopted, in which nitrogen is segregated in the interface between the gate insulating film GOX and the semiconductor substrate 1S. A silicon oxynitride film has effects of controlling the generation of an interface level in the film and of reducing electron trap, the effects being higher than those of a silicon oxide film. Accordingly, the hot carrier resistance of the gate insulating film GOX can be improved, and the withstand voltage thereof can be improved. Further, it is more difficult for impurities to penetrate a silicon oxynitride film than a silicon oxide film. Accordingly, a variation in the threshold voltage resulting from the diffusion of the impurities in the gate electrode toward the semiconductor substrate 1S can be controlled by using a silicon oxynitride film for the gate insulating film GOX. A silicon oxynitride film can be formed by subjecting the semiconductor substrate 1S to a heat treatment in an atmosphere including nitrogen, such as, for example, NO, $NO_2$, or $NH_3$. The same effects can be obtained also in the following way: after the gate insulating film GOX including a silicon oxide film is formed over the top surface of the semiconductor substrate 1S, the semiconductor substrate 1S is subjected to a heat treatment in an atmosphere including nitrogen; and nitrogen is segregated in the interface between the gate insulating film GOX and the semiconductor substrate 1S. Alternatively, a silicon oxynitride film may be formed by using a plasma nitriding method. In this case, nitrogen is segregated in the interface between the gate electrode (control gate electrode) and the gate insulating film GOX, and NBTI (Negative Bias Temperature Instability) can be improved.

The gate insulating film GOX may be formed, for example, by a high dielectric constant film having a dielectric constant higher than that of a silicon oxide film. Silicon oxide films have been traditionally used as the gate insulating film GOX, from the viewpoint that a silicon oxide film has a high withstand voltage and the silicon-silicon oxide interface thereof is excellent in electric/physical stability, etc. With the miniaturization of elements, however, the gate insulating film GOX has been required to have a very small thickness. When a silicon oxide film having such a small thickness is used as the gate insulating film GOX, a so-called tunnel current is generated, in which an electron flowing through a channel tunnels a barrier formed by the silicon oxide film and flows into a gate electrode.

Accordingly, high dielectric constant films are being used, the physical thickness of which can be increased even if the capacity of which is the same, by using a material having a dielectric constant higher than that of a silicon oxide film. Because the physical thickness of a high dielectric constant film can be increased even if the capacity is the same, a leakage current can be reduced. Although a silicon nitride film is a film having a dielectric constant higher than that of a silicon oxide film, it is particularly desirable to use a high dielectric constant film having a dielectric constant higher than that of the silicon nitride film.

For example, a hafnium oxide film ($HfO_2$ film), which is one of hafnium oxides, is used as a high dielectric constant film having a dielectric constant higher than that of a silicon nitride film; however, other hafnium-based insulating films, such as a HfAlO film (hafnium aluminate film), a HfON film (hafnium oxynitride film), a HfSiO film (hafnium silicate film), and a HfSiON film (hafnium silicon oxynitride film) can also be used, instead of the hafnium oxide film. Also, hafnium-based insulating films, obtained by introducing oxides, such as a tantalum oxide, a niobium oxide, a titanium oxide, a zirconium oxide, a lanthanum oxide, and an yttrium oxide, into these hafnium-based insulating films, can be used. Because a hafnium-based insulating film has a dielectric constant higher than that of a silicon oxide film or a silicon oxynitride film, similarly to a hafnium oxide film, the same effects as in the case where a hafnium oxide film is used can be obtained.

Subsequently, the polysilicon film (polycrystalline silicon film) PF1 is formed over the whole main surface of the semiconductor substrate 1S. Then, phosphorus (P) or arsenic (As), which are n-type impurities, is introduced into the polysilicon film PF1 formed in the memory formation region by using an ion implantation method. Thereafter, the silicon oxide film OXF1 is formed over the polysilicon film PF1, and the cap insulating film CAP is formed over the silicon oxide film OXF1. The cap insulating film CAP can be formed, for example, by a silicon nitride film.

Subsequently, after a resist film PR1 is formed over the cap insulating film CAP, the resist film PR1 is patterned by using a photolithography technique. The cap insulating film CAP, the silicon oxide film OXF1, the polysilicon film PF1, and the gate insulating film GOX are sequentially patterned in the memory formation region by etching using the patterned resist film PR1 as a mask. Thereby, the laminated structure body, including the gate insulating film GOX, the control gate electrode CG, the silicon oxide film OXF1, and the cap insulating film CAP, is formed in the memory formation region, as illustrated in FIG. 6. On the other hand, the gate insulating film GOX2, the polysilicon film PF1, the silicon oxide film OXF1, and the cap insulating film CAP remain in the whole peripheral circuit formation region.

Subsequently, after the patterned resist film PR1 is removed, conductive impurities are introduced into the channel region of the semiconductor substrate 1S by using, for example, an ion implantation method, if necessary in order to adjust the threshold voltage of the memory transistor of the memory cell.

Figure 7:
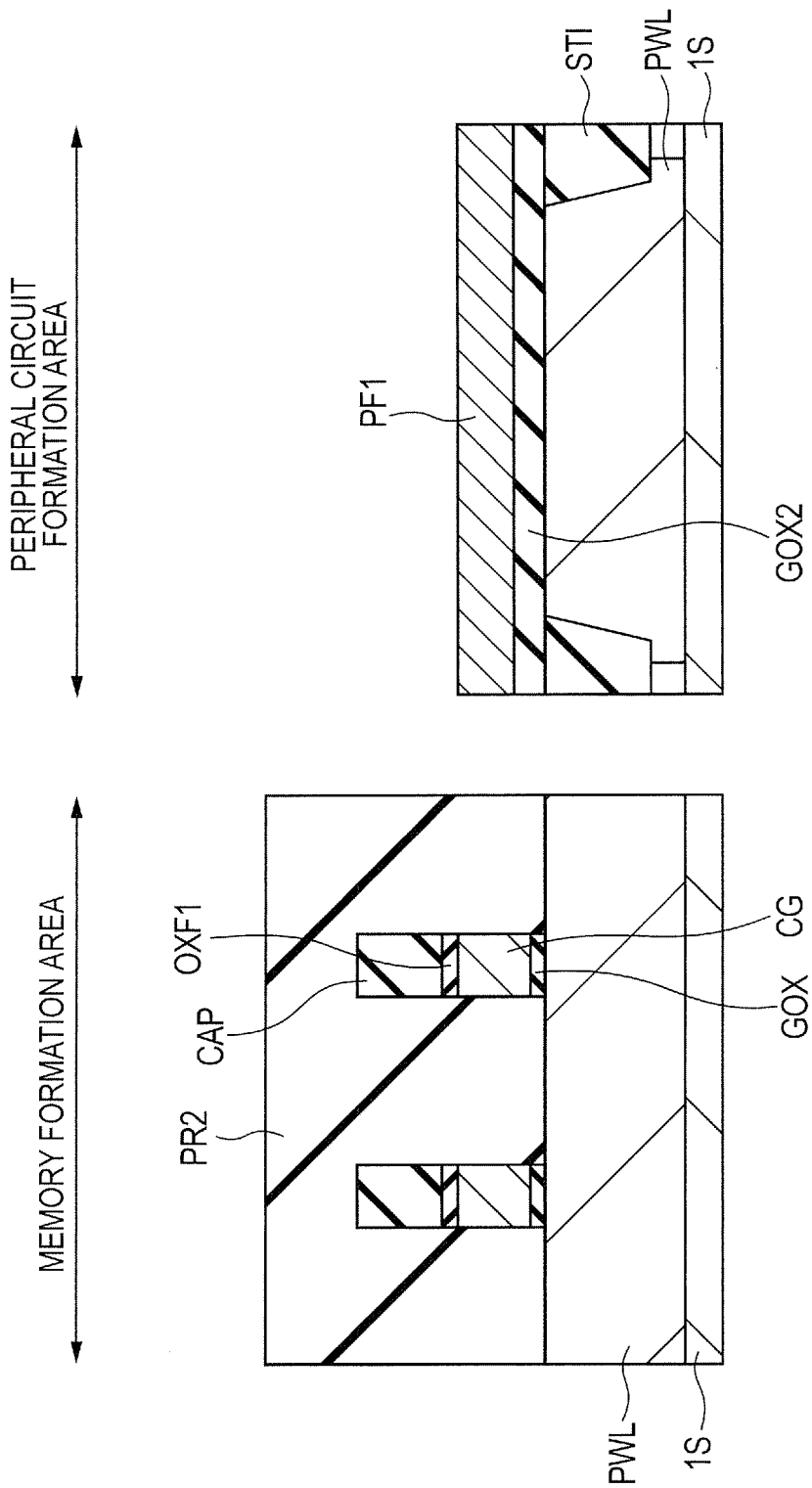
FIG. 7 is a sectional view illustrating a manufacturing step of a semiconductor device following FIG. 6.

Thereafter, the memory formation region is covered with a resist film PR2 by using a photolithography technique, and then the cap insulating film CAP and the silicon oxide film OXF1 that are formed in the peripheral circuit formation region are removed, as illustrated in FIG. 7.

Subsequently, the insulating film IF1 is formed over the whole semiconductor substrate 1S, and the charge storage film ECF is formed over the insulating film IF1, as illustrated in FIG. 8. The insulating film IF2 is then formed over the charge storage film ECF, and the polysilicon film PF2 is formed over the insulating film IF2.

The insulating film IF1 is comprised, for example, of a silicon oxide film, and can be formed by using, for example, an ISSG oxidation method by which a silicon oxide film having a minute and good film quality can be formed. The thickness of the insulating film IF1 is approximately 4 nm. The charge storage film ECF is comprised of a silicon nitride film, and can be formed by using, for example, a CVD method. The thickness of the charge storage film ECF is approximately 10 nm. Further, the insulating film IF2 is comprised of a silicon oxide film, and is formed by using, for example, the "high-temperature CVD method" represented by the HTO method by which a silicon oxide film having a minute and good film quality can be formed. The thickness of the insulating film IF2 is approximately 5 nm. The polysilicon film PF2 can be formed by using, for example, a CVD method. A laminated insulating film (ONO film), which has a minute and good film quality and is excellent in withstand voltage, can be thus formed.

Thereafter, the polysilicon film is removed by performing an entire etch back method (anisotropic etching) on the polysilicon film. In this case, the polysilicon film is removed by anisotropic etching, and hence the polysilicon film PF2 having a sidewall shape remains only over the sidewalls on both sides of the laminated structure body formed in the memory formation region, as illustrated in FIG. 8.

Subsequently, the resist film is patterned to cover both the polysilicon film PF2 formed over one side of the laminated structure body in the memory formation region and the whole surface of the peripheral circuit formation region by using a photolithography technique, as illustrated in FIG. 9. Then, by etching using the patterned resist film as a mask, the polysilicon film PF2 formed over the other side of the laminated structure body exposed from the mask is removed.

Thus, the memory gate electrode MG having a sidewall shape can be formed over either sidewall of the laminated structure body formed in the memory formation region via the laminated insulating film (ONO film), as illustrated in FIG. 9.

Subsequently, both the insulating film IF2 exposed from the memory gate electrode MG in the memory formation region and the insulating film IF2 in the periphery circuit formation region are removed by etching, as illustrated in FIG. 10. Thereafter, both the charge storage film ECF exposed from the memory gate electrode MG in the memory formation region and the charge storage film ECF in the peripheral circuit formation region are removed by etching. Thereby, the insulating film IF1 is exposed from the memory gate electrode MG in the memory formation region, and the insulating film IF1 is exposed also in the peripheral circuit formation region. Herein, the insulating film IF1 is caused to remain without being removed by etching.

Figure 11:
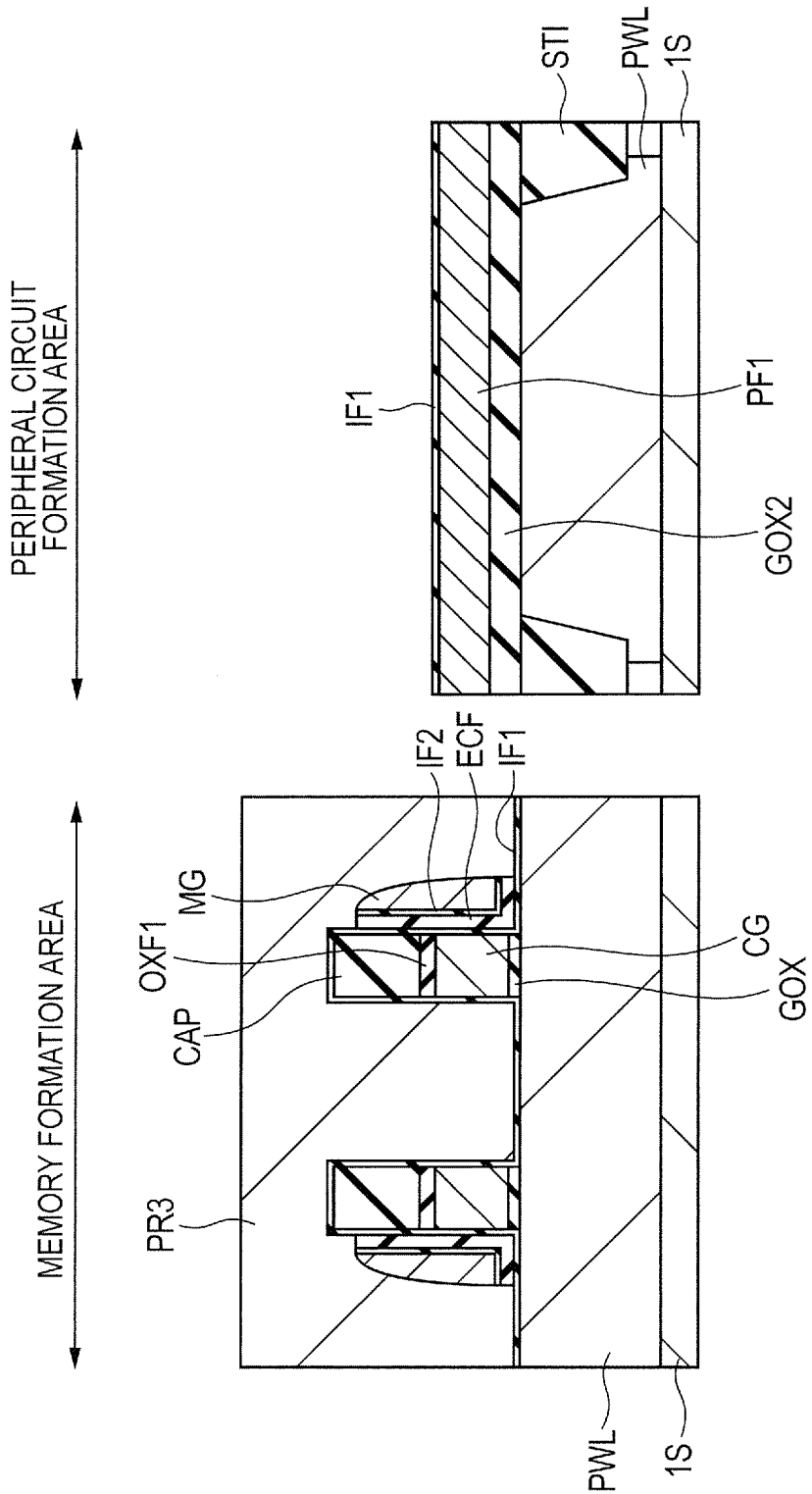
FIG. 11 is a sectional view illustrating a manufacturing step of a semiconductor device following FIG. 10.

Subsequently, the memory formation region is covered with a resist film PR3 by using a photolithography technique, and then n-type impurities, such as phosphorus, are introduced into the polysilicon film PF1 formed in the peripheral circuit formation region by using an ion implantation method, as illustrated in FIG. 11.

Figure 12:
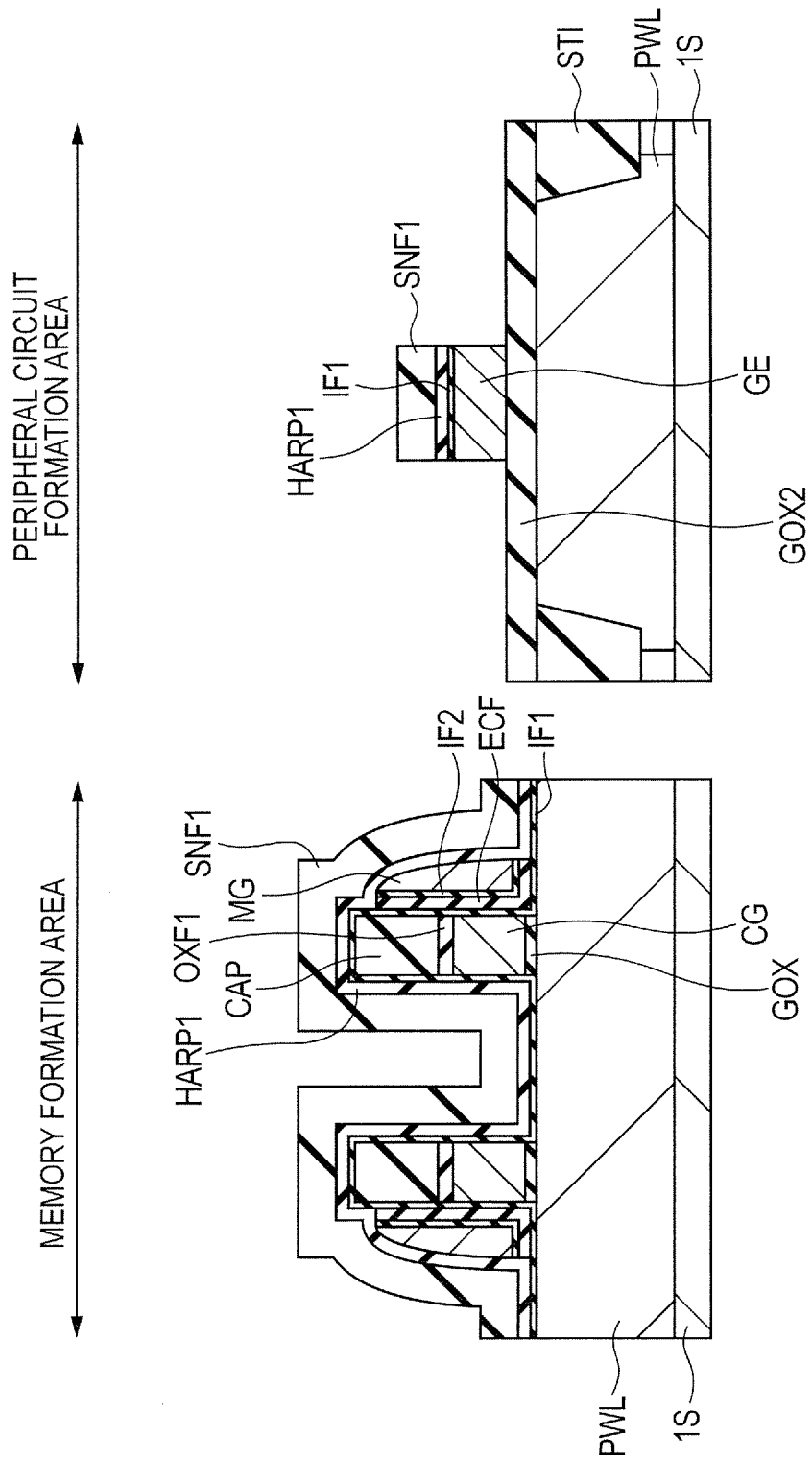
FIG. 12 is a sectional view illustrating a manufacturing step of a semiconductor device following FIG. 11.

Thereafter, the resist film PR3 covering the memory formation region is removed, and then annealing is performed in a nitrogen atmosphere. Then, the silicon oxide film HARP1 is formed over the semiconductor substrate 1S, and a silicon nitride film SNF1 is formed over the silicon oxide film HARP1, as illustrated in FIG. 12. That is, the silicon oxide film HARP1 serving as a protective insulating film is formed over: the insulating film IF1 exposed from the memory gate electrode MG; the end surface of the exposed charge storage film ECF; the end surface of the exposed insulating film IF2; and the memory gate electrode MG, in First Embodiment. The silicon oxide film HARP1 can be formed by using, for example, the "low-temperature CVD method", and the silicon nitride film SNF1 can be formed by using, for example, a CVD method.

Then, a patterned resist film is formed by using a photolithography technique, and the gate electrode GE is formed in the peripheral circuit formation region by etching using the patterned resist film as a mask. In this case, the memory formation region is covered with the resist film, and hence the region is not influenced by the etching.

Figure 13:
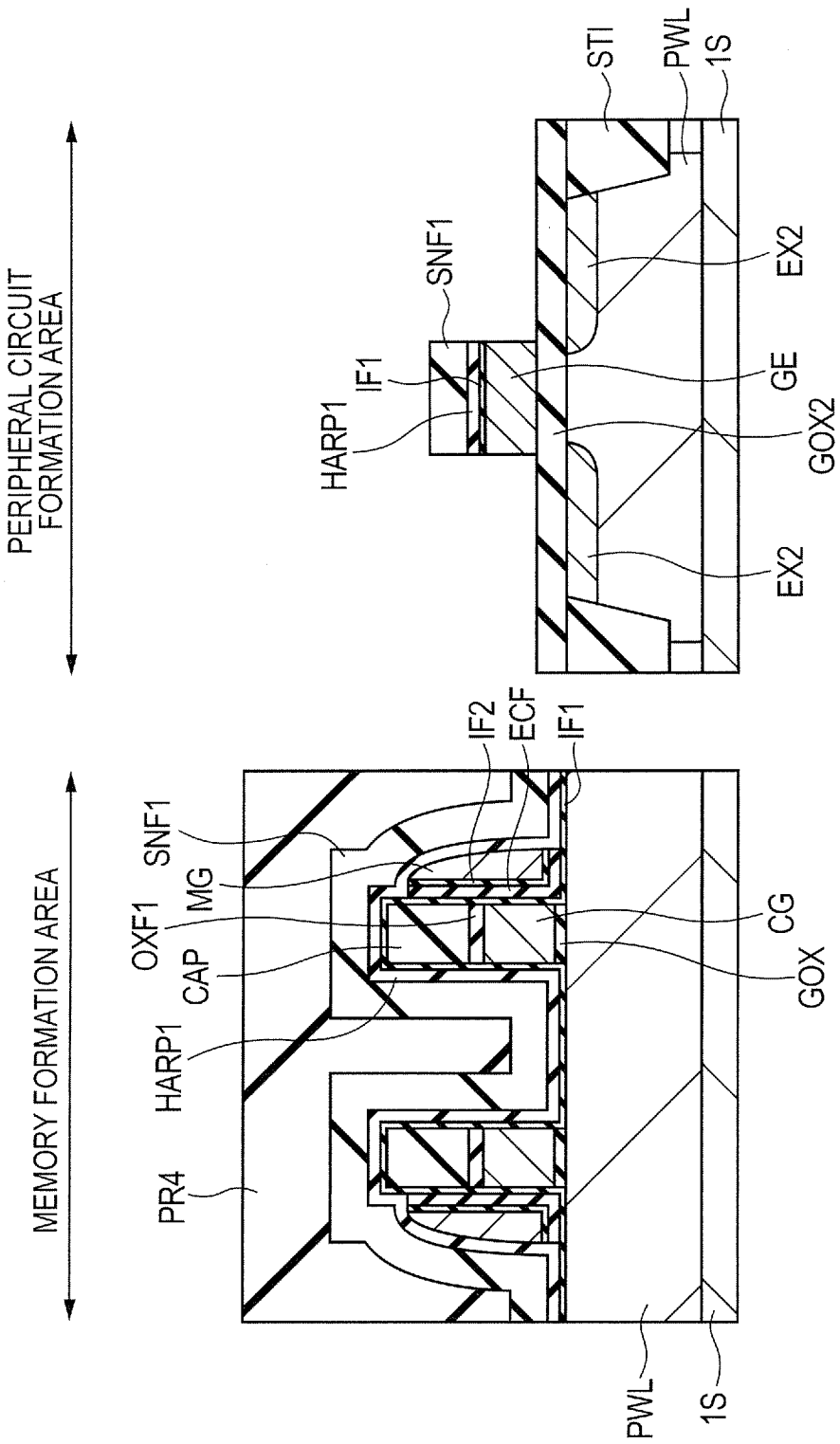
FIG. 13 is a sectional view illustrating a manufacturing step of a semiconductor device following FIG. 12.

Subsequently, after a resist film PR4 is formed to cover the memory formation region by using a photolithography technique, the shallow low-concentration impurity diffusion region EX2 is formed to be aligned with the gate electrode GE in the peripheral circuit formation region by an ion implantation method using the resist film PR4 as a mask, as illustrated in FIG. 13. The shallow low-concentration impurity diffusion region EX2 is an n-type semiconductor region into which n-type impurities, such as phosphorus or arsenic, have been introduced.

Figure 14:
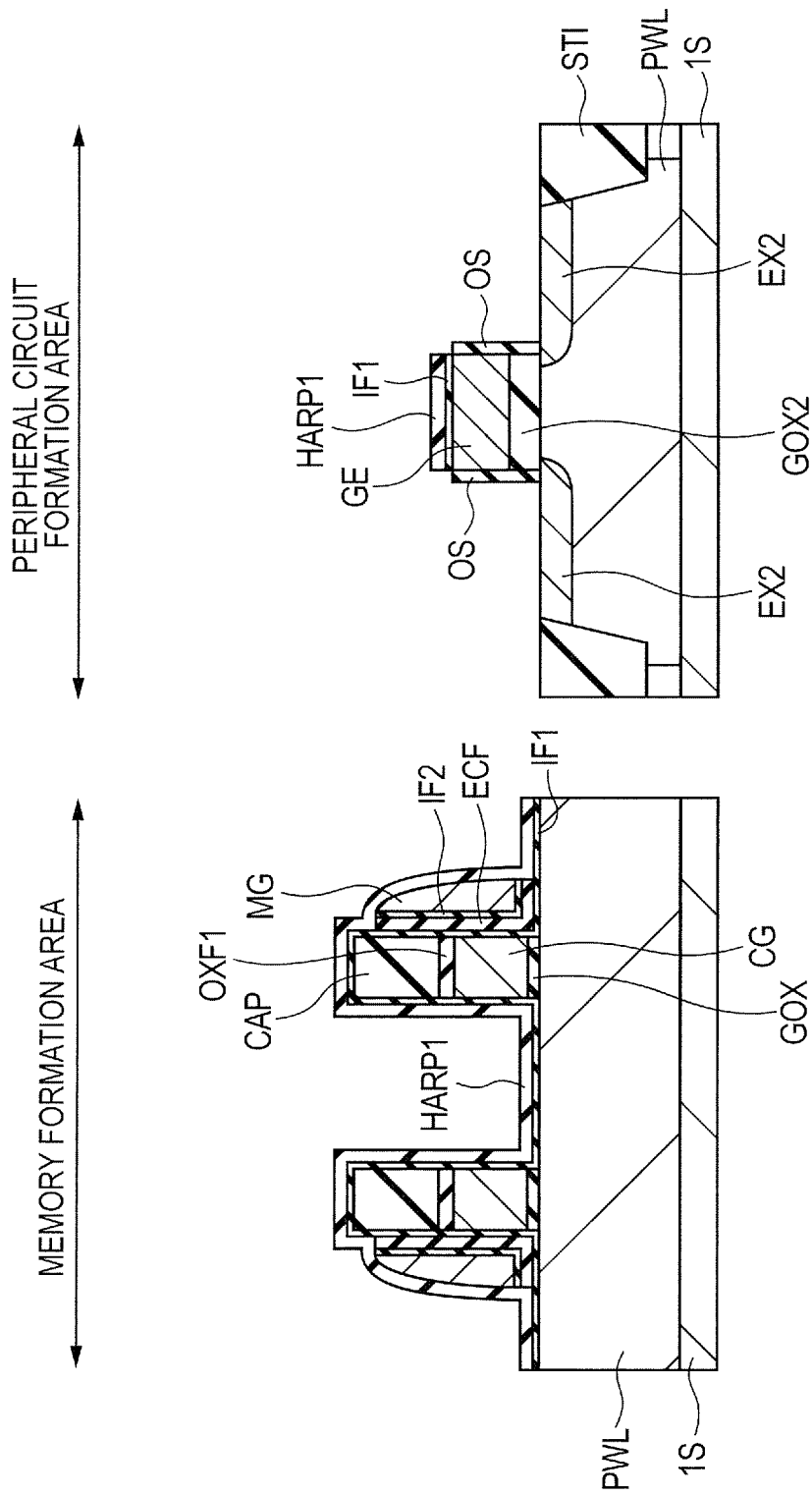
FIG. 14 is a sectional view illustrating a manufacturing step of a semiconductor device following FIG. 13.

Subsequently, after an offset spacer OS is formed over the sidewalls on both sides of the gate electrode GE formed in the peripheral circuit formation region, the silicon nitride film SNF1 formed in the memory formation region and the peripheral circuit formation region is removed, as illustrated in FIG. 14. Annealing is then performed in a nitrogen atmosphere.

Figure 15:
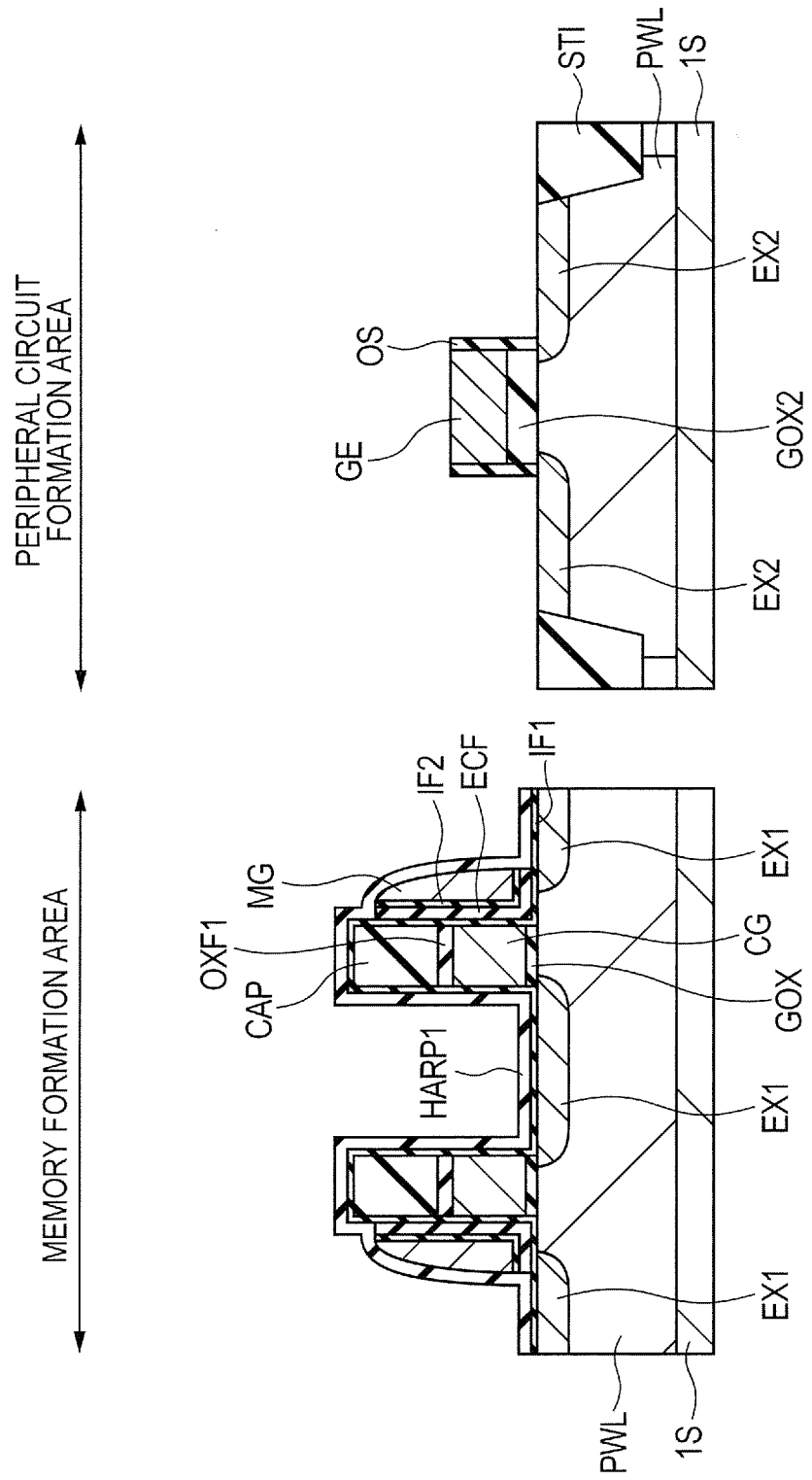
FIG. 15 is a sectional view illustrating a manufacturing step of a semiconductor device following FIG. 14.

Thereafter, the shallow low-concentration impurity diffusion region EX1 is formed to be aligned with the control gate electrode CG and the memory gate electrode MG in the memory cell formation region by using a photolithography technique and an ion implantation method, as illustrated in FIG. 15. The shallow low-concentration impurity diffusion region EX1 is an n-type semiconductor region into which n-type impurities, such as phosphorus or arsenic, have been introduced.

Figure 16:
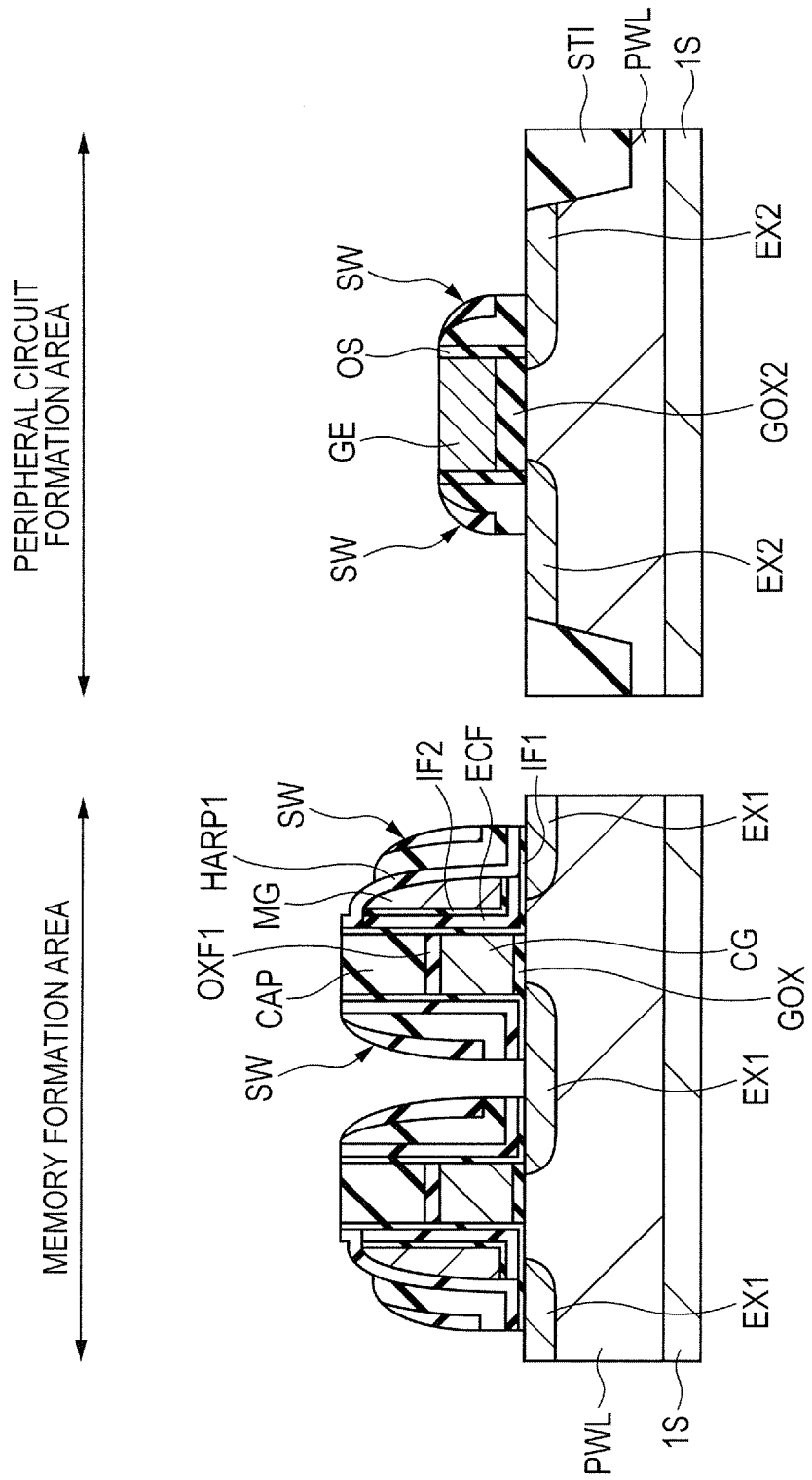
FIG. 16 is a sectional view illustrating a manufacturing step of a semiconductor device following FIG. 15.

Subsequently, a silicon oxide film is formed over the semiconductor substrate 1S, and a silicon nitride film is formed over the silicon oxide film, as illustrated in FIG. 16. The silicon oxide film and the silicon nitride film can be formed by using, for example, a CVD method. The sidewall SW is then formed by subjecting the silicon oxide film and the silicon nitride film to anisotropic etching. The sidewall SW is formed over the sidewalls of the control gate electrode CG (laminated structure body) and the memory gate electrode MG in the memory cell formation region. On the other hand, the sidewall SW is formed over the sidewalls on both sides of the gate electrode GE in the peripheral circuit formation region.

Figure 17:
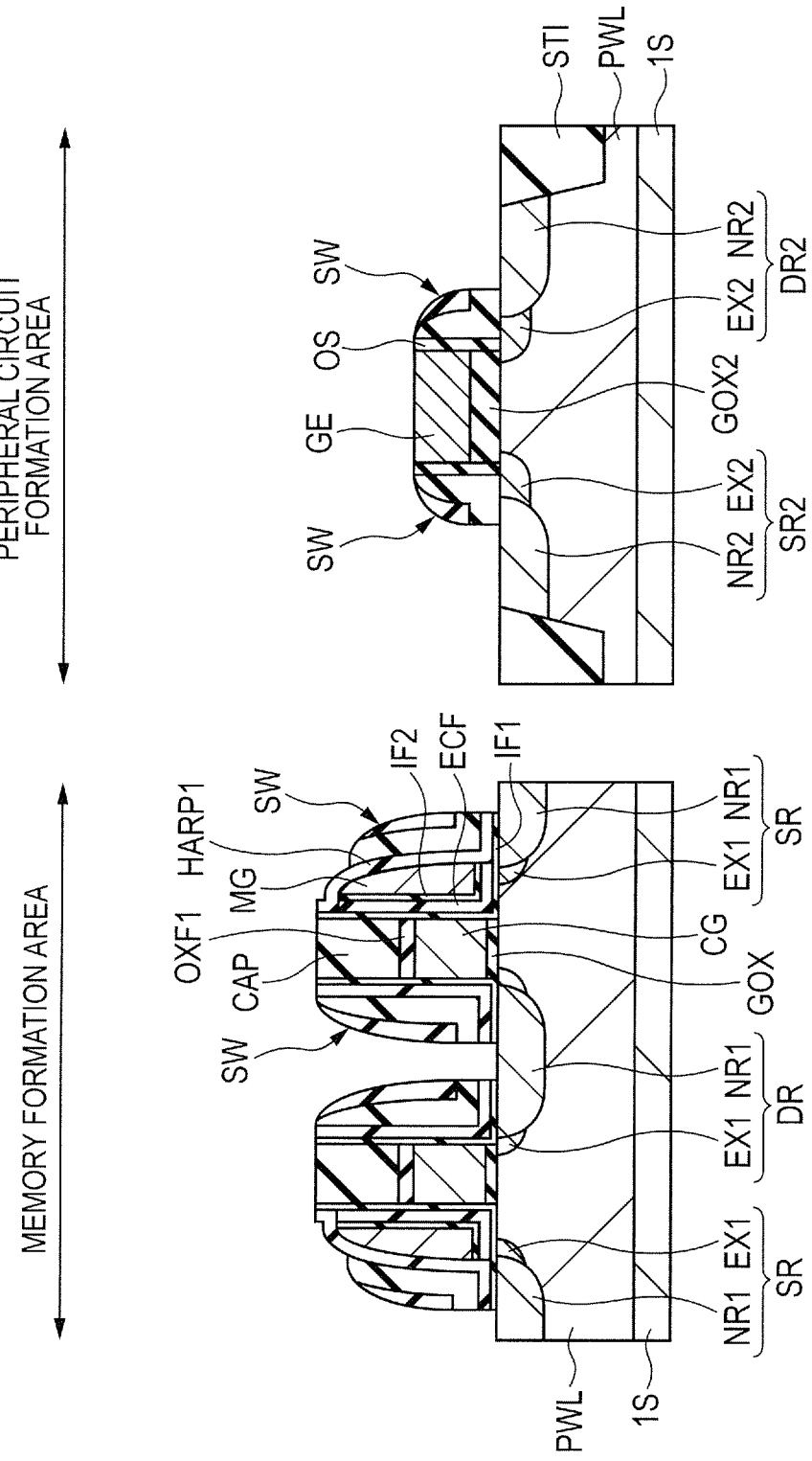
FIG. 17 is a sectional view illustrating a manufacturing step of a semiconductor device following FIG. 16.

Then, the deep high-concentration impurity diffusion region NR1 is formed to be aligned with the sidewall SW in the memory cell formation region by using a photolithography technique and an ion implantation method, as illustrated in FIG. 17. The deep high-concentration impurity diffusion region NR1 is an n-type semiconductor region into which n-type impurities, such as phosphorus or arsenic, have been introduced. The source region SR or the drain region DR of the memory cell is comprised of the deep high-concentration impurity diffusion region NR1 and the shallow low-concentration impurity diffusion region EX1. In this way, the deep high-concentration impurity diffusion region NR1 and the shallow low-concentration impurity diffusion region EX1 form the source region SR and the drain region DR. Accordingly, the source region SR and the drain region DR have an LDD (Lightly Doped Drain) structure.

Also in the peripheral circuit formation region, the deep high-concentration impurity diffusion region NR2 is formed to be aligned with the sidewall SW. The deep high-concentration impurity diffusion region NR2 is an n-type semiconductor region into which n-type impurities, such as phosphorus or arsenic, have been introduced. The source region SR2 or the drain region DR2 of the high-withstand voltage MISFET is comprised of the deep high-concentration impurity diffusion region NR2 and the shallow low-concentration impurity diffusion region EX2. In this way, the shallow low-concentration impurity diffusion region EX2 and the deep high-concentration impurity diffusion region NR2 form the source region SR2 and the drain region DR2. Accordingly, the source region and the drain region have an LDD (Lightly Doped Drain) structure.

Figure 18:
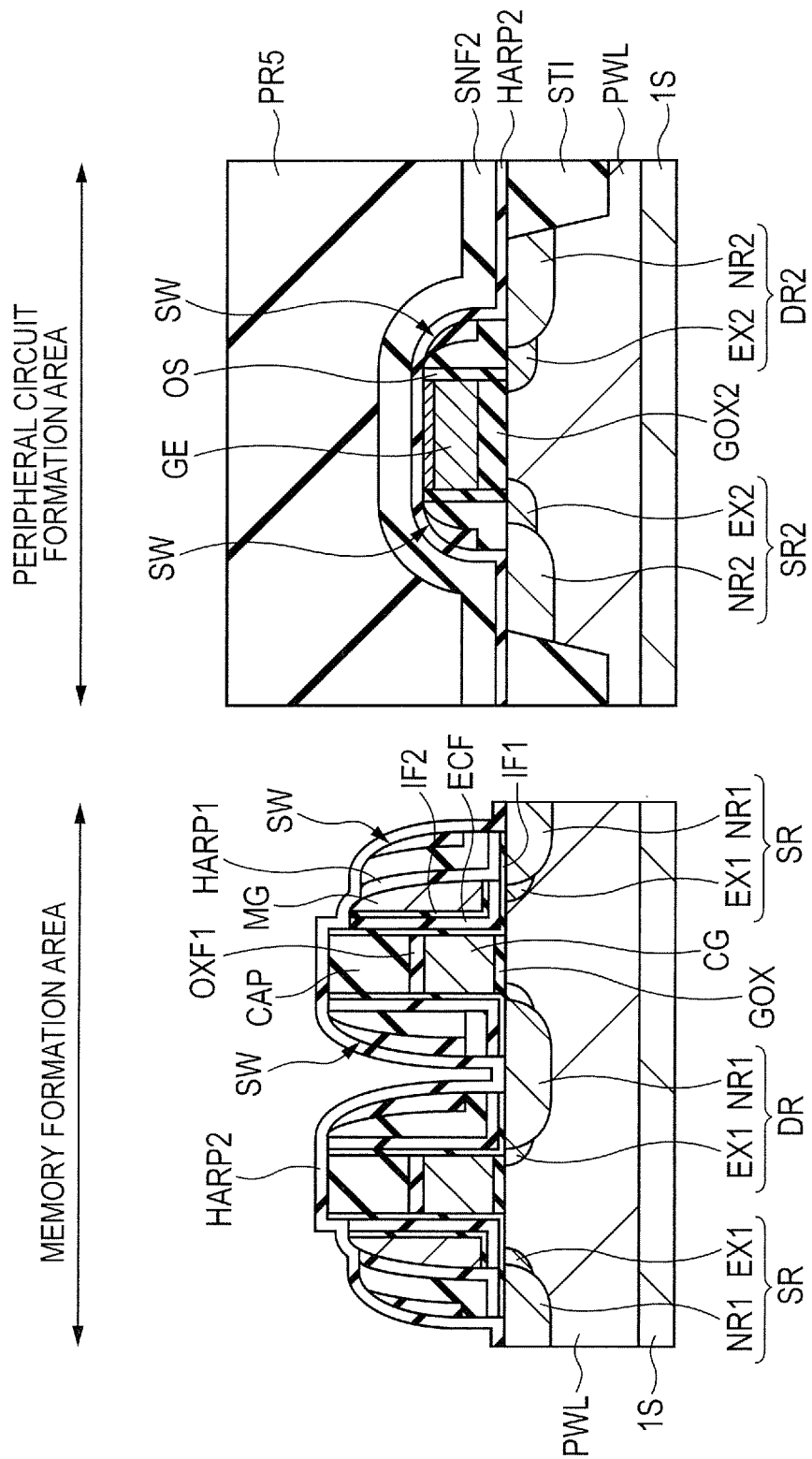
FIG. 18 is a sectional view illustrating a manufacturing step of a semiconductor device following FIG. 17.

Subsequently, a silicon oxide film HARP2 is formed over the semiconductor substrate 1S, and a silicon nitride film SNF2 is formed over the silicon oxide film HARP2, as illustrated in FIG. 18. The silicon nitride film SNF2 is a film functioning as a "Stress Memorization Technique film (SMT film)". Thereafter, the peripheral circuit formation region is covered with a resist film PR5 by using a photolithography technique, and then the silicon nitride film SNF2 formed in the memory formation region is removed by etching. In this case, the silicon oxide film HARP2 formed in the layer below the silicon nitride film SNF2 functions as an etching stopper film. Annealing is performed after the resist film PR5 is removed.

Figure 19:
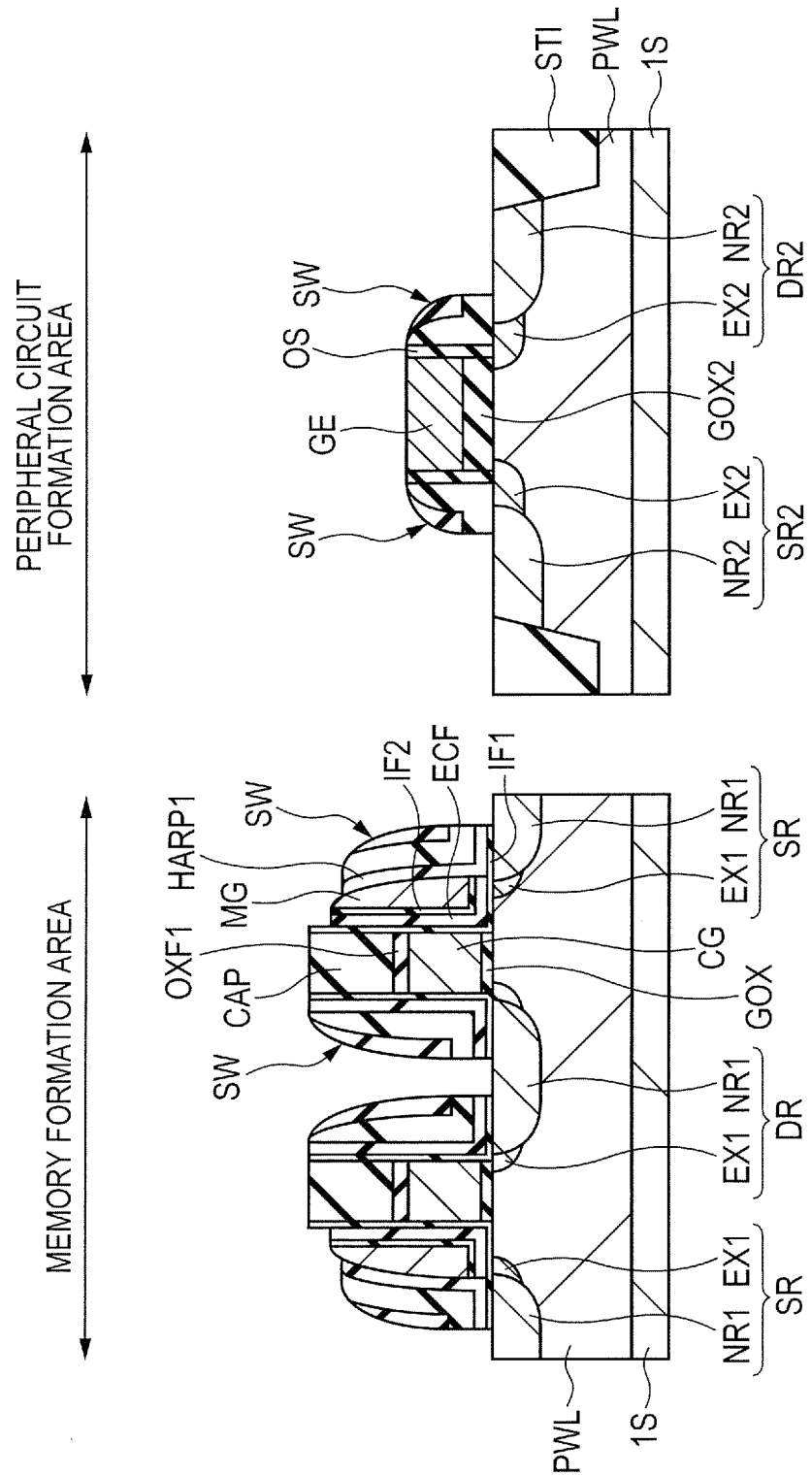
FIG. 19 is a sectional view illustrating a manufacturing step of a semiconductor device following FIG. 18.

Subsequently, after the silicon nitride film SNF2 formed in the peripheral circuit formation region is removed by etching, the silicon oxide film HARP2 formed in the memory formation region and the peripheral circuit formation region is removed by etching, as illustrated in FIG. 19.

Figure 20:
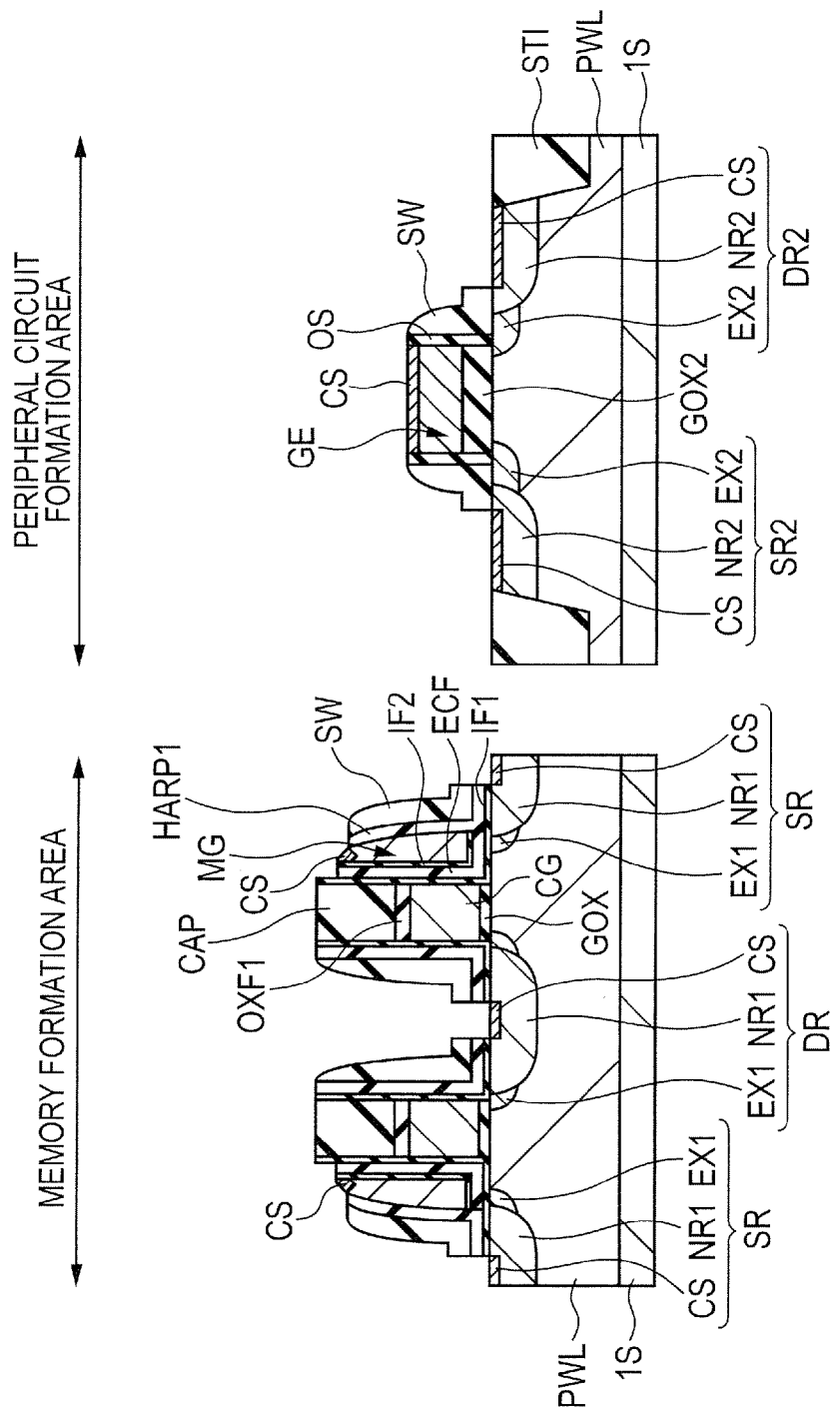
FIG. 20 is a sectional view illustrating a manufacturing step of a semiconductor device following FIG. 19.

Thereafter, a nickel-platinum film (NiPt film) is formed over the semiconductor substrate 1S, and then the silicide film CS including a nickel-platinum silicide film (NiPtSi film) is formed in the memory formation region by performing a heat treatment in order to react together the polysilicon film and the nickel-platinum film that form the memory gate electrode MG, as illustrated in FIG. 20. Thereby, the memory gate electrode MG is caused to have a laminated structure including the polysilicon film and the silicide film CS. Similarly, the silicide film CS is formed over the top surface of the deep high-concentration impurity diffusion region NR1 by reacting silicon with the nickel-platinum film.

Also in the peripheral circuit formation region, the silicide film including a nickel-platinum silicide film is similarly formed over the top surface of the polysilicon film that forms the gate electrode GE. Thereby, the gate electrode GE is comprised of the polysilicon film and the silicide film CS. The silicide film CS including a nickel-platinum silicide film is also formed over the top surface of the deep high-concentration impurity diffusion region NR2 by reacting silicon with the nickel-platinum film.

First Embodiment is configured to form the nickel-platinum silicide film; however, for example, a cobalt silicide film, a nickel silicide film, a titanium silicide film, or a platinum silicide film may be formed instead of the nickel-platinum silicide film.

In the above way, the memory cell that forms the nonvolatile memory can be formed in the memory formation region of the semiconductor substrate 1S, and the high-withstand voltage MISFET can be formed in the peripheral circuit formation region thereof.

Figure 21:
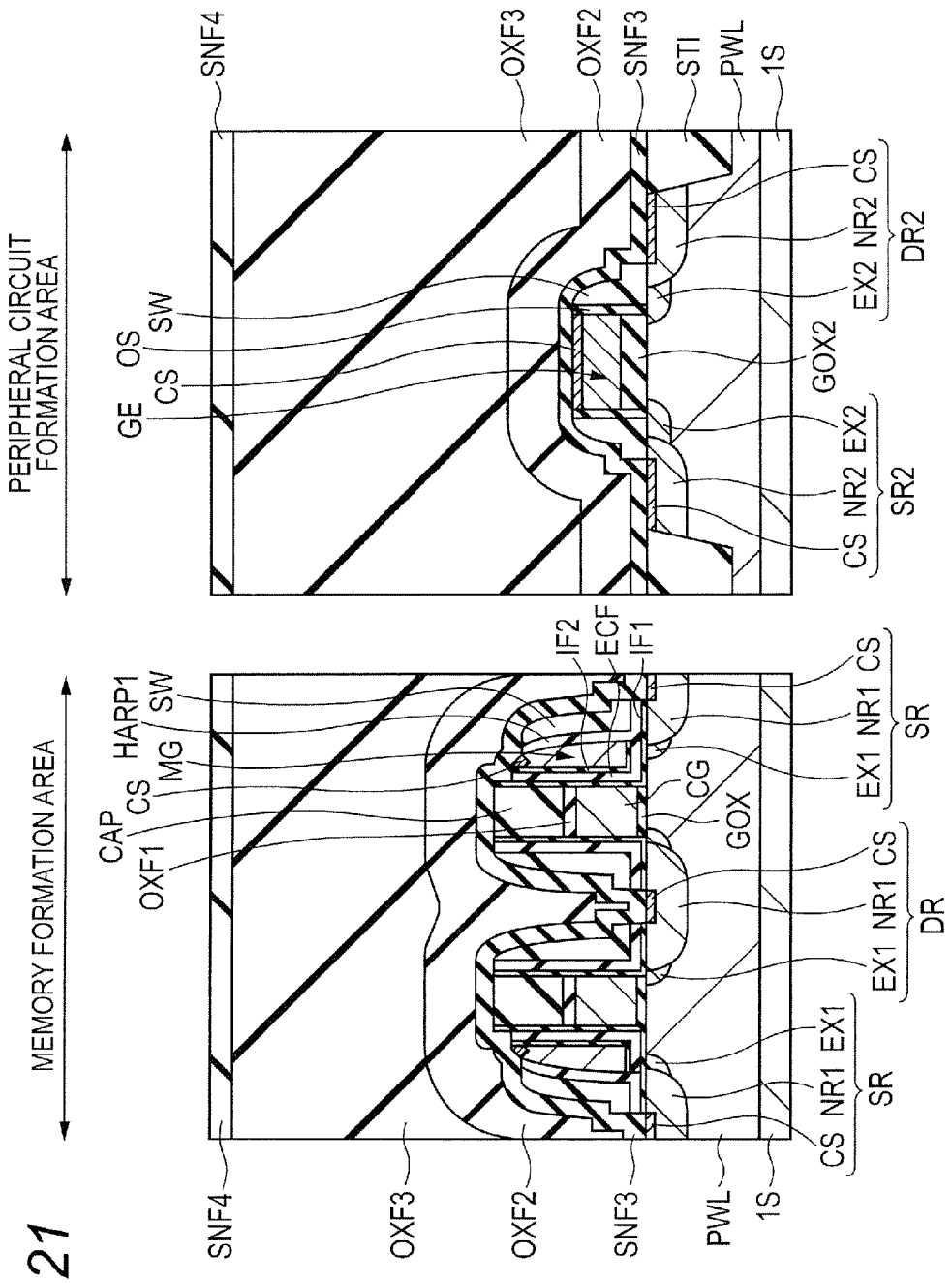
FIG. 21 is a sectional view illustrating a manufacturing step of a semiconductor device following FIG. 20.

Subsequently, wiring steps will be described. As illustrated in FIG. 21, the silicon nitride film SNF3 is formed over the main surface of the semiconductor substrate 1S, the silicon oxide film OXF2 is formed over the silicon nitride film SNF3, and the silicon oxide film. OXF3 is formed over the silicon oxide film OXF2. Thereafter, the top surface of the contact interlayer insulating film is flattened by using, for example, a CMP (Chemical Mechanical Polishing) method. After part of the silicon oxide film OXF3 is etch-backed, a silicon nitride film SNF4 is formed over the silicon oxide film OXF3. Thereby, the contact interlayer insulating film, including the silicon nitride film SNF3, the silicon oxide film OXF2, the silicon oxide film OXF3, and the silicon nitride film SNF4, can be formed.

Figure 22:
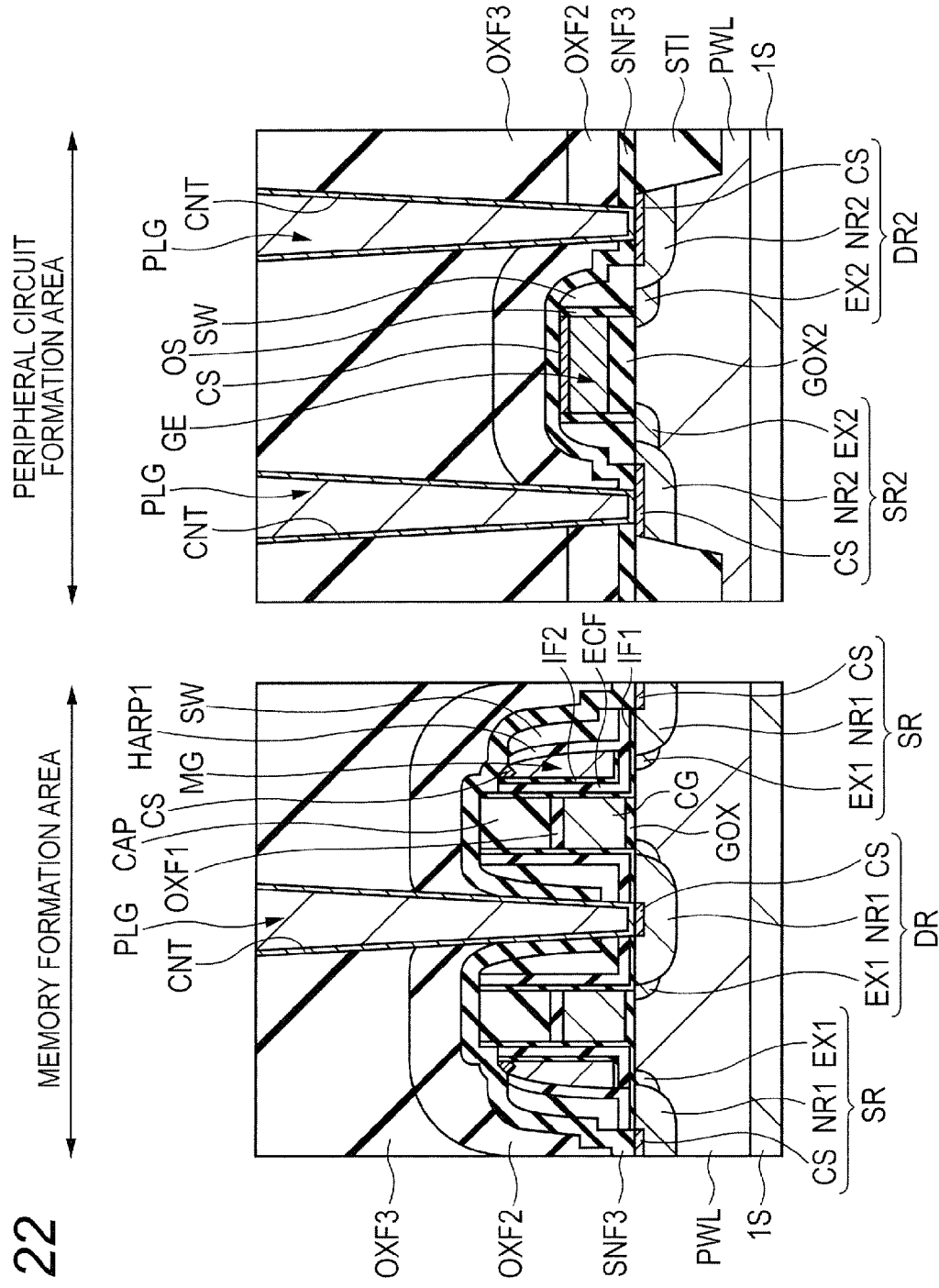
FIG. 22 is a sectional view illustrating a manufacturing step of a semiconductor device following FIG. 21.

Subsequently, the contact hole CNT is formed in the contact interlayer insulating film by using a photolithography technique and an etching technique, as illustrated in FIG. 22. Thereafter, a titanium/titanium nitride film is formed over the contact interlayer insulating film including the bottom surface and the interior wall of the contact hole CNT. The titanium/titanium nitride film is comprised of a laminated film including a titanium film and a titanium nitride film, and can be formed by using, for example, a sputtering method. The titanium/titanium nitride film has a so-called barrier property by which, for example, tungsten that is a material for a film to be embedded in a later step is prevented from diffusing into silicon.

A tungsten film is then formed over the whole main surface of the semiconductor substrate 1S so as to fill the contact hole CNT. This tungsten film can be formed by using, for example, a CVD method. An unnecessary titanium/titanium nitride film and an unnecessary tungsten film, which are formed over the contact interlayer insulating film, are removed by using, for example, a CMP method. The plug PLG can be then formed by performing annealing in a hydrogen atmosphere.

Subsequently, the interlayer insulating film, including the silicon oxide film OXF4 and the SiOC film SCF1 formed over the silicon oxide film OXF4, is formed over the contact interlayer insulating film in which the plug PLG is formed, as illustrated in FIG. 4. The wiring trench DIT1 is then formed in the interlayer insulating film by using a photolithography technique and an etching technique. Thereafter, a tantalum/tantalum nitride film is formed over the interlayer insulating film including the inside of the wiring trench DIT1. The tantalum/tantalum nitride film can be formed by using, for example, a sputtering method. Subsequently, a seed film including a thin copper film is formed over the tantalum/tantalum nitride film by using, for example, a sputtering method, and a copper film is then formed over the interlayer insulating film in which the wiring trench DIT1 is formed, by an electrolytic plating method using the seed film as an electrode. Thereafter, the copper film is caused to remain only in the wiring trench DIT1 formed in the interlayer insulating film, by polishing and removing the copper film exposed over the interlayer insulating film other than the inside of the wiring trench DIT1 with the use, for example, of a CMP method. Thereby, the wiring L1 can be formed. Wiring is further formed over the wiring 1, but herein the description thereof will be omitted. Thus, the semiconductor device in First Embodiment can be finally formed.

An example in which the wiring 1 including a copper film is formed has been described in First Embodiment, but wiring 1 including, for example, an aluminum film may be formed. In this case, a titanium/titanium nitride film, an aluminum film, and a titanium/titanium nitride film are sequentially formed over the interlayer insulating film and the plug PLG. These films can be formed by using, for example, a sputtering method. Subsequently, the wiring 1 is formed by patterning these films with the use of a photolithography technique and an etching technique. Thereby, the wiring L1 including an aluminum film can be formed.

<Characteristics in First Embodiment>

Subsequently, characteristic points in First Embodiment will be described. The characteristic points in First Embodiment relate to a manufacturing method of a semiconductor device. Specifically, in the manufacturing steps of a semiconductor device in First Embodiment, after the memory gate electrode MG is formed, the insulating film IF2 exposed from this memory gate electrode MG is removed by etching, and the charge storage film ECF exposed from the memory gate electrode MG is then removed, as illustrated, for example, in FIG. 9. In this case, the end surface (lateral side surface) of the insulating film IF2 is exposed, and the end surface (lateral side surface) of the charge storage film ECF is also exposed. The insulating film IF1 is exposed from the memory gate electrode MG after the above steps are performed, as illustrated, for example, in FIG. 10. Herein, the first characteristic point in First Embodiment is that, in a state where the end surface of the insulating film IF2 is exposed, the insulating film IF1 exposed from the memory gate electrode MG is not etched. In other words, the first characteristic point in First Embodiment is that, in a state where the end surface of the insulating film IF2 is exposed, the insulating film IF1 exposed from the memory gate electrode MG is caused to remain without being etched and the subsequent steps will be performed.

Thereby, side etching can be prevented from being created in the end surface of the insulating film IF2, which may result from the etching of the insulating film IF1, according to the first characteristic point in First Embodiment. As a result, a decrease in the withstand voltage between the memory gate electrode MG and the source region SR, which may result from the side etching of the end surface of the insulating film IF2, can be controlled according to First Embodiment. From this, a semiconductor device having high reliability can be provided according to the manufacturing method of a semiconductor device including the first characteristic point in First Embodiment.

Subsequently, a second characteristic point in First Embodiment is that, after the insulating film IF2 exposed from the memory gate electrode MG is removed by etching, a step in which the protective insulating film covering at least the exposed end surface of the insulating film IF2 is formed is performed.

Thereby, the end surface of the insulating film IF2 is covered with the protective insulating film, and hence the side etching in the end surface of the insulating film IF2 can be prevented according to First Embodiment. As a result, a decrease in the withstand voltage between the memory gate electrode MG and the source region SR, which may result from the side etching in the end surface of the insulating film IF2, can be controlled, and hence a semiconductor device having high reliability can be provided according to First Embodiment, A specific example of the second characteristic point in First Embodiment includes the fact that the silicon oxide film HARP1 is formed as the protective insulating film covering at least the exposed end surface of the insulating film IF2, as illustrated, for example, in FIG. 12.

In this case, because the end surface of the insulating film IF2 is covered with the silicon oxide film HARP1, the side etching in the end surface of the insulating film IF2 can be prevented.

As described above, the manufacturing method according to First Embodiment has: the first characteristic point that, in a state where the end surface of the insulating film IF2 is exposed, the insulating film IF1 exposed from the memory gate electrode MG is not etched; and the second characteristic point that, after the insulating film IF2 exposed from the memory gate electrode MG is removed by etching, the protective insulating film covering at least the exposed end surface of the insulating film IF2 is formed. The first characteristic point and the second characteristic point in the manufacturing method become obvious in the configuration of a semiconductor device that is a final product.

In the manufacturing method of a semiconductor device in First Embodiment, the insulating film IF1 exposed from the memory gate electrode MG is not etched in a state where the end surface of the insulating film IF2 is exposed, and hence, even in the stage of forming the sidewall spacer SW illustrated in FIG. 16, the insulating film IF1 remains in the layer below the sidewall spacer SW, as illustrated, for example, in FIG. 10. As a result, the insulating film IF1 extends from the layer below the charge storage film ECF to the layer below the sidewall spacer SW in the semiconductor device in First Embodiment, as illustrated in FIG. 4. That is, the first characteristic point in First Embodiment becomes obvious as the configuration in which the insulating film IF1 extends from the layer below the charge storage film ECF to the layer below the sidewall spacer SW.

Further, in the manufacturing method of a semiconductor device in First Embodiment, after the insulating film IF2 exposed from the memory gate electrode MG is removed by etching, the silicon oxide film HARP1 covering at least the exposed end surface of the insulating film IF2 is formed, as illustrated, for example, in FIG. 12. Accordingly, in the stage where the sidewall spacer SW illustrated in FIG. 16 is formed, the silicon oxide film HARP1 is formed between the memory gate electrode MG and the sidewall spacer SW and between the sidewall spacer SW and the insulating film IF1. That is, the second characteristic point in First Embodiment becomes obvious as the configuration in which the silicon oxide film HARP1 is formed between the memory gate electrode MG and the sidewall spacer SW and between the sidewall spacer SW and the insulating film IF1.

Furthermore, the side etching in the end surface of the insulating film IF2 can be prevented by the aforementioned first characteristic point and second characteristic point, according to First Embodiment. As a result, the end surface of the insulating film IF2 never retreats, and the result of preventing the side etching in the end surface of the insulating film IF2, which is achieved by the first characteristic point and the second characteristic point, becomes obvious as the configuration in which one end surface of the insulating film IF2 and that of the charge storage film ECF are flush with each other.

Second Embodiment

Subsequently, technical ideas in Second Embodiment will be described. Hereinafter, the room for improvement, on which attention is focused in Second Embodiment, will be first described, and then technical ideas in Second Embodiment will be described.

<Room for Improvement>

FIG. 2 is a plan view schematically illustrating an example of the planar layout configuration of the non-volatile memory in First Embodiment. In FIG. 2, the element isolation region STI arranged in the semiconductor substrate so as to extend in the X direction, while the memory gate electrode MG is arranged in the semiconductor substrate so as to extend in the Y direction. Accordingly, the element isolation region STI and the memory gate electrode MG cross each other, and of the element isolation region STI, the region of a portion that crosses the memory gate electrode MG is referred to as a crossing region R1, and the region of a portion that protrudes from the crossing region R1 toward the source region SR is referred to as a termination region R2. In this case, the termination region R2 is in contact with the memory gate electrode MG and the source region SR in plan view.

The shrinkage (miniaturization) of semiconductor chips is desired in the semiconductor field, but in the planar layout configuration illustrated in FIG. 2, the space between adjacent element isolation regions STI needs to be larger than a certain space, from the viewpoint that a semiconductor device is optimized to exhibit its performance. Accordingly, when a semiconductor chip is to be shrunk while the space between adjacent element isolation regions STI is being secured, the termination region R2 illustrated in FIG. 2 necessarily becomes small.

In designing the layout of a semiconductor chip, the planar shape of the element isolation region STI is usually designed to be rectangular; however, in actually forming the element isolation region STI, a photolithography technique (patterning technique) is used. In this case, the planar shape thereof becomes different from an ideal rectangular shape. That is, the termination region R2 of the element isolation region STI becomes a tapered round shape, as illustrated in FIG. 2. The present inventors have discovered that, in an actual semiconductor chip (semiconductor device) in which the termination region R2 of the element isolation region STI has a tapered round shape, the withstand voltage between the memory gate electrode MG and the source region SR is decreased when a semiconductor chip is miniaturized. Specifically, the present inventors have discovered that the withstand voltage between the memory gate electrode MG and the source region SR is decreased at the position P1 illustrated in FIG. 2 where the memory gate electrode MG and the element isolation region STI intersect with each other. Thus, when an actual semiconductor device, in which the termination region R2 of the element isolation region STI has a tapered round shape, is to be miniaturized, there is room for improvement, from the viewpoint that the withstand voltage between the memory gate electrode MG and the source region SR should be secured.

Figure 23:
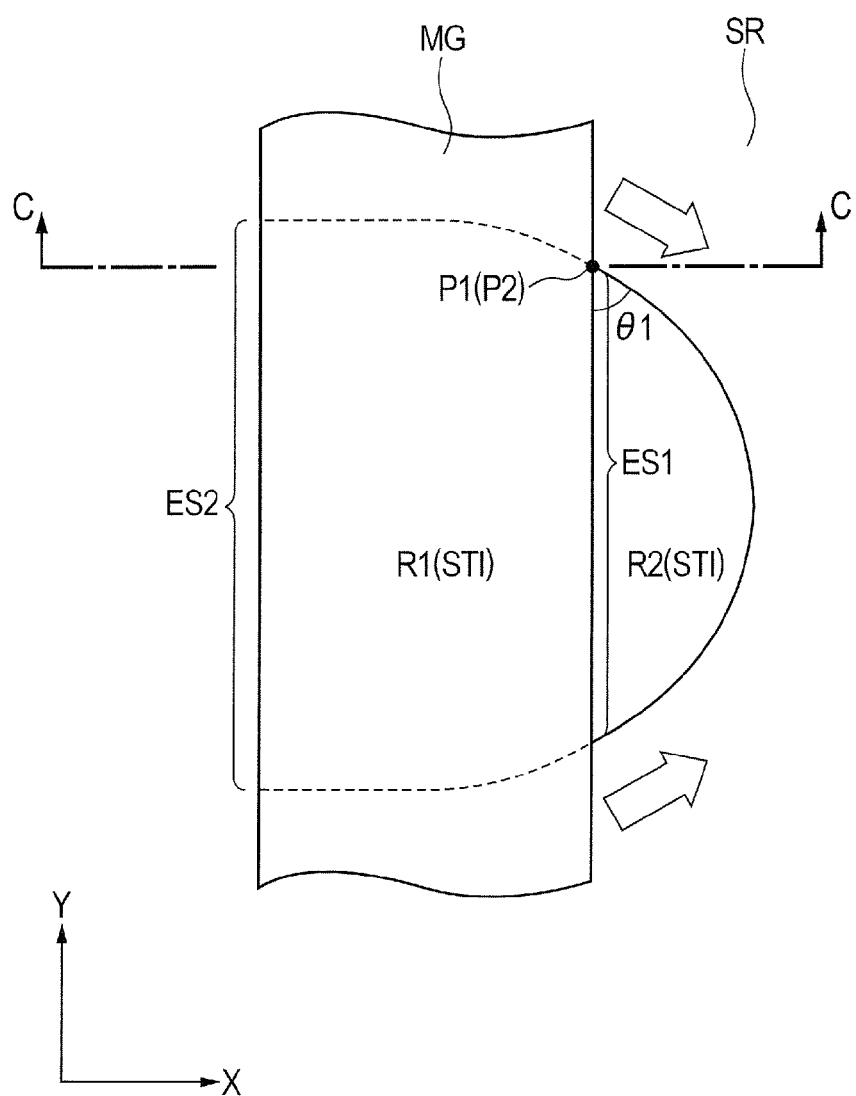
FIG. 23 is a view in which a partial region of FIG. 2 is enlarged.

Hereinafter, the details of the room for improvement will be described. FIG. 23 is a view in which a near-field region of the position P1 in FIG. 2 is enlarged. It is known from FIG. 23 that the element isolation region STI has the crossing region R1 and the termination region R2 and has a round shape ranging from the crossing region R1 to the termination region R2. In the crossing region R1 in FIG. 23, the width ES2 in the Y direction of an edge side of the memory gate electrode MG, the edge side being near to the control gate electrode, is particularly larger than the width ES1 in the Y direction of an edge side of the memory gate electrode MG, the edge side being near to the source region SR. In other words, the width ES1 in the Y direction of an edge side of the memory gate electrode MG, the edge side being near to the source region SR, is smaller than the width ES2 in the Y direction of an edge side of the memory gate electrode MG, the edge side being near to the control gate electrode. From this, the round shape ranging from the crossing region R1 to the termination region R2 is tapered. In the present specification, this shape is referred to as a "tapered round shape". That is, the "tapered round shape" is defined as a round shape in which, in the crossing region R1, the width ES1 in the Y direction of an edge side of the memory gate electrode MG, the edge side being near to the source region SR, is smaller than the width ES2 in the Y direction of an edge side of the memory gate electrode MG, the edge side being near to the control gate electrode.

Figure 24:
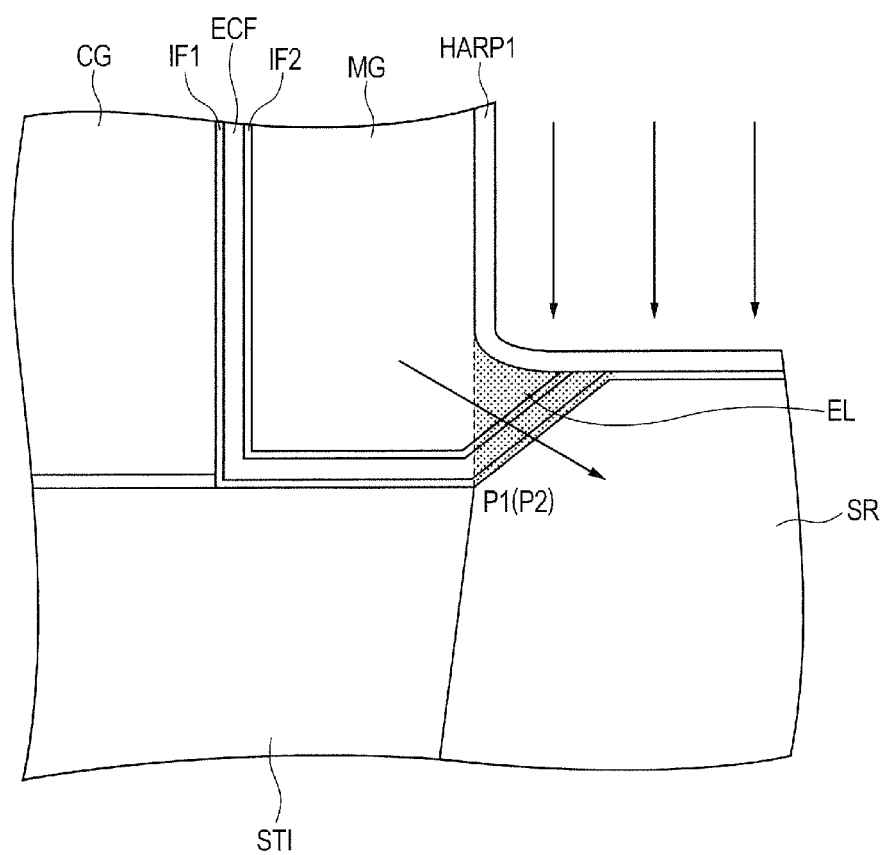
FIG. 24 is a sectional view, taken along C-C Line in FIG. 23.

Herein, attention is focused on the position P1 illustrated in FIG. 23. FIG. 24 is a schematic sectional view, taken along C-C Line passing through the position P1. As illustrated in FIG. 24, a stepped portion is created in the boundary region between the element isolation region STI and the source region SR (active region). It is known that, at the position P1, an etching residue EL is formed when the memory gate electrode MG is etched. As a result, the laminated insulating film (ONO film including the insulating film IF1, the charge storage film ECF, and the insulating film IF2) is caused to remain in the layer below the etching residue EL. If the ion implantation for forming the source region SR is performed in this state, ions are also implanted into the etching residue EL, thereby allowing the laminated insulating film in the layer below the etching residue EL to be damaged. As a result, the withstand voltage between the memory gate electrode MG and the source region SR is decreased due to the interposition of the damaged laminated insulating film. That is, the decrease in the withstand voltage between the memory gate electrode MG and the source region SR is caused because the etching residue EL is formed near the position P1. Accordingly, in order to control a decrease in the withstand voltage between the memory gate electrode MG and the source region SR, the etching residue EL should not be formed near the position P1, when the memory gate electrode MG is etched.

As a result of intensive study by the present inventors, it has been discovered that a main cause, for which the etching residue EL is formed near the position P1, is the "tapered round shape" of the termination region R2. In detail, when the termination region R2 has the "tapered round shape" as illustrated in FIG. 23, it can be considered that: the angle θ1 between the memory gate electrode MG and the element isolation region STI at the position P1 becomes small (acute), and hence the polysilicon film is not fully etched at the position P1, thereby causing the etching residue EL to be formed. In particular, it can be considered that the polysilicon film is not fully etched due to a synergistic factor including: the stepped portion is created near the position P1 (first factor); and the angle θ1 between the memory gate electrode MG and the element isolation region STI is small in the stepped portion (second factor).

On the premise of the above description, a device is made in Second Embodiment, in which an etching residue, for which the withstand voltage between the memory gate electrode MG and the source region SR is decreased, is hardly formed. Hereinafter, technical ideas in Second Embodiment in which the device has been made will be described.

<Device Structure of Semiconductor Device (Characteristics of Second Embodiment)>

Figure 25:
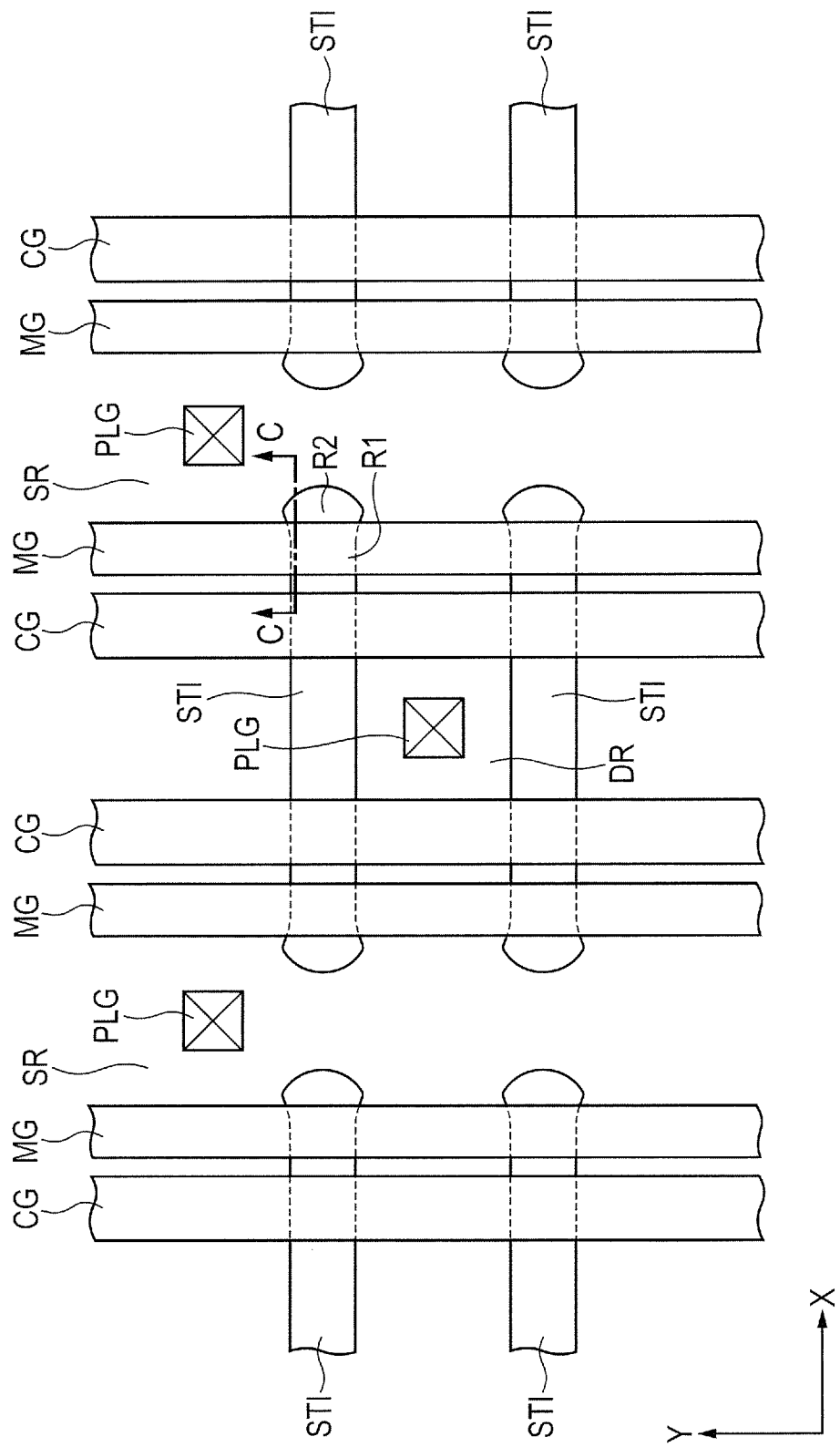
FIG. 25 is a plan view schematically illustrating an example of a planar layout configuration of a non-volatile memory in Second Embodiment.

FIG. 25 is a plan view schematically illustrating an example of the planar layout configuration of a non-volatile memory in Second Embodiment. The planar layout configuration illustrated in FIG. 25 is almost the same as that in First Embodiment illustrated in FIG. 2, and different characteristic points will be described.

When expressed in an understandable way with reference to FIG. 25, a characteristic point in Second Embodiment is that the element isolation region STI has a "hammer head shape". That is, the characteristic point in Second Embodiment is that the shape ranging from the crossing region R1 to the termination region R2 of the element isolation region STI is a "broad round shape".

Figure 26:
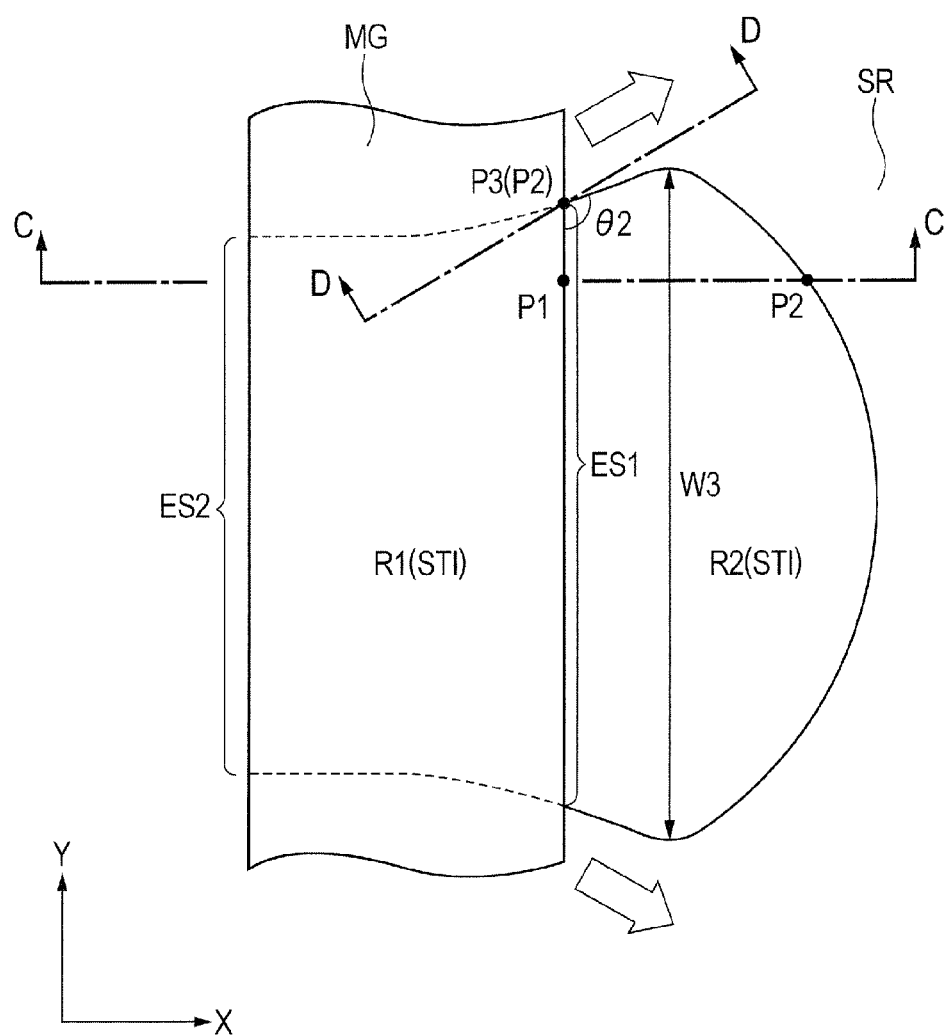
FIG. 26 is a view in which a partial region of FIG. 25 is enlarged.

This point will be described with reference to FIG. 26. FIG. 26 is a view in which a partial region of FIG. 25 is enlarged. It is known from FIG. 26 that the element isolation region STI has the crossing region R1 and the termination region R2 and has a round shape ranging from the crossing region R1 to the termination region R2. In the crossing region R1 in FIG. 26, the width ES2 in the Y direction of an edge side of the memory gate electrode MG, the edge side being near to the control gate electrode, is smaller than the width ES1 in the Y direction of an edge side of the memory gate electrode MG, the edge side being near to the source region SR. In other words, the width ES1 in the Y direction of an edge side of the memory gate electrode MG, the edge side being near to the source region SR, is larger than the width ES2 in the Y direction of an edge side of the memory gate electrode MG, the edge side being near to the control gate electrode. From this, the round shape ranging from the crossing region R1 to the termination region R2 is broad. In the present specification, this shape is referred to as a "broad round shape". That is, the "broad round shape" is defined as a round shape in which, in the crossing region R1, the width ES1 in the Y direction of an edge side of the memory gate electrode MG, the edge side being near to the source region SR, is larger than the width ES2 in the Y direction of an edge side of the memory gate electrode MG, the edge side being near to the control gate electrode. In more detail, of the widths oriented in the Y direction of the termination region R2, the largest width W3 is larger than the width ES1 in the "broad round shape" in Second Embodiment, as illustrated in FIG. 26.

Herein, attention is first focused on the position P1 illustrated in FIG. 26 also in Second Embodiment. The position P1 illustrated in FIG. 26 corresponds to the position P1 illustrated in FIG. 23. That is, the positions P1 illustrated in FIGS. 26 and 23 indicate the same position.

In Second Embodiment, however, the position P1 is not the intersection between the memory gate electrode MG and the element isolation region STI. That is, the intersection between the memory gate electrode MG and the element isolation region STI is the position P3, not the position P1, because the element isolation region STI has the "broad round shape" in Second Embodiment.

In First Embodiment, the position P1, the intersection between the memory gate electrode MG and the element isolation region STI, matches the position P2 indicating the position of the stepped portion formed between the element isolation region STI and the source region SR, because the element isolation region STI has the "tapered round shape". On the other hand, in Second Embodiment, the position P1, the intersection between the memory gate electrode MG and the element isolation region STI, is spaced apart from the position P2 indicating the position of the stepped portion formed between the element isolation region STI and the source region SR, because the element isolation region STI has the "broad round shape", as illustrated in FIG. 26. In Second Embodiment, the intersection between the memory gate electrode MG and the element isolation region STI is the position P3, not the position P1, and the position P3 matches the position P2 indicating the position of the stepped portion formed between the element isolation region STI and the source region SR.

Figure 27:
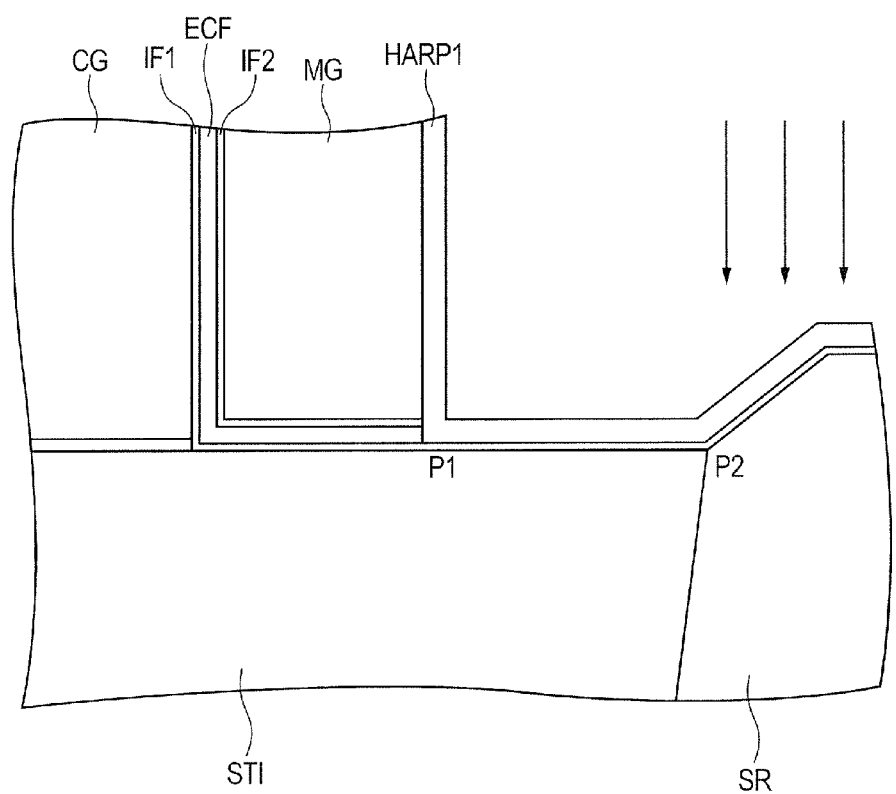
FIG. 27 is a sectional view, taken along C-C Line in FIG. 26.

Subsequently, FIG. 27 is a schematic sectional view, taken along C-C Line passing through the positions P1 and P2 illustrated in FIG. 26. In the "broad round shape" in Second Embodiment, the position P1 is arranged over the flat element isolation region STI, and is spaced apart from the position P2 corresponding to the stepped portion formed in the boundary region between the element isolation region STI and the source region SR, as illustrated in FIG. 27. As a result, an influence (first factor) of the stepped portion on the etching process of the memory gate electrode MG, which may result from the fact that the positions P1 and P2 match each other, is solved at the position P1. Accordingly, the polysilicon film is fully etched at the position P1, thereby allowing the formation of an etching residue to be controlled.

Furthermore, even if an etching residue is formed, a damage by the ion implantation on the laminated insulating film formed below the etching residue can be controlled because the position P1 is away from the region into which ions are implanted.

The effect of reducing a leak current flowing between the memory gate electrode MG and the source region SR simply becomes higher, as the distance between the memory gate electrode MG and the source region SR (distance between the position P1 and the position P2) becomes larger. As a result, the withstand voltage between the memory gate electrode MG and the source region SR can be improved.

In Second Embodiment, the first factor at the position P1 is solved by changing the shape of the termination region R2 of the element isolation region STI from the "tapered round shape" to the "broad round shape", and thereby the formation of an etching residue in the edge side of the memory gate electrode MG can be effectively controlled.

Figure 28:
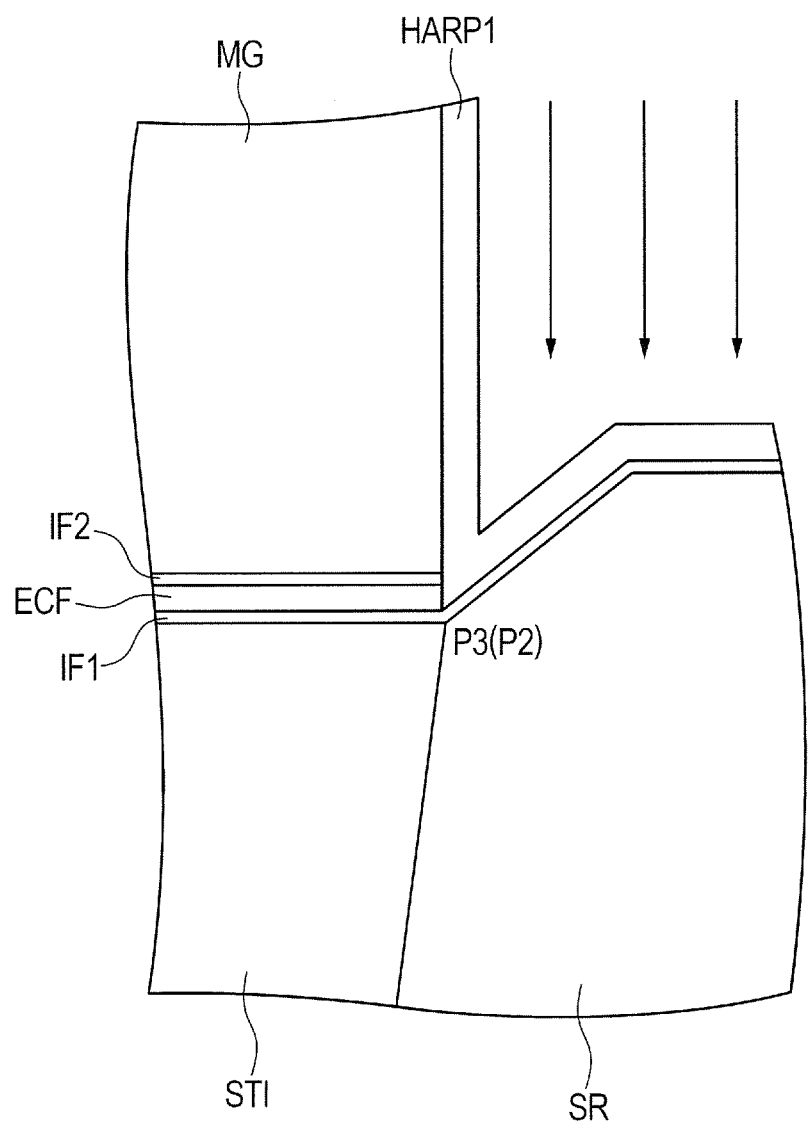
FIG. 28 is a sectional view, taken along D-D Line in FIG. 26.

Subsequently, FIG. 28 is a schematic sectional view, taken along D-D Line passing through the position P3 illustrated in FIG. 26. In the "broad round shape" in Second Embodiment, the position P3, at which the memory gate electrode MG and the element isolation region STI cross each other, matches the position P2 of the stepped portion formed in the boundary region between element isolation region STI and the source region SR, as illustrated in FIG. 28.

In Second Embodiment, however, the element isolation region STI has the "broad round shape", as illustrated in FIG. 26. Due to this, the angle θ2 between the memory gate electrode MG and the element isolation region STI at the position P3 becomes large (obtuse) as illustrated in FIG. 26, and hence the polysilicon film is fully etched at the position P3, thereby allowing the etching residue EL to be hardly formed. Namely, the fact that the angle θ2 between the memory gate electrode MG and the element isolation region STI becomes large at the position P3 qualitatively means that an etchant is likely to enter this region, which means that the polysilicon film is fully etched. That is, the second factor, in which the angle θ1 between the memory gate electrode MG and the element isolation region STI is small, can be solved in Second Embodiment by causing the termination region R2 of the element isolation region STI to have the "broad round shape", even if the position P3 matches the position P2 indicating the stepped portion, and hence the formation of an etching residue in the edge side of the memory gate electrode MG can be effectively controlled.

From the above description, by changing the shape of the termination region R2 of the element isolation region STI from the "tapered round shape" to the "broad round shape", the first factor is solved at the position P1 and the second factor is solved at the position P3, according to Second Embodiment, and as a result of that, the formation of an etching residue in the edge side of the memory gate electrode MG can be effectively controlled. Thereby, a decrease in the withstand voltage between the memory gate electrode MG and the source region SR can be controlled according to the Second Embodiment, thereby allowing the reliability of a semiconductor device to be improved.

According to Second Embodiment, both the miniaturization of a semiconductor device and an improvement in the reliability thereof can be particularly achieved as a result that the shape of the termination region R2 of the element isolation region STI is changed from the "tapered round shape" to the "broad round shape", even when the shape of the termination region R2 may greatly influence the reliability of a semiconductor device due to the miniaturization of the semiconductor device.

<Manufacturing Method of Semiconductor Device>

Subsequently, a manufacturing method of a semiconductor device in Second Embodiment will be described with reference to the drawings. The manufacturing method of a semiconductor device in Second Embodiment will be first described from a planar viewpoint with reference to FIGS. 29 to 32.

Figure 29:
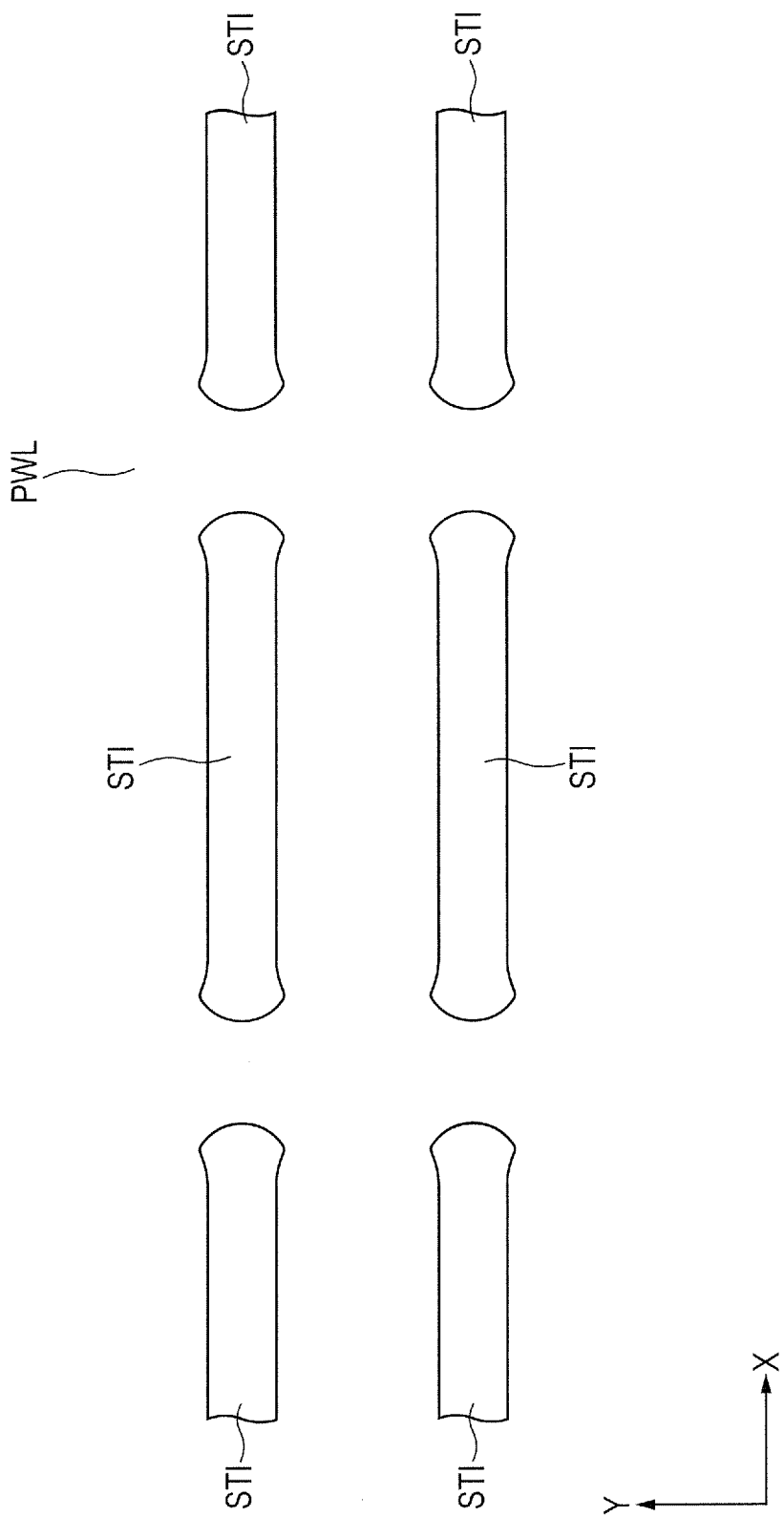
FIG. 29 is a plan view illustrating a manufacturing step of a semiconductor device in Second Embodiment.

As illustrated in FIG. 29, a plurality of element isolation regions STI, each arranged in a semiconductor substrate so as to extend in the X direction, are formed by using, for example, an STI method including a photolithography technique. In this case, the element isolation region STI is formed such that the termination region has the "broad round shape" ("hammer head shape"), as illustrated in FIG. 29.

Specifically, the element isolation region STI, having a shape in which the width ES1 in the Y direction of an edge side of the memory gate electrode MG, the edge side being near to the source region SR, is larger than the width ES2 in the Y direction of an edge side of the memory gate electrode MG, the edge side being near to the control gate electrode, is formed in the stage where a semiconductor device is manufactured (see FIG. 26). Further, the element isolation region STI, having a shape in which, of the widths oriented in the Y direction of the termination region R2, the largest width W3 is larger than the width ES1, is formed (see FIG. 26).

Herein, the element isolation region STI having such a shape can be formed by performing, for example, OPC (Optical Proximity Correction) on a mask to be used for the formation of the element isolation region STI.

In this case, it is not necessary to redesign the planar layout of the semiconductor device from scratch, because it is sufficient to add, to the mask to be used when the device is actually manufactured, a modification for adopting the OPC, without changing the planar layout design of the semiconductor device. That is, the planar layout is designed from the viewpoint of optimizing the size and performance of a semiconductor device, and hence a change in the planar layout design, which is performed following a change in the shape of the element isolation region STI, needs great efforts.

With respect to this point, great efforts are not needed in Second Embodiment, because it is sufficient to add, to the mask to be used when the semiconductor device is actually manufactured, a modification for adopting the OPC, without changing the planar layout design of the device. From this, advantages can be obtained according to the manufacturing method of a semiconductor device in Second Embodiment, in which the reliability of a semiconductor device can be improved while an increase in the manufacturing cost of the device is suppressed.

Figure 30:
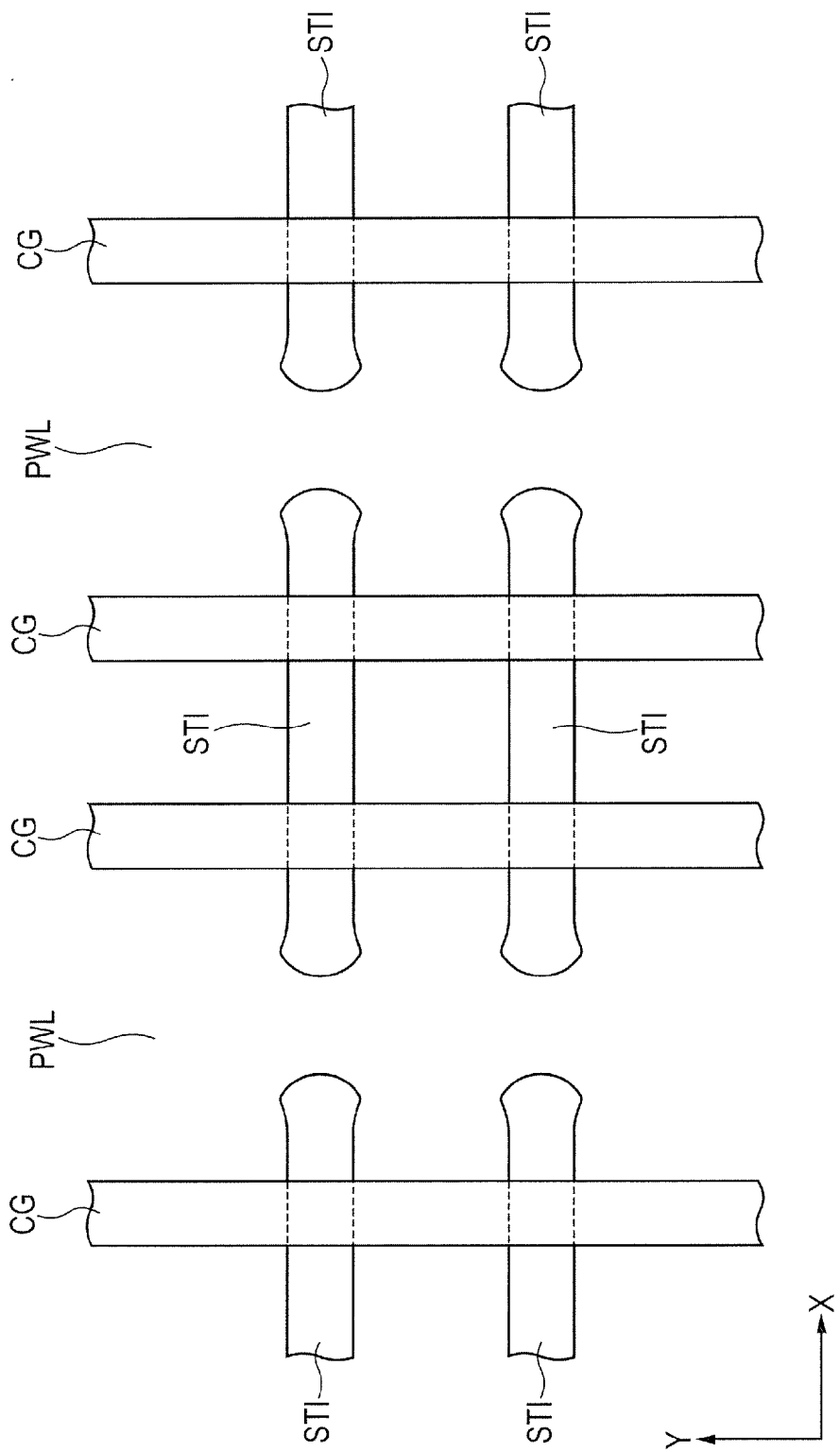
FIG. 30 is a plan view illustrating a manufacturing step of a semiconductor device following FIG. 29.
Figure 31:
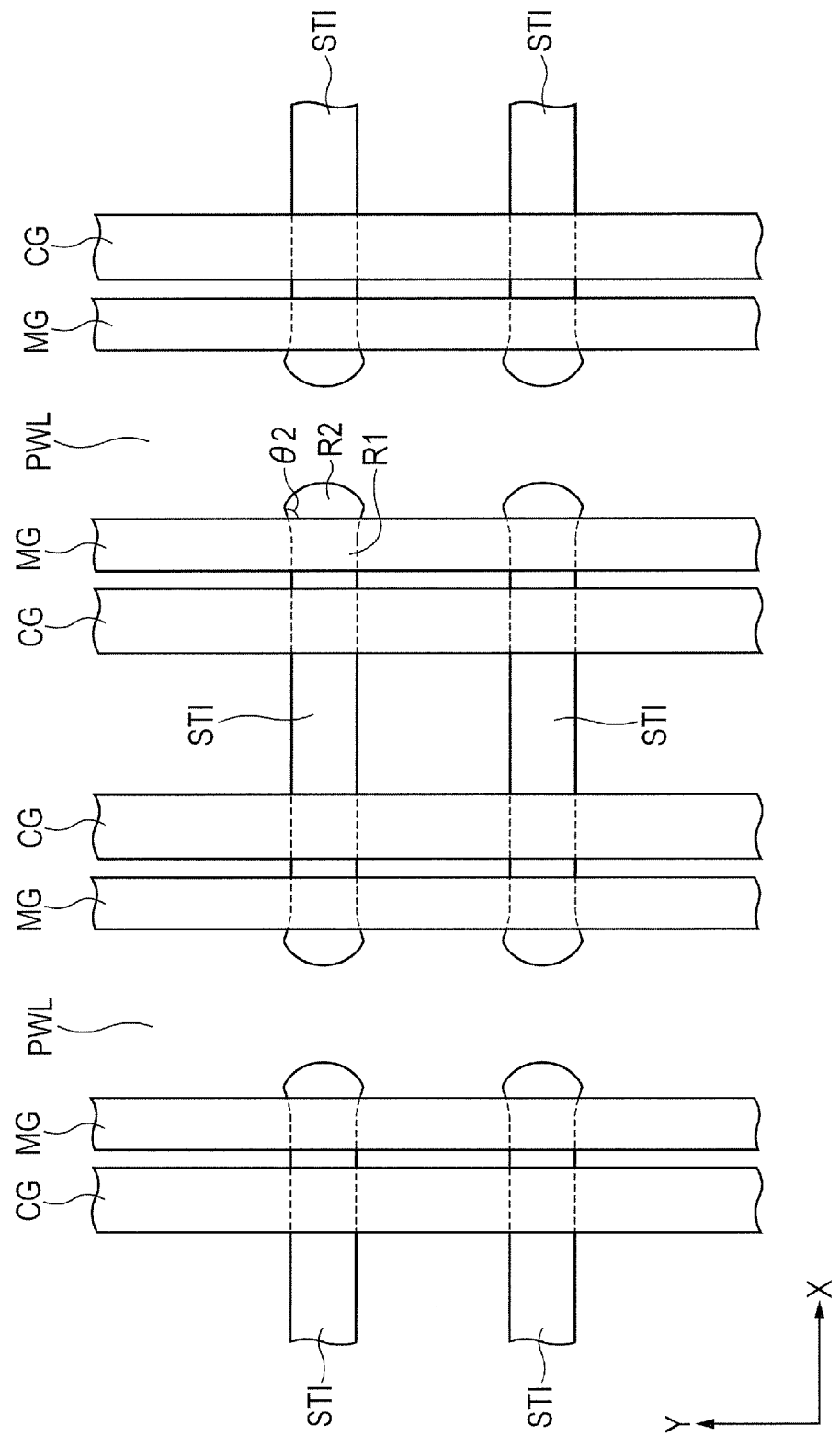
FIG. 31 is a plan view illustrating a manufacturing step of a semiconductor device following FIG. 30.
Figure 32:
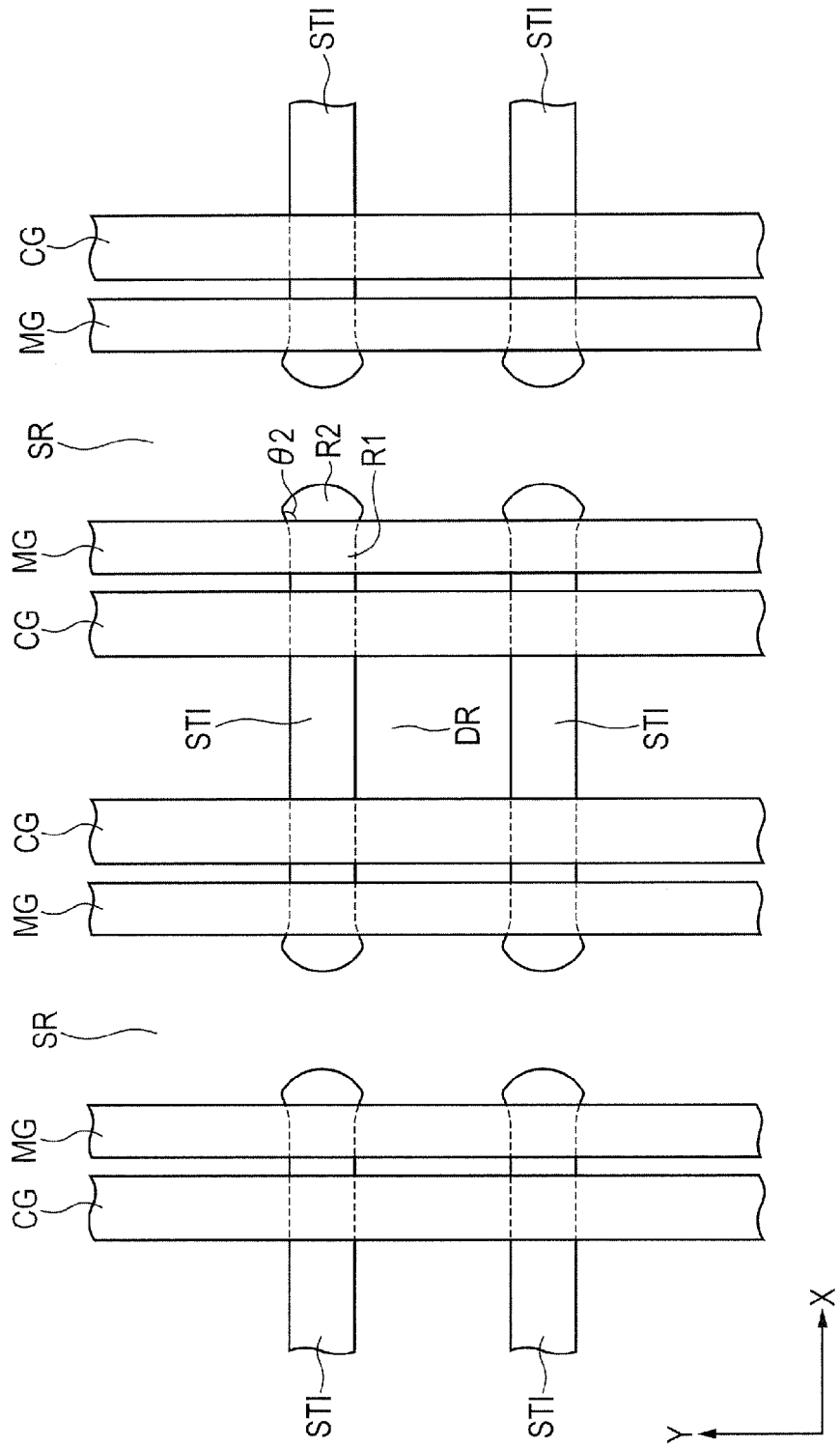
FIG. 32 is a plan view illustrating a manufacturing step of a semiconductor device following FIG. 31.

Subsequently, the control gate electrodes CG, each arranged over the semiconductor substrate so as to extend in the Y direction that intersects with the X direction at right angles, are formed, as illustrated in FIG. 30. Thereafter, the memory gate electrodes MG, each arranged over the semiconductor device so as to extend in the Y direction to be parallel to the control gate electrode CG, are formed, as illustrated in FIG. 31. Thereby, the element isolation region STI has: the crossing region R1 that crosses the memory gate electrode MG in plan view; and the termination region R2 that is in contact with the crossing region R1 in plan view. In this case, the angle θ2, at which an edge side of the memory gate electrode MG and the visible outline of the element isolation region STI cross each other, becomes large (obtuse), as illustrated in FIG. 31, and hence the polysilicon film is fully etched, thereby allowing an etching residue to be hardly formed in the edge side of the memory gate electrode MG. That is, when the angle θ2 becomes large, an etchant is likely to enter this region that much, and hence the polysilicon film is fully etched, thereby allowing an etching residue to be hardly formed in the edge side of the memory gate electrode MG. Thereafter, the drain region DR and the source region SR that arranged in the semiconductor substrate so as to extend in the Y direction be parallel to the memory gate electrode MG are formed in a main surface of the semiconductor substrate, by introducing conductive impurities with the use of an ion implantation method, as illustrated in FIG. 32.

In this case, an etching residue is hardly formed in the edge side of the memory gate electrode MG in Second Embodiment, and hence the existence probability of the laminated insulating film (ONO film) covered with an etching residue is also low. Accordingly, a decrease in the withstand voltage between the memory gate electrode MG and the source region SR, which may result from that the laminated insulating film (ONO film) covered with an etching residue is damaged by the aforementioned ion implantation, can be controlled. As a result, according to the manufacturing method of a semiconductor device in Second Embodiment, the reliability of a semiconductor device can be improved.

Subsequently, the manufacturing method of a semiconductor device in Second Embodiment will be described from a sectional viewpoint with reference to FIGS. 33 to 38. Each of FIGS. 33 to 38 illustrates, side by side, a sectional view taken along C-C Line and that taken along D-D Line in FIG. 26.

Figure 33:
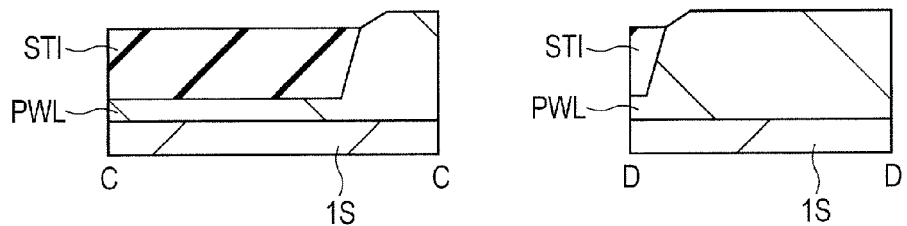
FIG. 33 is a sectional view illustrating a manufacturing step of a semiconductor device in Second Embodiment.

As illustrated in FIG. 33, the semiconductor substrate 1S, including silicon single crystals into which p-type impurities, such as boron, have been introduced, is provided. In this case, the semiconductor substrate 1S is in a state of a semiconductor wafer having an approximate disk shape. The element isolation region STI is then formed in the semiconductor substrate 1S by using, for example, an STI method. In this case, a stepped portion is formed between the top surface of the semiconductor substrate 1S and that of the element isolation region STI, and by an influence of the stepped portion, the top surface of the element isolation region STI becomes lower than the top surface of the semiconductor substrate 1S. Thereafter, the p-type well PWL is formed by introducing conductive impurities into the semiconductor substrate 1S.

Figure 34:
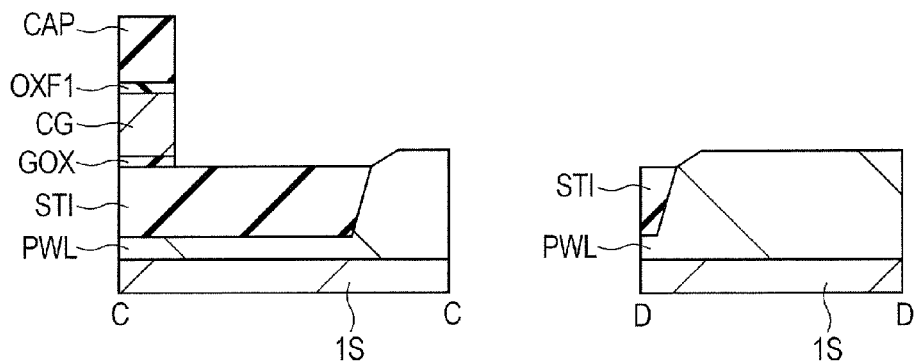
FIG. 34 is a sectional view illustrating a manufacturing step of a semiconductor device following FIG. 33.

Subsequently, after the gate insulating film GOX is formed over the top surface of the semiconductor substrate 1S, a polysilicon film is formed over the gate insulating film GOX, as illustrated in FIG. 34. The silicon oxide film OXF1 is then formed over the polysilicon film, and the cap insulating film CAP is formed over the silicon oxide film OXF1. The cap insulating film CAP can be formed, for example, by a silicon nitride film.

Thereafter, a resist film is formed over the cap insulating film CAP, and the resist film is then patterned by using a photolithography technique. Then, the cap insulating film CAP, the silicon oxide film OXF1, the polysilicon film, and the gate insulating film GOX are sequentially patterned by etching using the patterned resist film as a mask. Thereby, the laminated structure body, including the gate insulating film GOX, the control gate electrode CG, the silicon oxide film OXF1, and the cap insulating film CAP, is formed, as illustrated in FIG. 34.

Figure 35:
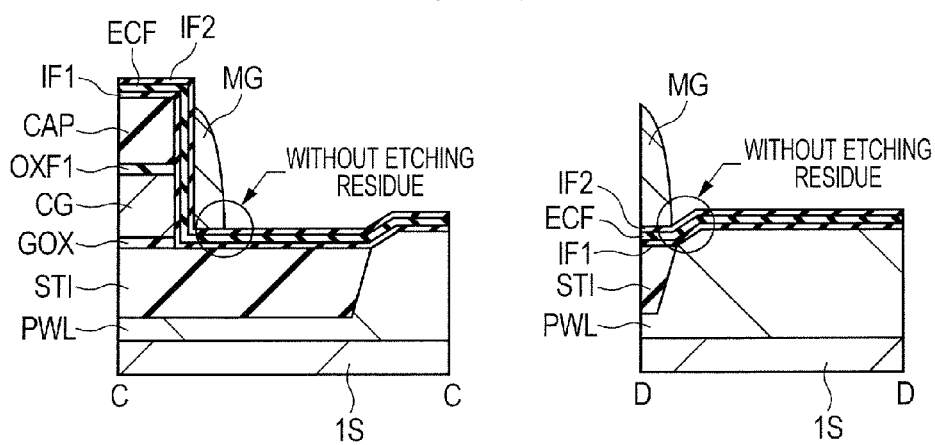
FIG. 35 is a sectional view illustrating a manufacturing step of a semiconductor device following FIG. 34.

Subsequently, the insulating film IF1 is formed over the semiconductor substrate 1S covering the laminated structure body, the charge storage film ECF is formed over the insulating film IF1, and the insulating film IF2 is formed over the charge storage film ECF, as illustrated in FIG. 35. Thereby, the laminated insulating film, including the insulating film IF1, the charge storage film ECF, and the insulating film IF2, can be formed. Thereafter, a polysilicon film is formed over the laminated insulating film, and the memory gate electrode MG having a sidewall shape is formed in the sidewall of the laminated insulating film by performing anisotropic etching on the polysilicon film.

In this case, the termination region of the element isolation region STI is formed to have the "broad round shape" in Second Embodiment, and hence an etching residue is hardly formed in the edge side of the memory gate electrode MG, as illustrated in FIG. 35. Thereby, a decrease in the reliability of a semiconductor device, which may result from an etching residue, can be controlled according to Second Embodiment.

Figure 36:
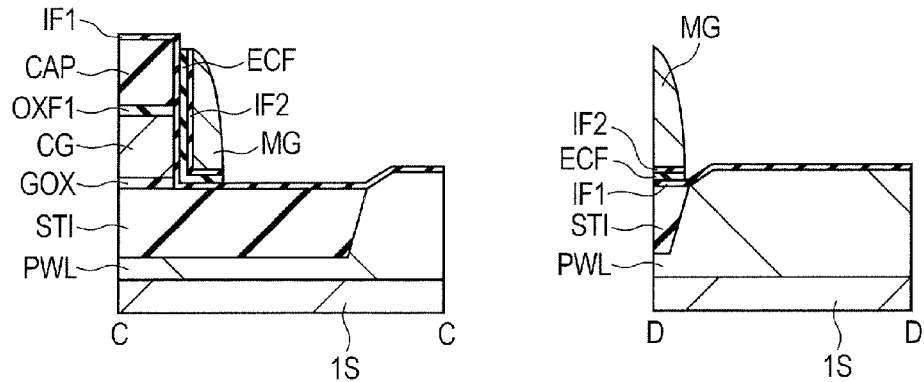
FIG. 36 is a sectional view illustrating a manufacturing step of a semiconductor device following FIG. 35.

Then, the insulating film IF2 exposed from the memory gate electrode MG is removed by etching, as illustrated in FIG. 36. The charge storage film ECF exposed from the memory gate electrode MG is then removed by etching. However, the insulating film IF1 is caused to remain as it is, without performing an etching process on the insulating film IF1 exposed from the memory gate electrode MG, also in Second Embodiment and similarly to First Embodiment. Thereby, the same effects as those in First Embodiment can be obtained.

Figure 37:
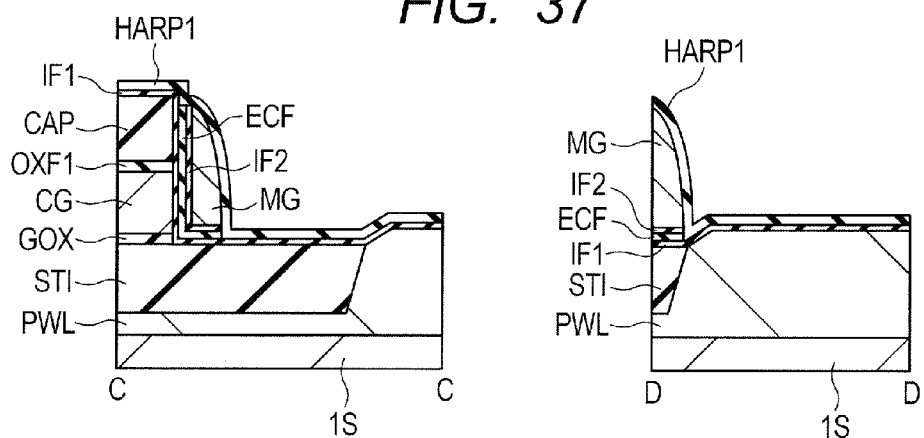
FIG. 37 is a sectional view illustrating a manufacturing step of a semiconductor device following FIG. 36.
Figure 38:
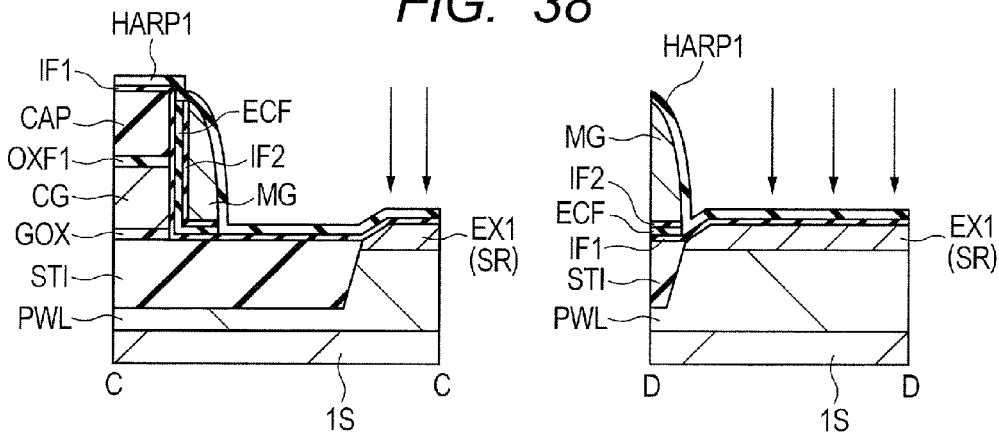
FIG. 38 is a sectional view illustrating a manufacturing step of a semiconductor device following FIG. 37.

Subsequently, after the silicon oxide film HARP1 is formed over the semiconductor substrate 1S, as illustrated in FIG. 37, the low-concentration impurity diffusion region EX1 (part of the source region SR) is formed by using a photolithography technique and an ion implantation method, as illustrated in FIG. 38.

Herein, an etching residue is hardly formed in the edge side of the memory gate electrode MG in Second Embodiment, and hence the existence probability of the laminated insulating film (ONO film) covered with an etching residue is also low. Accordingly, a decrease in the withstand voltage between the memory gate electrode MG and the source region SR, which may result from that the laminated insulating film (ONO film) covered with an etching residue is damaged by the aforementioned ion implantation, can be controlled. As a result, according to the manufacturing method of a semiconductor device in Second Embodiment, the reliability of a semiconductor device can be improved.

Subsequent steps are not directly associated with the characteristic points in Second Embodiment and are the same as those in First Embodiment, and hence the description thereof will be omitted. A semiconductor device according to Second Embodiment can be manufactured in the way described above.

The invention made by the present inventors has been specifically described above based on its preferred embodiments, but it is needless to say that the invention should not be limited to the embodiments and may be modified variously within a range not departing from the gist thereof.

The above embodiments include the following embodiments.

(Additional Remark 1)

A semiconductor device including: a semiconductor substrate; a drain region and a source region that are formed in the semiconductor substrate so as to be spaced apart from each other; a gate insulating film formed over the semiconductor substrate; a control gate electrode formed over the gate insulating film; a laminated insulating film formed to range from either sidewall of the control gate electrode to a portion over the semiconductor substrate; a memory gate electrode formed over the laminated insulating film; and a sidewall spacer formed over either sidewall of the memory gate electrode, in which the laminated insulating film has a first insulating film, a charge storage film formed over the first insulating film, and a second insulating film formed over the charge storage film, and in which the first insulating film extends to range from a layer below the charge storage film to a layer below the sidewall spacer.

(Additional Remark 2)

The semiconductor device according to Additional Remark 1, in which a protective insulating film is formed between the memory gate electrode and the sidewall spacer and between the sidewall spacer and the first insulating film.

(Additional Remark 3)

The semiconductor device according to Additional Remark 1, in which one end surface of the second insulating film and that of the charge storage film are flush with each other.

(Additional Remark 4)

The semiconductor device according to Additional Remark 1, in which the first insulating film and the second insulating film are of the same type.

(Additional Remark 5)

The semiconductor device according to Additional Remark 4, in which the first insulating film is a silicon oxide film and the second insulating film is a silicon oxide film.

(Additional Remark 6)

The semiconductor device according to Additional Remark 1, in which the memory gate electrode has a sidewall shape.

What is claimed is:

1. A semiconductor device comprising:
    an element isolation region that is formed in a semiconductor substrate and extends in a first direction;
    a control gate electrode that is formed over the semiconductor substrate and extends in a second direction that intersects with the first direction at right angles;
    a memory gate electrode that is formed over the semiconductor substrate and extends in the second direction so as to be parallel to the control gate electrode; and
    a source region that is formed in the semiconductor substrate and extends in the second direction so as to be parallel to the memory gate electrode,
    wherein the element isolation region includes:
    a crossing region that crosses the memory gate electrode in plan view; and
    a termination region that is in contact with the crossing region and the source region in plan view, and
    wherein in the crossing region, a first width in the second direction of a first edge side arranged near to the source region is larger than a second width in the second direction of a second edge side arranged near to the control gate electrode.

2. The semiconductor device according to claim 1,
    wherein of widths in the second direction of the termination region, the longest third width is larger than the first width.

3. The semiconductor device according to claim 2,
    wherein a boundary line between the termination region and the source region has a round shape.

4. The semiconductor device according to claim 1 further comprising:
    a laminated insulating film that includes a first portion sandwiched between the control gate electrode and the memory gate electrode and a second portion sandwiched between the memory gate electrode and the semiconductor substrate, and that extends in the second direction.

5. The semiconductor device according to claim 4,
    wherein the first portion of the laminated insulating film includes:
    a first insulating film that is in contact with the control gate electrode;
    a second insulating film that is in contact with the memory gate electrode; and
    a charge storage film sandwiched between the first insulating film and the second insulating film, and wherein the second portion of the laminated insulating film includes:
the first insulating film formed over the semiconductor substrate;
the second insulating film formed in a layer below the memory gate electrode; and
the charge storage film sandwiched between the first insulating film and the second insulating film.

6. The semiconductor device according to claim 5,
wherein the first insulating film is a silicon oxide film,
wherein the second insulating film is a silicon oxide film, and
wherein the charge storage film is a silicon nitride film.

7. The semiconductor device according to claim 1,
wherein the memory gate electrode has a sidewall shape.

8. A manufacturing method of a semiconductor device comprising the steps of:
(a) forming an element isolation region in a semiconductor substrate so as to extend in a first direction;
(b) forming a control gate electrode over the semiconductor substrate so as to extend in a second direction that intersects with the first direction at right angles;
(c) forming a memory gate electrode over the semiconductor substrate so as to extend in the second direction, to be parallel to the control gate electrode; and
(d) forming a source region in the semiconductor substrate so as to extend in the second direction to be parallel to the memory gate electrode,
wherein by performing the steps (a) to (d), the element isolation region includes:
a crossing region that crosses the memory gate electrode in plan view; and
a termination region that is in contact with the crossing region and the source region in plan view, and
wherein in the crossing region, a first width in the second direction of a first edge side, the first edge side being near to the source region, is larger than a width in the second direction of a second edge side, the second edge side being near to the control gate electrode.

9. The manufacturing method of a semiconductor device according to claim 8,
wherein in the step (a), the element isolation region is formed by using a mask employing light proximity effect correction.

10. The manufacturing method of a semiconductor device according to claim 8,
wherein by forming the element isolation region with the use of a mask employing light proximity effect correction in the step (a), the largest third width, of widths in the second direction of the termination region, is larger than the first width and an outer shape of the termination region is a round shape, in a stage where the steps (a) to (d) have been performed.

11. The manufacturing method of a semiconductor device according to claim 8,
wherein in the step (d), the source region is formed by introducing conductive impurities into the semiconductor substrate with the use of an ion implantation method.

* * * * *